United States Patent
Myung et al.

(10) Patent No.: US 11,075,649 B2
(45) Date of Patent: Jul. 27, 2021

(54) METHOD AND APPARATUS FOR DECODING DATA IN COMMUNICATION OR BROADCASTING SYSTEM

(71) Applicant: Samsung Electronics Co., Ltd., Suwon-si (KR)

(72) Inventors: Seho Myung, Suwon-si (KR); Min Jang, Suwon-si (KR); Yangsoo Kwon, Suwon-si (KR); Hoondong Noh, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 15/929,687

(22) Filed: May 15, 2020

(65) Prior Publication Data

US 2020/0366317 A1 Nov. 19, 2020

(30) Foreign Application Priority Data

May 15, 2019 (KR) .................. 10-2019-0057142
May 12, 2020 (KR) .................. 10-2020-0056706

(51) Int. Cl.
*H03M 13/11* (2006.01)
*H04B 1/06* (2006.01)
(Continued)

(52) U.S. Cl.
CPC ... *H03M 13/1125* (2013.01); *H03M 13/2792* (2013.01); *H03M 13/616* (2013.01); *H04B 1/06* (2013.01)

(58) Field of Classification Search
CPC .......... H03M 13/1125; H03M 13/616; H03M 13/2792; H04B 1/06
(Continued)

(56) References Cited

U.S. PATENT DOCUMENTS 7,924,933 B2  4/2011  Prasad et al.
9,960,944 B2  5/2018  Park et al.
(Continued)

FOREIGN PATENT DOCUMENTS

KR  10-2019-0017594 A  2/2019

OTHER PUBLICATIONS

International Search Report dated Aug. 24, 2020 in connection with International Patent Application No. PCT/KR2020/006467, 3 pages.

*Primary Examiner* — Fitwi Y Hailegiorgis

(57) ABSTRACT

Disclosed are a communication scheme and a system thereof for converging IoT technology and a 5G communication system for supporting a high data transmission rate beyond that of a 4G system. The disclosure can be applied to intelligent services (for example, services related to a smart home, smart building, smart city, smart car, connected car, health care, digital education, retail business, security, and safety) based on the 5G communication technology and the IoT-related technology. A decoding method includes: performing decoding through an inner code; detecting an error through an outer code; determining a re-encoding method; and performing re-encoding. A method for processing a signal includes decoding a first layer signal to determine first LDPC information bits, encoding the first LDPC information bits and a first parity bits to determine second parity bits; identifying a part of the first LDPC information bits, and decoding a second layer signal.

15 Claims, 30 Drawing Sheets

(51) Int. Cl.
*H03M 13/00* (2006.01)
*H03M 13/27* (2006.01)

(58) Field of Classification Search
USPC .......................................... 375/316; 714/752
See application file for complete search history.

(56) References Cited

U.S. PATENT DOCUMENTS

| | | |
|---|---|---|
| 9,985,747 B2* | 5/2018 | Baek ..................... H04L 1/0045 |
| 10,177,877 B2 | 1/2019 | Myung et al. |
| 10,211,949 B2 | 2/2019 | Oh et al. |
| 10,230,396 B1 | 3/2019 | Micheloni et al. |
| 2010/0077276 A1* | 3/2010 | Okamura .............. H04L 1/1812 |
| | | 714/752 |
| 2016/0164541 A1 | 6/2016 | Ko et al. |
| 2017/0288812 A1 | 10/2017 | Myung et al. |
| 2018/0069571 A1 | 3/2018 | Kim et al. |
| 2018/0175886 A1 | 6/2018 | Myung et al. |

* cited by examiner

FIG. 19B

Information 22 blocks

| 9 | 117 | 204 | 26 |  | 189 |  |  | 205 | 0 | 0 |  |  |  |  |  |  |  |  |
|---|---|---|---|---|---|---|---|---|---|---|---|---|---|---|---|---|---|---|
| 167 |  |  | 166 | 253 | 125 | 226 | 156 | 224 | 252 |  | 0 | 0 |  |  |  |  |  |  |
| 81 | 114 |  | 44 | 52 |  |  |  | 240 |  | 1 |  | 0 | 0 |  |  |  |  |  |
|  | 8 | 58 |  | 158 | 104 | 209 | 54 | 18 | 128 | 0 |  |  | 0 |  |  |  |  |  |
| 179 | 214 |  |  |  |  |  |  |  | 71 |  |  |  |  | 0 |  |  |  |  |
| 231 | 41 |  |  |  | 194 |  | 159 |  |  | 103 |  |  |  |  |  | 0 |  |  |  |
| 155 |  |  |  |  | 228 |  | 45 |  | 28 | 158 |  |  |  |  |  |  | 0 |  |  |
|  | 129 |  |  |  | 147 |  | 140 |  |  | 3 |  | 116 |  |  |  |  |  | 0 |  |
| 142 | 94 |  |  |  |  |  |  |  |  | 230 |  |  |  |  |  |  |  | 0 |  |
|  | 203 |  |  |  |  |  |  | 205 |  | 61 | 247 |  |  |  |  |  |  |  | 0 |
| 11 | 185 |  |  |  |  | 0 | 117 |  |  |  |  |  |  |  |  |  |  |  | 0 |

METHOD AND APPARATUS FOR DECODING DATA IN COMMUNICATION OR BROADCASTING SYSTEM

CROSS-REFERENCE TO RELATED APPLICATIONS

This application is based on and claims priority under 35 U.S.C. § 119 to Korean Patent Application No. 10-2019-0057142, filed on May 15, 2019, in the Korean Intellectual Property Office, and to Korean Patent Application No. 10-2020-0056706, filed on May 12, 2020, in the Korean Intellectual Property Office, the disclosure of which is herein incorporated by reference in its entirety.

BACKGROUND

1. Field

The disclosure relates to a method and an apparatus for decoding data in a communication or broadcasting system.

2. Description of Related Art

To meet the demand for wireless data traffic having increased since deployment of 4G communication systems, efforts have been made to develop an improved 5G or pre-5G communication system. Therefore, the 5G or pre-5G communication system is also called a "Beyond 4G Network" or a "Post LTE System". The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), full dimensional MIMO (FD-MIMO), array antenna, an analog beam forming, large scale antenna techniques are discussed in 5G communication systems. In addition, in 5G communication systems, development for system network improvement is under way based on advanced small cells, cloud radio access networks (RANs), ultra-dense networks, device-to-device (D2D) communication, wireless backhaul, moving network, cooperative communication, coordinated multi-points (CoMP), reception-end interference cancellation and the like. In the 5G system, hybrid FSK and QAM modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have also been developed.

The Internet, which is a human-centered connectivity network where humans generate and consume information, is now evolving to the Internet of things (IoT) where distributed entities, such as things, exchange and process information without human intervention. The Internet of everything (IoE), which is a combination of the IoT technology and the big data processing technology through connection with a cloud server, has emerged. As technology elements, such as "sensing technology", "wired/wireless communication and network infrastructure", "service interface technology", and "security technology" have been demanded for IoT implementation, a sensor network, a machine-to-machine (M2M) communication, machine type communication (MTC), and so forth have been recently researched. Such an IoT environment may provide intelligent Internet technology services that create a new value to human life by collecting and analyzing data generated among connected things. IoT may be applied to a variety of fields including smart home, smart building, smart city, smart car or connected cars, smart grid, health care, smart appliances and advanced medical services through convergence and combination between existing information technology (IT) and various industrial applications.

In line with this, various attempts have been made to apply 5G communication systems to IoT networks. For example, technologies such as a sensor network, machine type communication (MTC), and machine-to-machine (M2M) communication may be implemented by beamforming, MIMO, and array antennas. Application of a cloud radio access network (RAN) as the above-described big data processing technology may also be considered an example of convergence of the 5G technology with the IoT technology.

In a communication/broadcasting system, link performance may significantly deteriorate due to various channel noise, fading phenomena, and inter-symbol interference (ISI). Accordingly, in order to realize high-speed digital communication or broadcasting systems that require high data throughput and high reliability such as next-generation mobile communication, digital broadcasting, and portable Internet, it is needed to develop a technology for removing noise, fading, and inter-symbol interference. As research on noise removal, research on error correction code has been actively conducted recently to realize a method of increasing the reliability of communication by efficiently reconstructing distorted information.

The above information is presented as background information only to assist with an understanding of the disclosure. No determination has been made, and no assertion is made, as to whether any of the above might be applicable as prior art with regard to the disclosure.

SUMMARY

Certain embodiments according to the present disclosure provide a method and an apparatus for performing decoding based on an LDPC code and then performing re-encoding based on the decoding result, a CRC, and an LDPC syndrome in a system that requires encoding or re-encoding for parity.

Certain embodiments according to the present disclosure provide a method and an apparatus for performing decoding based on an LDPC code and then performing re-encoding based on a characteristic of a parity check matrix of the LDPC code, the decoding result, a CRC, and an LDPC syndrome in a system that requires encoding or re-encoding for parity.

In accordance with an aspect of the disclosure, embodiments of methods of performing interference cancellation (IC) or successive interference cancellation (SIC) by a receiver in a wireless communication system are provided. According to some embodiments, the method includes: receiving a signal corresponding to a transport block and a code block; performing low density parity check (LDPC) decoding using the signal and a parity check matrix to decode the code block; identifying a value of a first LDPC syndrome value, based on at least part of a first party (first parity bit) of the parity check matrix and the decoded code block; performing CRC detection for the decoded code block; and performing interference cancellation or successive interference cancellation, based on the first LDPC syndrome value and a CRC detection result.

In accordance with another aspect of the disclosure, embodiments of a receiver for performing interference cancellation or successive interference cancellation in a wireless communication system are provided. According to some embodiments, the receiver includes: a transceiver; and a controller configured to receive a signal corresponding to a transport block and a code block, performing low density parity check (LDPC) decoding using the signal and a parity check matrix to decode the code block, identify a value of a first LDPC syndrome value, based on at least part of a first party (first parity bit) of the parity check matrix and the decoded code block, perform CRC detection for the decoded code block, and perform IC or SIC, based on the first LDPC syndrome value and a CRC detection result.

In accordance with another aspect of the disclosure, embodiments of a method of a receiver for processing a multiple-in multiple-out (MIMO) signal associated with at least two layers in a wireless communication system are provided. According to certain embodiments, the method includes: decoding the MIMO signal, based on at least part of a parity check matrix to determine first low density parity check (LDPC) information bits corresponding to a first layer signal of the MIMO signal; determining second parity bits based on the first LDPC information bits and first parity bits; determining a part of the first LDPC information bits; and determining a second layer signal of the MIMO signal to determine second LDPC information bits corresponding to the second layer signal, wherein the second layer signal is determined by removing a signal corresponding to the part of the first LDPC information bits, the first parity bits, and the second parity bits from the MIMO signal.

In accordance with another aspect of the disclosure, embodiments of a receiver for processing a multiple-in multiple-out (MIMO) signal associated with at least two layers in a wireless communication system are provided. According to some embodiments, the receiver includes: a transceiver; and a controller coupled with the transceiver and configured to: decode the MIMO signal, based on at least part of a parity check matrix to determine first low density parity check (LDPC) information bits corresponding to a first layer signal of the MIMO signal, determine second parity bits, based on the first LDPC information bits and first parity bits, determine a part of the first LDPC information bits, and determine a second layer signal of the MIMO signal to determine second LDPC information bits corresponding to the second layer signal, wherein the second layer signal is determined by removing a signal corresponding to the part of the first LDPC information bits, the first parity bits, and the second parity bits from the MIMO signal.

In accordance with another aspect of the disclosure, embodiments of a method of receiving and processing a layered-division multiplexing (LDM) signal generated from two or more layer signals are provided. According to various embodiments, the method includes: decoding the LDM signal, based on at least part of a parity check matrix to determine first low density parity check (LDPC) information bits, first parity bits, and second parity bits corresponding to a first layer signal; determining an LDPC syndrome corresponding to the decoded first LDPC information bits, first parity bits, and second parity bits; determining modified (or transformed) second parity bits, based on the decoded second parity bits and the determined LDPC syndrome; determining a second layer signal by removing a signal corresponding to the decoded first LDPC information bits, the first parity bits, and the modified (or transformed) second parity bits from the LDM signal; and decoding the second layer signal to determine second LDPC information bits corresponding to the second layer signal, wherein the second parity bits correspond to at least part of degree-1 columns in the parity check matrix.

According to some embodiments of the disclosure, it is possible to effectively support an LDPC code for a variable length and a variable rate.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the disclosure and its advantages, reference is now made to the following description taken in conjunction with the accompanying drawings, in which like reference numerals represent like parts:

FIG. 19B illustrates an example of a parity check matrix for an LDPC code according to certain embodiments of this disclosure;

DETAILED DESCRIPTION

Figure 1:
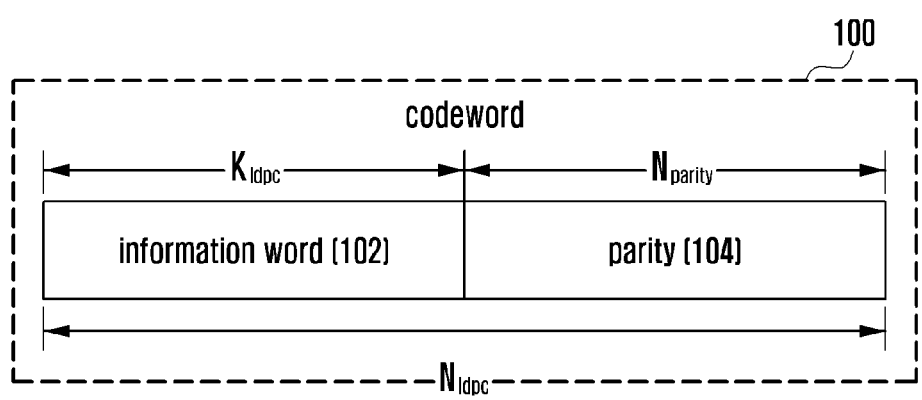
FIG. 1 illustrates an example of a structure of a systematic LDPC codeword, according to various embodiments of this disclosure.

FIGS. 1 through 25, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, exemplary embodiments of the disclosure will be described in detail in conjunction with the accompanying drawings. In the following description of the disclosure, a detailed description of known functions or configurations incorporated herein will be omitted when it may make the subject matter of the disclosure rather unclear. The terms which will be described below are terms defined in consideration of the functions in the disclosure, and may be different according to users, intentions of the users, or customs. Therefore, the definitions of the terms should be made based on the contents throughout the specification.

Based on determinations by those skilled in the art, the main idea of the disclosure may be applied to other communication systems with similar technical backgrounds through some modifications without significantly departing from the scope of the disclosure. For reference, a communication system is the term that generally includes a broadcasting system, but when broadcasting service of the communication system is main service in the disclosure, the communication system may be called the broadcasting system for more accuracy.

The advantages and features of the disclosure and ways to achieve them will be apparent by making reference to embodiments as described below in detail in conjunction with the accompanying drawings. However, the disclosure is not limited to the embodiments set forth below, but may be implemented in various different forms. The following embodiments are provided only to completely disclose the disclosure and inform those skilled in the art of the scope of the disclosure, and the disclosure is defined only by the scope of the appended claims. Throughout the specification, the same or like reference numerals designate the same or like elements.

A low density parity check (LDPC) code first introduced by Robert G. Gallager in 1960s has been forgotten for a long time because it was too complex to be implemented due to the technology level at that time. However, as a turbo code proposed by Berrou, Glavieux, and Thitimajshima in 1993 has the performance approaching a channel capacity of Shannon, much analysis of the performance and characteristics of the turbo code has been achieved and many researches on channel encoding based on iterative decoding and a graph have been progressed. Accordingly, when the LDPC code was re-researched in the late 1990s and decoding was performed by applying iterative decoding based on a sum-product algorithm in a Tanner graph corresponding to the LDPC code, it was revealed that the LDPC code also has the performance approaching the channel capacity of Shannon.

The LDPC code may be generally defined as a parity check matrix and may be expressed using a bipartite graph called a Tanner graph. In general, the LDPC code is one type of parity check codes and has a characteristic of a very low ratio (that is, density) of the number of 1 in the parity check matrix when the length is very long, and thus is called a "low-density" parity check code. Therefore, proposed technologies based on the LDPC code may easily expand the general parity check matrix code for convenience of the disclosure.

FIG. 1 illustrates an example of a structure of a systematic LDPC codeword, according to certain embodiments of this disclosure.

Referring to FIG. 1, the LDPC codeword receives an information 102 including $K_{ldpc}$ bits or symbols, perform encoding, and generates a codeword 100 including $N_{ldpc}$ bits or symbols. Hereinafter, for convenience of description, it is assumed that the information 102 including $K_{ldpc}$ bits is received and the codeword 100 including $N_{ldpc}$ bits is generated. That is, when the information $I=[i_0, i_1, i_2, \ldots, i_{K_{ldpc}-1}]$ 102 corresponding to $K_{ldpc}$ input bits is encoded, the codeword $c=[c_0, c_1, c_2, c_3, \ldots, c_{N_{ldpc}-1}]$ 100 is generated. That is, an information and a codeword are bitstreams including a plurality of bits, and an information bit and a codeword bit refer to bits included in an information and a codeword, respectively. In general, when LDPC encoding bits include an information such as $C=[c_0, c_1, c_2, \ldots, c_{N_{ldpc}-1}]=[i_0, i_1, i_2, \ldots, i_{K_{ldpc}-1}, p_0, p_1, p_2, \ldots, p_{N_{ldpc}-K_{ldpc}-1}]$, it is called a systematic code. $P=[p_0, p_1, p_2, \ldots, p_{N_{ldpc}-K_{ldpc}-1}]$ may be a parity bit 104, and the number of parity bits $N_{parity}$ may be $N_{parity}=N_{ldpc}-K_{ldpc}$.

The LDPC code is a type of linear block codes, and a process of determining a codeword that satisfies a condition such as [Equation 1] below is included.

$$H \cdot c^T = [h_1 h_2 h_3 \ldots h_{N_{ldpc}-1}] \cdot c^T = \sum_{i=0}^{N_{ldpc}} c_i \cdot h_i = 0 \quad \text{[Equation 1]}$$

where $c = [c_0, c_1, c_2, \ldots, c_{N_{ldpc}-1}]$.

In [Equation 1], H denotes a parity check matrix, C denotes a codeword, $c_1$ denotes an $i^{th}$ bit of a codeword, and $N_{ldpc}$ denotes a codeword length. Here, $h_i$ denotes an $i^{th}$ column of the parity check matrix (H).

The parity check matrix H includes $N_{ldpc}$ columns, the $N_{ldpc}$ being the same as the number of bits of the LDPC codeword. [Equation 1] means that a sum of the products of $i^{th}$ columns ($h_i$) of the parity check matrix and $i^{th}$ codeword bits $c_1$ is "0", so that the $i^{th}$ column ($h_i$) is relevant to the $i^{th}$ codeword bit $c_i$.

Figure 2:
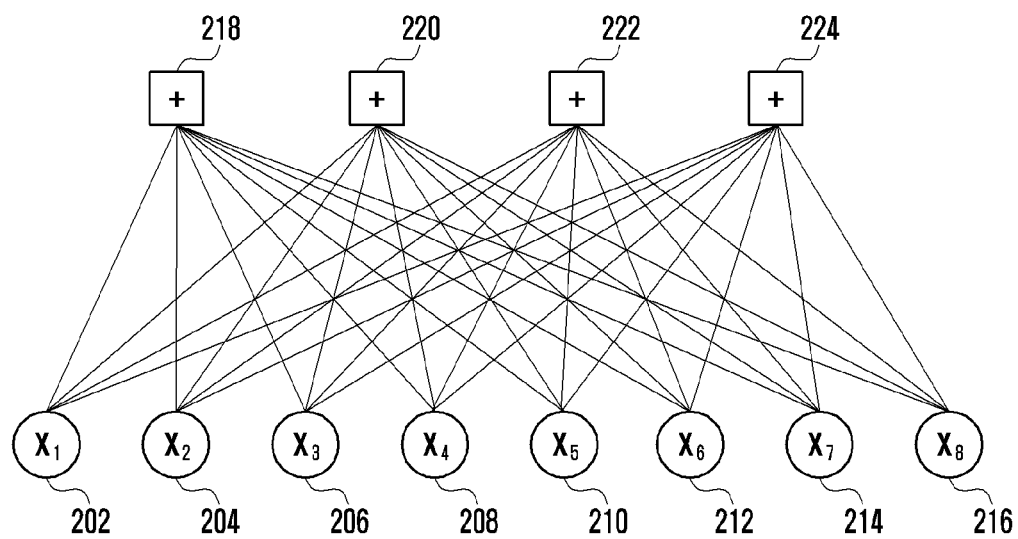
FIG. 2 illustrates an example of a method of expressing the LDPC code as a graph, according to some embodiments of this disclosure.
Figure 3A:
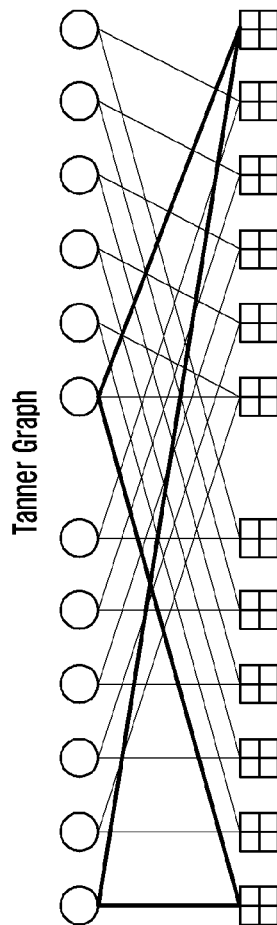
FIG. 3A illustrates an example of a cycle characteristic of a QC-LDPC code, according to various embodiments of this disclosure.
Figure 3B:
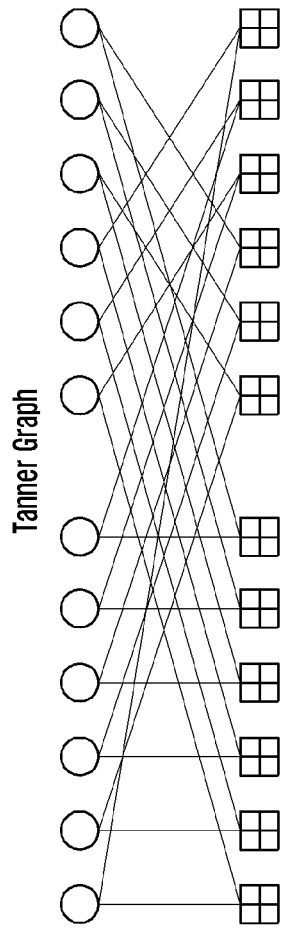
FIG. 3B illustrates an example of a cycle characteristic of a QC-LDPC code, according to certain embodiments of this disclosure.
Figure 3B:
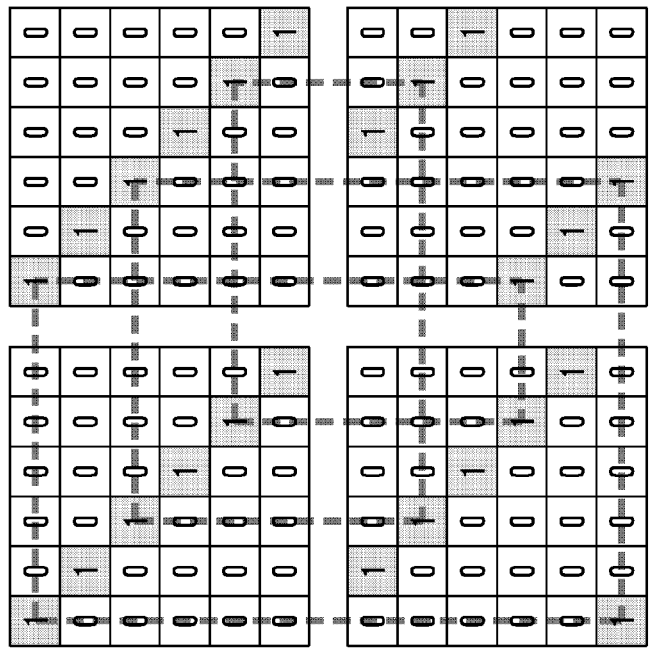

FIG. 2 illustrates an example of a method of expressing the LDPC code as a graph according to certain embodiments of this disclosure.

Certain embodiments of a method of expressing the LDPC code as the graph is described with reference to the illustrative example of FIG. 2.

FIG. 2 illustrates an explanatory example of a parity check matrix $H_1$ of the LDPC code including 4 rows and 8 columns and a Tanner graph expressing the same. Referring to FIG. 2, the number of columns of the parity check matrix $H_1$ is 8, and thus a codeword having a length of 8 is generated. The codeword generated through $H_1$ is the LDPC code and respective columns correspond to encoded 8 bits.

Referring to the illustrative example of FIG. 2, the Tanner graph of the LDPC code for performing encoding and decoding based on the parity check matrix $H_1$ may include 8 variable nodes, that is, $x_1$ 202, $x_2$ 204, $x_3$ 206, $x_4$ 208, $x_5$ 210, $x_6$ 212, $x_7$ 214, and $x_8$ 216, and 4 check nodes 218, 220, 222, and 224. An $i^{th}$ column and a $j^{th}$ row of the parity check matrix $H_1$ of the LDPC code correspond to a variable node $x_i$ and a $j^{th}$ check node. A value of 1 at a position at which an $i^{th}$ column and a $j^{th}$ row of the parity check matrix $H_1$ of the LDPC code intersect, that is, a value that is not 0 means that there is an edge connecting the variable node $x_i$ and the $j^{th}$ check node in the Tanner graph as illustrated in FIG. 2.

In the Tanner graph of the LDPC code, a degree of the variable node and the check node is the number of lines connected to each node, which is the same as the number of entries that are not 0 in a column or a row corresponding to the corresponding node in the parity check matrix of the LDPC code. For example, in FIG. 2, degrees of the variable nodes $x_1$ 202, $x_2$ 204, $x_3$ 206, $x_4$ 208, $x_5$ 210, $x_6$ 212, $x_7$ 214, and $x_8$ 216 are sequentially 4, 3, 3, 3, 2, 2, 2, and 2, and degrees of the check nodes 218, 220, 222, and 224 are sequentially 6, 5, 5, and 5. Further, the number of entries that are not 0 in each column of the parity check matrix $H_1$ of FIG. 2 corresponding to the variable node of FIG. 2 sequentially match the degrees 4, 3, 3, 3, 2, 2, 2, and 2, and the number of entries that are not 0 in each row of the parity check matrix $H_1$ of FIG. 2 corresponding to the check node of FIG. 2 sequentially match the degrees 6, 5, 5, and 5. For the reason, the degree of each variable node may be referred to as a column degree or a column weight, and the degree of the check node may be referred to as a row degree or a row weight.

According to some embodiments, the LDPC code may be decoded using an iterative decoding algorithm based on a sum-product algorithm in a bipartite graph illustrated in FIG. 2. The sum-product algorithm is one type of message passing algorithms, and the message passing algorithm is an algorithm that exchanges messages through an edge in the bipartite graph and calculates an output message from message input into the variable node or the check node to perform an update.

Here, a value of an $i^{th}$ encoding bit may be determined on the basis of a message of an $i^{th}$ variable node. The value of an encoding bit may be determined through both hard decision and soft decision. Accordingly, the performance of the $i^{th}$ bit $c_1$ of the LDPC codeword may correspond to the performance of the $i^{th}$ variable node of the Tanner graph, which may be determined according to the location and the number of 1 in the $i^{th}$ column of the parity check matrix. In other words, the performance of $N_{ldpc}$ codeword bits may depend on the location and the number of 1 in the parity check matrix, which means that the performance of the LDPC code is significantly influenced by the parity check matrix. Accordingly, it is required to design an efficient parity check matrix for an LDPC code having excellent performance.

For the parity check matrix used in the communication and broadcasting system, a quasi-cyclic LDPC code (or a QC-LDPC code, hereinafter, referred to as the QC-LDPC code), generally using a quasi-cyclic parity check matrix, is frequently used for easy implementation.

The QC-LDPC code features a parity check matrix including a 0-matrix (zero matrix) having a square matrix form or a circulant permutation matrix. The permutation matrix is a matrix in which each row or column has only one 1 and all remaining elements are 0. Further, the circulant permutation matrix is a matrix in which each element of an identity matrix is circularly rotated to the right.

Hereinafter, the QC-LDPC code is described in detail.

First, the circulant permutation matrix $P=(P_{i,j})$ having the size of L×L is defined as shown in [Equation 2]. In [Equation 2], $P_{ij}$ (0≤i, j<Z) is an element (entry) in an $i^{th}$ row and $j^{th}$ column in the matrix P.

$$P_{i,j} = \begin{cases} 1 & \text{if } i+1 \equiv j \bmod L \\ 0 & \text{otherwise} \end{cases} \quad \text{[Equation 2]}$$

On the basis of $P^i$ (0≤i<L) for the permutation matrix defined above, it may be noted that P is a circulant permutation matrix obtained by circularly shifting each element of an identity matrix having the size of L×L to the right by i.

The parity check matrix H of the simplest QC-LDPC code may be indicated as shown in [Equation 3] below.

$$H = \begin{bmatrix} P^{a_{11}} & P^{a_{12}} & \cdots & P^{a_{1n}} \\ P^{a_{21}} & P^{a_{22}} & \cdots & P^{a_{2n}} \\ \vdots & \vdots & \ddots & \vdots \\ P^{a_{m1}} & P^{a_{m2}} & \cdots & P^{a_{mn}} \end{bmatrix} \quad \text{[Equation 3]}$$

If $P^{-1}$ is defined as a 0-matrix having the size of L×L, each exponent $\alpha_{i,j}$ of the circulant permutation matrix or the 0-matrix has one of values {−1, 0, 1, 2, . . . , L−1} in [Equation 3]. Further, it may be noted that the parity check matrix H of [Equation 3] has the size of mL×nL since it has n column blocks and m row blocks.

When the parity check matrix of [Equation 3] has a full rank, it is apparent that the size of information bits of the QC-LDPC code corresponding to the parity check matrix is (n−m)L. For convenience, (n−m) column blocks corresponding to the information bits are called information column blocks, and m column blocks corresponding to the remaining parity bits are called parity column blocks. When the parity check matrix of [Equation 3] does not have a full rank, the information bits are larger than (n−m)L.

In general, a binary matrix having the size of m×n, obtained by replacing the circulant permutation matrix and the 0-matrix in the parity check matrix of [Equation 3] with 1 and 0, is determined as a mother matrix or a base matrix M(H) of the parity check matrix H, and an integer matrix having the size of m×n, obtained by selecting exponents of the circulant permutation matrix or the 0-matrix as shown in [Equation], is determined as an exponent matrix E(H) of the parity check matrix H.

$$E(H) = \begin{bmatrix} a_{11} & a_{12} & \cdots & a_{1n} \\ a_{21} & a_{22} & \cdots & a_{2n} \\ \vdots & \vdots & \ddots & \vdots \\ a_{m1} & a_{m2} & \cdots & a_{mn} \end{bmatrix} \quad \text{[Equation 4]}$$

As a result, one integer included in the exponent matrix corresponds to the circulant permutation matrix in the parity check matrix, and thus the exponent matrix may be expressed as sequences including integers for convenience. In general, the parity check matrix can be expressed as not only the exponent matrix but also various sequences capable of algebraically expressing the same characteristic. Although the parity check matrix is expressed as the exponent matrix or the sequence indicating the location of 1 within the parity check matrix for convenience in the disclosure, expressions of the sequence for identifying the location of 1 or 0 included in the parity check matrix are various, so that the parity check matrix may be indicated in various forms of sequences having algebraically the same effect without limited to the method in the specification. The sequence may be called various names such as an LDPC sequence, an LDPC code sequence, an LDPC matrix sequence, or a parity check matrix sequence in order to be distinguished from another sequence.

Further, a transmission/reception device of the device may directly generate the parity check matrix and perform LDPC encoding and decoding, but the LDPC encoding and decoding may be performed using an exponent matrix or a sequence having algebraically the same effect as the parity check matrix according to an implementation characteristic. Accordingly, although the disclosure describes encoding and decoding using the parity check matrix for convenience, the actual device considers implementation through various methods capable of obtaining the same effect as the parity check matrix.

For reference, algebraically the same effect encompasses the property wherein two or more different expressions can be described to be completely the same as each other logically or mathematically or can be converted therebetween.

Although the above-described example describes the case in which the number of circulant permutation matrices corresponding to one block is one for convenience, the disclosure is not so limited, and can be applied to the case in which a plurality of circulant permutation matrices are included in one block. For example, when a sum of two circulant permutation matrices $P^{a_{ij}^{(1)}}$, $P^{a_{ij}^{(2)}}$ is included in the location of an $i^{th}$ row block and a $j^{th}$ column block as shown in [Equation 5] below, an exponent matrix thereof may be expressed as [Equation 6]. In [Equation 6], a matrix in which two integers correspond to an $i^{th}$ row and a $j^{th}$ column corresponding to a row block and a column block including a sum of a plurality of circulant permutation matrices is shown.

$$H = \begin{bmatrix} \ddots & & \\ & P^{a_{ij}^{(1)}} + P^{a_{ij}^{(2)}} & \\ & & \ddots \end{bmatrix} \quad \text{[Equation 5]}$$

-continued $$E(H) = \begin{bmatrix} \ddots & & \cdot \\ & (a_{ij}^{(1)}, a_{ij}^{(2)}) & \\ \cdot & & \ddots \end{bmatrix}$$ [Equation 6]

As described, in certain embodiments, a plurality of circulant permutation matrices may generally correspond to one row block and column block in the parity check matrix of the QC-LDPC code, but the example provided above describes only the case in which one circulant permutation matrix corresponds to one block for convenience. However, the subject of the disclosure is not limited thereto. For reference, the matrix having the size of L×L in which a plurality of circulant permutation matrices are duplicated in one row block and column block is referred to as a circulant matrix or a circulant.

Meanwhile, similar to the definition used in [Equation 3] above, the other matrix or the base matrix of the parity check matrix of the exponent matrix of [Equation 5] and [Equation 6] means the binary matrix obtained by replacing the circulant permutation matrix and the 0-matrix by 1 and 0, and a sum of a plurality of circulant permutation matrices (that is, permutation matrices) included in one block are simply replaced with 1.

The performance of the LDPC code is, in certain embodiments, determined according to the parity check matrix, so that it is required to efficiently design a parity check matrix for an LDPC code having excellent performance. Further, an LDPC encoding or decoding method for supporting various input lengths and code rates is needed.

Lifting is a method used not only for an efficient design of the QC-LDPC code but also for generation of the parity check matrix having various lengths from the given exponent matrix or generation of the LDPC codeword. That is, the lifting is applied to efficiently design a very large parity check matrix by configuring an L value for determining the size of the circulant permutation matrix or the 0-matrix from the give small mother matrix according to a specific rule or is a method of generating the parity check matrix having various lengths or generating the LDPC codeword by applying an appropriate L value to the given exponent matrix or a sequence corresponding thereto.

An example of a lifting method and a characteristic of the QC-LDPC code designed through the lifting are described in the document available as: S. Myung, K. Yang, and Y. Kim, "Lifting Methods for Quasi-Cyclic LDPC Codes," IEEE Communications Letters. vol. 10, pp. 489-491, June 2006.

First, when LDPC code $C_0$ is given, S QC-LDPC codes to be designed through the lifting method are $C_1, \ldots, C_S$, and a value corresponding to the size of a row block and a column block of the parity check matrix of each QC-LDPC code is $L_k$. $C_0$ corresponds to the smallest LDPC code having the mother matrix of codes $C_1, \ldots, C_S$ as the parity check matrix, and a value of Lo corresponding to the size of the row block and the column block is 1. For convenience, the parity check matrix $H_k$ of each code $C_k$ has the exponent matrix $E(H_k)=(e_{i,j}^{(k)})$ having the size of m×n, and each exponent $e_{i,j}^{(k)}$ is selected as one of values $\{-1, 0, 1, 2, \ldots, L_k-1\}$.

The conventional lifting method includes steps of $C_0 \to C_1 \to \ldots \to C_S$ and has a characteristic that satisfies a condition of $L_{k+1}=q_{k+1}L_k$ ($q_{k+1}$ is a positive integer, k=0, 1, ..., S-1). If only the parity check matrix Hs of the $C_S$ is stored by a characteristic of the lifting process, all the QC-LDPC codes $C_0, C_1, \ldots, C_S$ can be indicated using [Equation 7] below according to the lifting method.

$$E(H_k) \equiv \left\lfloor \frac{L_k}{L_S} E(H_S) \right\rfloor$$ [Equation 7]

$$E(H_k) \equiv E(H_S) \bmod L_k$$ [Equation 8]

As described above, not only the method of designing larger QC-LDPC codes $C_1, \ldots, C_S$ from $C_0$ but also the method of generating the small code $C_i$ (i=k-1, k-2, ... 1, 0) using the appropriate method such as [Equation 7] or [Equation 8] from the large code $C_k$ is called lifting.

In the lifting method of [Equation 7] or [Equation 8], $L_k$ corresponding to the size of the row block or column block in the parity check matrix of each QC-LDPC code $C_k$ have the multiple relationship therebetween, and the exponent matrix is selected by a specific method. The conventional lifting method assist in easily designing the QC-LDPC code having an improved error floor characteristic by improving an algebraic or graph characteristic of each parity check matrix designed through lifting.

In general, it may be considered that the lifting is used for LDPC encoding and decoding by changing values of elements of the exponent matrix of [Equation 4] for various L values. For example, when the exponent matrix of [Equation 4] is $E=(\alpha_{i,j})$ and the exponent matrix converted (or transformed) according to the L value is $E_L=(\alpha_{i,j}^{(L)})$, a conversion (or transformation) equation such as [Equation 9] below may be generally applied.

$$a_{i,j}^{(L)} = \begin{cases} a_{i,j} & a_{i,j} < 0 \\ f(a_{i,j}, L) & a_{i,j} \geq 0 \end{cases}$$ [Equation 9]

or $$a_{i,j}^{(L)} = \begin{cases} a_{i,j} & a_{i,j} \leq 0 \\ f(a_{i,j}, L) & a_{i,j} > 0 \end{cases}$$

In [Equation 9] above, f(x,L) may be defined in various forms, and the definition, for example, [Equation 10] below may be used.

$$f(x, L) = \bmod(x, 2^{\lfloor \log_2 L \rfloor})$$ [Equation 10]

or $$f(x, L) = \left\lfloor \frac{x}{2^{D-\lfloor \log_2 L \rfloor}} \right\rfloor$$

or $$f(x, L) = \left\lfloor \frac{L}{D} x \right\rfloor$$

In [Equation 10] above, mod(a,b) denotes a modulo-b operation for a, and D denotes a constant which is a predefined positive integer.

For reference, although a reference for applying the conversion (or transformation) equation f is 0 in the conversion equation of [Equation 9], the reference value may be configured differently according to a block size L. Further, in expression of the exponent matrix or the LDPC sequence, when an exponent corresponding to the 0 matrix is excluded from the beginning and defined, a rule for values of the exponent smaller than 0 may be omitted in [Equation 9].

According to certain embodiments, the application of LDPC encoding and decoding based on a plurality of exponent matrices or LDPC sequences in one predetermined base matrix is described. That is, the base matrix is fixed to one, and LDPC encoding and decoding are performed by determining the exponent matrix or the sequence of the LDPC code defined in the base matrix and applying lifting suitable for the block size included in each block size group from the exponent matrix or the sequence. In such a method, elements or numbers included in the exponent matrix of the LDPC code or the LDPC sequence may have different values, but locations of the elements or the numbers are accurately the same in the base matrix. As described above, the exponent matrix of the LDPC sequences mean one type of circular shift values for exponents of each circulant permutation matrix, that is, bits, or elements included in the circulant permutation matrix, and it is easy to detect locations of bits corresponding to the corresponding circulant permutation matrix by configuring all of the elements or the numbers to be the same. For example, the exponent matrix or the LDPC sequence corresponds to a circular shirt value of bits corresponding to the block size (Z), and thus the exponent matrix may be variously called a shift matrix, a shift value matrix, a shift sequence, or a shift value sequence.

The block size (Z) to be supported is divided into a plurality of block size groups (or sets) as shown in [Equation 11] below. It is noted that the block size (Z) corresponds to the size Z×Z of the circulant permutation matrix or the circulant matrix in the parity check matrix of the LDPC code.

$Z1=\{2,4,8,16,32,64,128,256\}$ $Z2=\{3,6,12,24,48,96,192,384\}$ $Z3=\{5,10,20,40,80,160,320\}$ $Z4=\{7,14,28,56,112,224\}$ $Z5=\{9,18,36,72,144,288\}$ $Z6=\{11,22,44,88,176,352\}$ $Z7=\{13,26,52,104,208\}$ $Z8=\{15,30,60,120,240\}$ [Equation 11]

[Equation 11] above is only a non-limiting example, and other block sizes (Z) may be included in the block size groups of [Equation 11] above. As shown in [Equation 12] below, a block size included in an appropriate subset may be used or proper values may be added to or excluded from the block size group (or set) of [Equation 11] or [Equation 12] and used.

$Z1'=\{8,16,32,64,128,256\}$ $Z2'=\{12,24,48,96,192,384\}$ $Z3'=\{10,20,40,80,160,320\}$ $Z4'=\{14,28,56,112,224\}$ $Z5'=\{9,18,36,72,144,288\}$ $Z6'=\{11,22,44,88,176,352\}$ $Z7'=\{13,26,52,104,208\}$ $Z8'=\{15,30,60,120,240\}$ [Equation 12]

Characteristics of block size groups in [Equation 11] and [Equation 12] above, include, without limitation, their having different granularities and ratios f neighboring block sizes are all the same integer. In other words, block sizes included in one group have the relation of divisor or multiple. An exponent matrix corresponding to a $p^{th}$ group (p=1, 2, . . . , 8) is $E_p=(e_{i,j}^{(p)})$, and when an exponent matrix corresponding to Z included in the $p^{th}$ group is $E_p(Z)=(e_{i,j}(Z))$, a sequence conversion (or transformation) method as shown in [Equation 9] is applied using $f_p(x,Z)=x \pmod Z$. That is, for example, when the block size Z is determined as Z=28, each element $e_{i,j}(28)$ of an exponent matrix (or LDPC sequence) $E_4(28)=(e_{i,j}(28))$ for Z=28 may be obtained for an exponent matrix (or LDPC sequence) $E_4=(e_{(i,j)}^{(4)})$ corresponding to a fourth block size group including Z=28 as shown in [Equation 13] below.

$$e_{i,j}(28) = \begin{cases} e_{i,j}^{(4)} & e_{i,j}^{(4)} \leq 0 \\ e_{i,j}^{(4)} \pmod{28} & e_{i,j}^{(4)} > 0 \end{cases}$$ [Equation 13]

or $$e_{i,j}(28) = \begin{cases} e_{i,j}^{(4)} & e_{i,j}^{(4)} < 0 \\ e_{i,j}^{(4)} \pmod{28} & e_{i,j}^{(4)} \geq 0 \end{cases}$$

The conversion (or transformation) as shown in [equation 13] above may also be expressed as [Equation 14] below.

$E_p(Z)=E_p \pmod Z, Z \in Z_p$ [Equation 14]

For example, although it is assumed that the lifting or the exponent matrix conversion (or transformation) method in [Equation 9], [Equation 10], or [Equation 11] to [Equation 14] is applied to the entire exponent matrix corresponding to the parity check matrix, the conversion (or transformation) method may be partially applied to the exponent matrix.

For example, a submatrix corresponding to a parity bit of the parity check matrix generally has a special structure for efficient encoding in many cases. In this case, an encoding method or complexity of lifting may have changes. Accordingly, in order to maintain the same encoding method or complexity, lifting may not applied to the part of the exponent matrix for the submatrix corresponding to parity in the parity check matrix or lifting different from that applied to the exponent matrix for the submatrix corresponding to an information bit may be applied thereto. In other words, a lifting method applied to the sequence corresponding to the information bit and a lifting method applied to the sequence corresponding to the parity bit may be differently configured in the exponent matrix, and a fixed value may be used without sequence conversion (or transformation) since lifting is not applied to the part or entire of the sequence corresponding to the parity bit according to circumstances.

Figure 4:
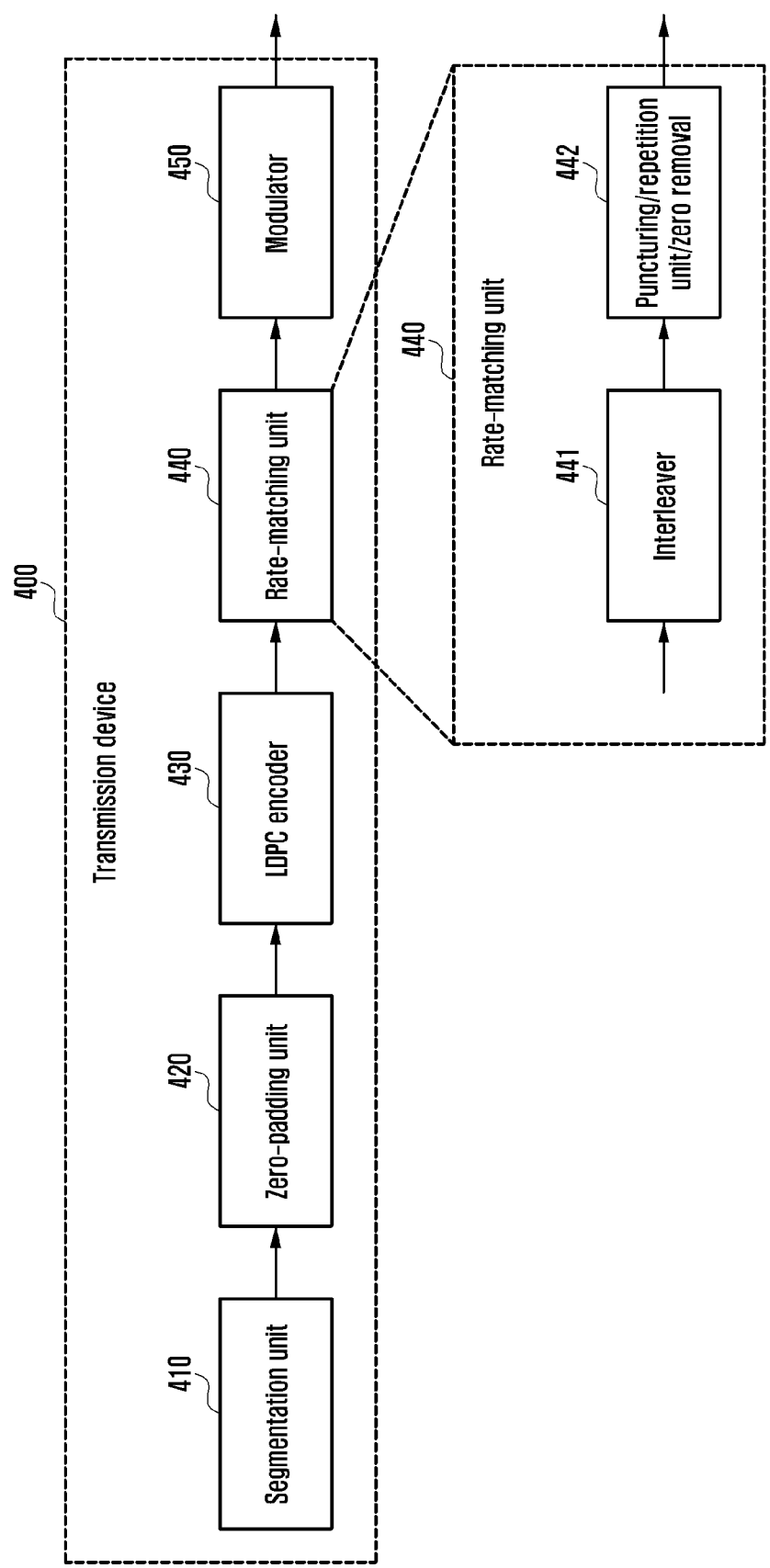
FIG. 4 illustrates, in block diagram format, an example of a transmission device according to certain embodiments of this disclosure.

FIG. 4 illustrates, in block diagram format, an example of a transmission device according to certain embodiments of this disclosure.

Specifically, as shown in the illustrative example FIG. 4, in order to process variable-length input bits, the transmission device 400 may include a segmentation unit 410, a zero-padding unit 420, an LDPC encoder 430, a rate-matching unit 440, and a modulator 450, and the like. The rate-matching unit 440 may include an interleaver 441 and a puncturing/repetition/zero removal unit 442.

Here, elements illustrated in the explanatory example of FIG. 4 are elements configured to perform encoding and modulation on variable-length input bits. This is only an example. According to some cases, some of the elements illustrated in FIG. 4 may be omitted or changed, and other elements may be added.

Meanwhile, the transmission device 400 determines required parameters (e.g., parameters for input bit length, modulation and code rate (ModCod), zero padding or shortening, parameters for a code rate of LDPC code, information or codeword length, parameters for interleaving, parameters for repetition and puncturing, a modulation scheme, or the like), and encodes input bits based on the determined parameters so as to transmit the encoded input bits to a reception device 500.

Since the number of input bits is variable, if the number of input bits is greater than a preset threshold, the input bits may be segmented to have a length shorter than or equal to a preconfigured value. Each segmented block may correspond to one LDPC-coded block. If the number of input bits is smaller than or equal to the threshold, the input bits are not segmented, and the input bits may correspond to one LDPC-coded block.

In certain embodiments, the transmission device 400 may pre-store various parameters used for coding, interleaving, and modulation. Here, the parameters used for coding may include at least one of pieces of information of the code rate of an LDPC code, the codeword length, and the parity check matrix. In addition, the parameters used for interleaving may include information on the interleaving rule, and the parameters used for modulation may include information on the modulation scheme. In addition, the information about puncturing may include the puncturing length. In addition, the information about repetition may include the repetition length. The information on the parity check matrix may include exponent values of the circulant matrix or values corresponding thereto in the case where the parity check matrix proposed in the disclosure is used.

In this case, each element configuring the transmission device 400 may perform an operation using these parameters.

Meanwhile, although not illustrated, according to certain embodiments, the transmission device 400 may further include a controller (not shown) for controlling the operation of the transmission device 400.

Figure 5:
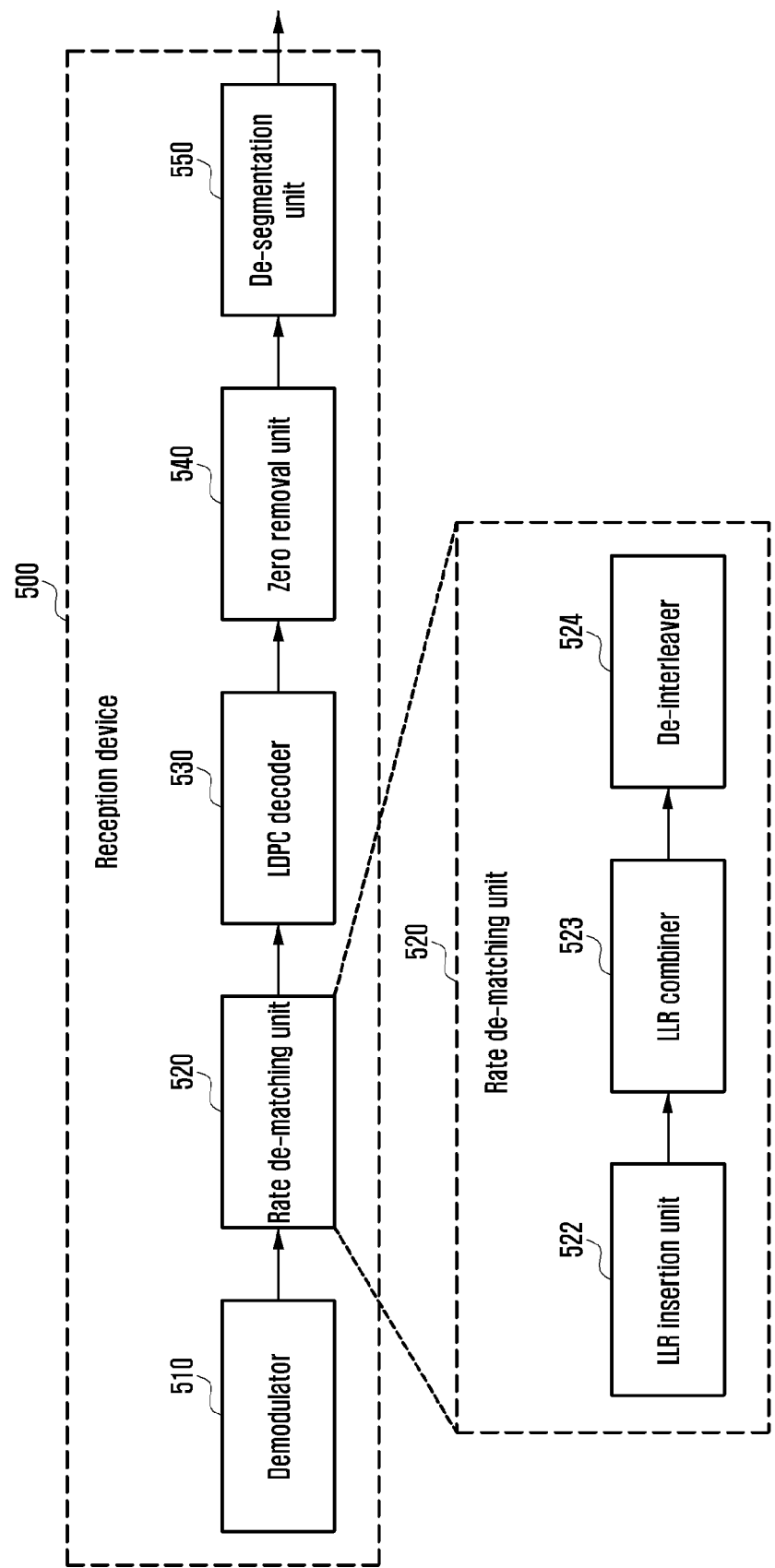
FIG. 5 illustrates, in block diagram format, an example of a reception device according to at least one embodiment of this disclosure.

FIG. 5 illustrates, in block diagram format, an example of a reception device according to certain embodiments of this disclosure.

Specifically, as illustrated in the non-limiting example of FIG. 5, in order to process variable length information, the reception device 500 may include a demodulator 510, a rate de-matching unit 520, an LDPC decoder 530, a zero removal unit 540, and a de-segmentation unit 550. The rate de-matching unit 520 may include a log likelihood ratio (LLR) insertion unit 522, an LLR combiner 523, a de-interleaver 524, and the like.

Here, elements illustrated in FIG. 5 are elements for performing the functions corresponding to elements illustrated in FIG. 5. This is a non-limiting example only. According to some cases, some of the elements may be omitted or changed, or other elements may be added.

The parity check matrix in the disclosure may be read using a memory, may be provided in advance by the transmission device or the reception device, or may be generated directly in the transmission device or the reception device. In addition, the transmission device may store or generate a sequence or an exponent matrix corresponding to the parity check matrix and apply the sequence or exponent matrix to the encoding. Likewise, the reception device may store or generate a sequence or an exponent matrix corresponding to the parity check matrix and apply the sequence or exponent matrix to the decoding.

Hereinafter, a detailed description of operations of a receiver will be made with reference to the explanatory example of FIG. 5.

Referring to the non-limiting FIG. 5, the demodulator 510 demodulates a signal received from the transmission device 400.

Specifically, the demodulator 510 is an element that corresponds to the modulator 450 of the transmission device 400 and receives and demodulates the signal transmitted from the transmission device 400, and thus may generate values corresponding to bits transmitted from the transmission device 400.

To this end, the reception device 500 may pre-store information about a modulation scheme for performing modulation according to a mode in the transmission device 400. Accordingly, the demodulator 510 may demodulate the signal received from the transmission device 400 according to a mode and generate values corresponding to LDPC codeword bits.

Meanwhile, a value corresponding to bits transmitted from the transmitting device 400 may be a value of a likelihood ratio (LR) or a value of a log likelihood ratio (LLR).

Specifically, the LR value denotes the ratio between the probability that the bit transmitted from the transmission device 400 is 0 and the probability that the bit transmitted from the transmission device 400 is 1, and the LLR value may be represented by a value obtained by taking the logarithm of the ratio between the probability that the bit transmitted from the transmission device 400 is 0 and the probability that the bit transmitted from the transmission device 400 is 1. Alternatively, the LR or LLR value may be obtained through a hard decision according to the probability, the ratio between the probabilities, or the log value of the ratio between the probabilities, and thus may be expressed by the bit value itself, or may be indicated as a representative value defined in advance according to the interval to which the probability, the ratio between the probabilities, or the log value of the ratio between the probabilities belongs. An example of a method for determining the representative value defined in advance according to the interval to which the probability, the ratio between the probabilities, or the log value of the ratio between the probabilities belongs includes a method in which quantization is considered. In addition, various other values corresponding to the probability, the ratio between the probabilities, or the log value of the ratio between the probabilities may be used.

In the disclosure, in order to explain the reception method and the operation of the device, an operation based on the LLR value has been described for convenience, but the disclosure is not limited thereto.

The demodulator 510 includes a function of performing multiplexing (not shown) of LLR values. Specifically, the mux (not shown) is an element corresponding to the bit demux (not shown) of the transmission device 400, and may perform an operation corresponding to the bit demux (not shown).

To this end, the reception device 500 may pre-store information on parameters used by the transmission device 400 in order to perform demultiplexing and block-interleaving operations. Accordingly, the mux (not shown) may reversely perform the demultiplexing and block-interleaving operations, performed in the bit demux (not shown) with respect to an LLR value corresponding to a cell word (information representing the received symbol for the LDPC codeword as a vector value), and thus may multiplex the LLR value corresponding to the cell word in bit units.

The rate de-matching unit 520 may additionally insert LLR values into LLR values output from the demodulator 510. In this case, the rate de-matching unit 520 may insert predetermined LLR values between the LLR values output from the demodulator 510.

In the non-limiting example of FIG. 5, the rate de-matching unit 520 is an element corresponding to the rate-matching unit 440 of the transmission device 400, and may perform operations corresponding to the interleaver 441 and the puncturing/repetition/zero removal unit 442.

First, the rate de-matching unit 520 performs de-interleaving corresponding to the interleaver 441 of the transmitter. The LLR insertion unit 522 may insert LLR values corresponding to zero bits into the output values of the de-interleaver 524 at the position where zero bits are padded in the LDPC codeword. In certain embodiments, the LLR value corresponding to the padded zero bits, that is, shortened zero bits, may be ∞ or −∞ However, ∞ or −∞ is a theoretical value, and thus may effectively be the maximum value or the minimum value of the LLR value used in the reception device 500.

To this end, the reception device 500 may pre-store information about the parameters used by the transmission device 400 for padding zero bits. Accordingly, the rate de-matching unit 520 may determine the positions where the zero bits are padded in the LDPC codeword and insert an LLR value corresponding to the shortened zero bits at the corresponding position.

In various embodiments, the LLR insertion unit 522 of the rate de-matching unit 520 may insert an LLR value corresponding to the punctured bits at the positions where bits are punctured in the LDPC codeword. Here, the LLR value corresponding to the punctured bits may be zero or another predetermined value. In general, in a case where the parity bits having a degree of 1 are punctured, there is no effect on performance improvement in the LDPC decoding process, which thus may not be used in the LDPC decoding process without LLR insertion at positions corresponding to some or all of the puncturing positions. However, in order to increase the efficiency of the LDPC decoding process based on the parallel process, the LLR insertion unit 522 may insert a predetermined LLR at positions corresponding to part or all of the puncturing bits of order 1 regardless of the decoding performance improvement.

To this end, the reception device 500 may pre-store information on parameters used by the transmission device 400 in order to perform puncturing. Accordingly, the LLR insertion unit 522 may insert an LLR value (e.g., LLR=0) corresponding to the punctured bits at positions where the LDPC information bits or parity bits are punctured. However, this process may be omitted at a position where some parity bits are punctured.

The LLR combiner 523 may perform combination, that is, may sum LLR values output from the LLR insertion unit 522 and the demodulator 510. Specifically, the LLR combiner 523 is an element corresponding to the puncturing/repetition/zero removal unit 442 of the transmission device 400, and may perform an operation corresponding to the repetition unit 442. First, the LLR combiner 523 may combine an LLR value corresponding to repetition bits with another LLR value. Here, the another LLR value may be an LLR value for bits, serving as the basis for generation of repetition bits in the transmission device 400, that is, LDPC information bits or parity bits selected to be repeated.

That is, in this non-limiting example, the transmission device 400 selects LDPC-coded bits, performs repetition of the selected LDPC-coded bits between LDPC information bits and LDPC parity bits, so as to transmit the repeated LDPC coded bits to the reception device 500. Accordingly, the LLR value for LDPC-coded bits may include an LLR value for repeated LDPC-coded bits and an LLR value for non-repeated LDPC-coded bits. The LLR combiner 523 may combine LLR values corresponding to the same LDPC-coded bits.

To this end, the reception device 500 may pre-store information on parameters used for repetition in the transmission device 400. Accordingly, the LLR combiner 523 may determine the LLR value for the repeated LDPC-coded bits and combine the LLR value for the repeated LDPC-coded bits with the LLR value for the LDPC coded bits, serving as the basis of the repetition.

In addition, the LLR combiner 523 may combine the LLR value corresponding to the retransmitted or incremental redundancy (IR) bits with another LLR value. Here, the another LLR value may be the LLR value for a part or all of the LDPC codeword bits, serving as the basis of the generation of retransmitted or IR bits in the transmission device 400.

As described above, in a case where the NACK occurs for the HARQ, the transmission device 400 may transmit all or a part of the codeword bits to the reception device 500.

Accordingly, the LLR combiner 523 may combine the LLR value for bits received through retransmission or IR with the LLR value for LDPC codeword bits received through the previous frame.

According to various embodiments, the reception device 500 may pre-store information about parameters used for retransmission or generation of IR bits in the transmission device 400. Accordingly, the LLR combiner 523 may determine LLR values for retransmission or the number of IR bits, and may combine the determined LLRs value with LLR values for the LDPC coded bits, serving as the basis for the generation of retransmission bits.

The de-interleaver 524 may de-interleave the LLR value output from the LLR combiner 523.

Specifically, the de-interleaver unit 524 is an element corresponding to the interleaver 441 of the transmission device 400, and may perform an operation corresponding to the interleaver 441.

In some embodiments, the reception device 500 may pre-store information on parameters used by the transmission device 400 in order to perform interleaving. Accordingly, the de-interleaver 524 may reversely perform the interleaving operation, performed by the interleaver 441, with respect to the LLR values corresponding to the transmitted LDPC-coded bits, so as to de-interleave the LLR values corresponding to the transmitted LDPC-coded bits.

The LDPC decoder 530 may perform LDPC decoding based on the LLR value output from the rate de-matching unit 520.

Specifically, the LDPC decoder 530 is an element corresponding to the LDPC encoder 430 of the transmission device 400, and may perform an operation corresponding to the LDPC encoder 430.

According to some embodiments, the reception device 500 may pre-store information on parameters used in the transmission device 400 in order to perform LDPC encoding according to a mode. Accordingly, the LDPC decoder 530 may perform LDPC decoding based on the LLR value output from the rate de-matching unit 520 according to a mode.

For example, the LDPC decoder 530 may perform LDPC decoding based on the LLR value output from the rate de-matching unit 520 based on an iterative decoding method based on a sum-product algorithm, and may output bits in which an error is corrected according to the LDPC decoding.

The zero removal unit 540 may remove zero bits from bits output from the LDPC decoder 530.

Specifically, the zero removal unit 540 is an element corresponding to the zero-padding unit 420 of the transmission device 400, and may perform an operation corresponding to the zero-padding unit 420.

According to some embodiments, the reception device 500 may pre-store information about a parameter used to pad zero bits in the transmission device 400. Accordingly, the zero removal unit 540 may remove the zero bits padded by the zero-padding unit 420 from among the bits output from the LDPC decoder 530.

The de-segmentation unit 550 is an element corresponding to the segmentation unit 410 of the transmission device 400, and may perform an operation corresponding to the segmentation unit 410.

To this end, the reception device 500 may pre-store information on parameters used by the transmission device 400 in order to perform segmentation. Accordingly, the de-segmentation unit 550 may combine bits, that is, segments for variable-length input bits, output from the zero removal unit 540, and thus may reconstruct bits before segmentation.

In certain embodiments, LDPC codes may be decoded using an iterative decoding algorithm based on a sum-product algorithm on a bipartite graph, illustrated in FIG. 2, and the sum-product algorithm is a kind of message-passing algorithm.

Hereinafter, a message-passing operation generally used for LDPC decoding will be described with reference to the illustrative examples shown in FIGS. 6A and 6B.

Figure 6A:
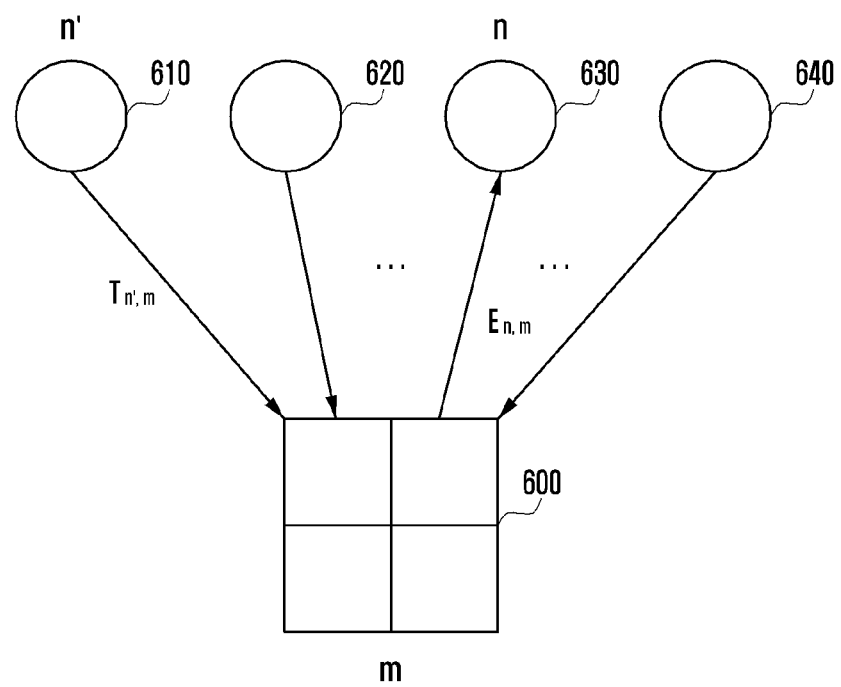
FIG. 6A illustrates an example of a structure of a message indicating a message passing operation of a predetermined check node and a variable node for LDPC decoding, according to certain embodiments of this disclosure.
Figure 6B:
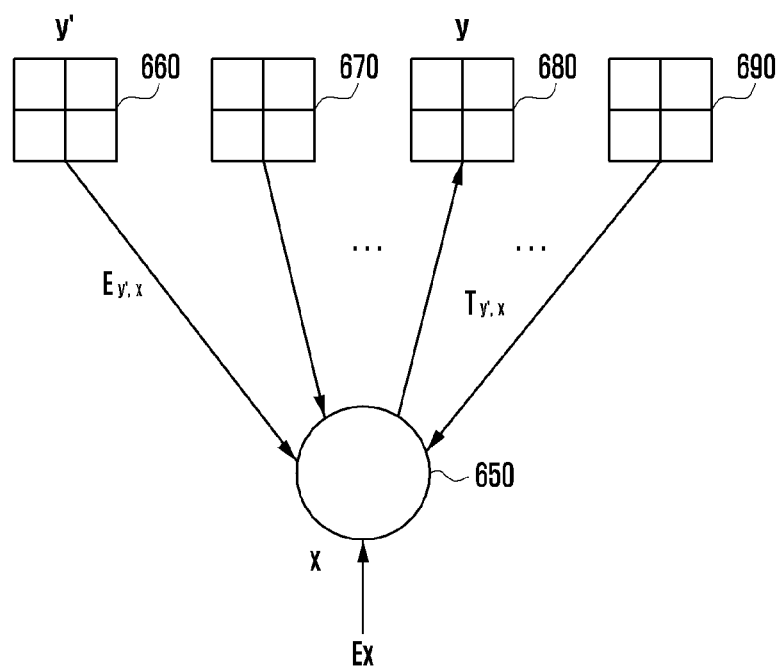
FIG. 6B illustrates an example of a structure of a message indicating a message passing operation of a predetermined check node and a variable node for LDPC decoding, according to some embodiments of this disclosure.

FIGS. 6A and 6B illustrate examples of message-passing operations performed at arbitrary check and variable nodes in order to perform LDPC decoding, according to certain embodiments of this disclosure.

FIG. 6A illustrates multiple variable nodes 610, 620, 630, and 640 connected to a check node m 600 and a check node m 600. Referring to the non-limiting example of FIG. 6A, the illustrated $T_{n',m}$ indicates a message passed from the variable node n' 610 to the check node m 600, and $E_{n,m}$ indicates a message passed from the check node m 600 to the variable node n 630. Here, the set of all variable nodes connected to the check node m 600 is defined as "N(m)", and a set excluding the variable node n 630 from the set N(m) is defined as "N(m)\n".

In this case, the message update rule based on the sum-product algorithm may be expressed as [Equation 15] below.

$$|E_{n,m}| = \Phi\left(\sum_{n' \in N(m)\backslash n} \Phi(|T_{n',m}|)\right),$$ [Equation 15]

$$\text{sign}(E_{n,m}) = \left(\sum_{n' \in N(m)\backslash n} \text{sign}(T_{n',m})\right).$$

Here, sign ($E_{n,m}$) represents the + and − signs of message $E_{n,m}$, and $|E_{n,m}|$ represents the magnitude of the message $E_{n,m}$. In some embodiments, the function $\Phi(x)$ may be expressed as [Equation 16] below.

$$\Phi(x) = -\log\left(\tanh\left(\frac{x}{2}\right)\right)$$ [Equation 16]

Referring to the non-limiting example of FIG. 6B, multiple check nodes 660, 670, 680, and 690 connected to a variable node x 650 and a variable node x 650 are shown. In addition, the illustrated $E_{y',x}$ indicates a message passed from the check node y' 660 to the variable node x 650, and $T_{y,x}$ indicates a message passed from the variable node x 650 to the check node y 680. Here, a set of all the check nodes connected to the variable node x 650 is defined as "M(x)", and a set excluding the check node y 680 from M(x) is defined as "M(x)\y". In this case, the message update rule based on the sum-product algorithm may be expressed by [Equation 17] below.

$$T_{y,x} = E_x + \sum_{y' \in M(x)\backslash y} E_{y',x}$$ [Equation 17]

Here, $E_x$ denotes the initial message value of the variable node x.

In addition, a bit value of the node x may be determined as [Equation 18] below.

$$P_x = E_x + \sum_{y' \in M(x)} E_{y',x}$$ [Equation 18]

In this case, the encoded bit corresponding to the node x may be determined according to the value of $P_x$.

For reference, the degree or weight of the LDPC code may denote a line connected to a variable node processor or a check node processor in terms of HW, and thus may be expressed as a line, (inter-) connected line, edge, or the like. In addition, the degree or weight of the LDPC code may denote the number of messages (for example, LLR or a value corresponding to the LLR) input, processed, or output to, in, or from a node processor (or a node unit) of HW or a value corresponding to the number of the messages. In HW, the structure of the message input/output, the processor, and the connected line may also be expressed as an interconnection network or shift network.

Since the scheme illustrated with reference to FIGS. 6A and 6B is a general decoding scheme, a detailed description thereof will be omitted. In addition to the scheme described in FIGS. 6A and 6B, other schemes may be applied to determine message values passed at variable nodes and check nodes. Frank R. Kschischang, Brendan J. Frey, and Hans-Andrea Loeliger, "Factor Graphs and the Sum-Product Algorithm," IEEE TRANSACTIONS ON INFORMATION THEORY, VOL. 47, NO. 2, FEBRUARY 2001, pp. 498-519, incorporated herein by reference, illustrates a further example of a decoding scheme.

Figure 7:
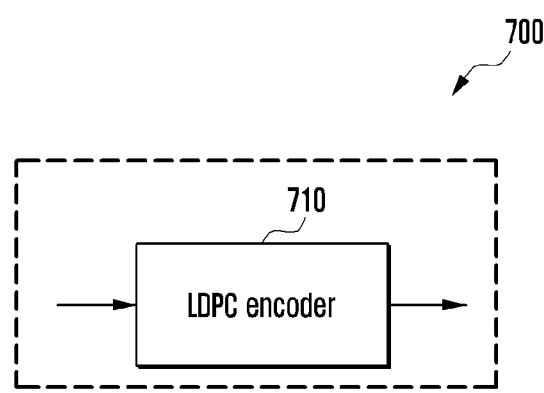
FIG. 7 illustrates, in block diagram format, an example of a configuration of an LDPC encoder according to various embodiments.

FIG. 7 illustrates, in block diagram format, an example of a detailed configuration of an LDPC encoder according to certain embodiments of this disclosure.

$K_{ldpc}$ bits may configure $K_{ldpc}$ LDPC information bits $I=(i_0, i_1, \ldots, i_{K_{ldep}-1})$ for an LDPC encoding device 700. The LDPC encoding device 700 systematically performs LDPC encoding of the $K_{ldpc}$ LDPC information bits, and thus may generate LDPC codeword $C=(c_0, c_1, \ldots, c_{Nldpc-1})=(i_0, i_1, \ldots, i_{Kldpc-1}, p_0, p_1, \ldots, p_{Nldpc-Kldpc-1})$, which is configured by $N_{ldpc}$ bits.

As described in [Equation 1], the codeword is determined such that the product of the LDPC codeword and the parity check matrix becomes a zero vector.

According to the non-limiting example of FIG. 7, the LDPC encoding device 700 includes an LDPC encoder 710. The LDPC encoder 710 may perform LDPC encoding of input bits based on a parity check matrix, or an exponent matrix or sequence corresponding thereto so as to generate an LDPC codeword. Here, the LDPC encoder 710 may perform LDPC encoding using parity-check matrices defined differently according to code rates (i.e., code rates of LDPC codes).

In certain embodiments, the LDPC encoding device 700 may further include a memory (not shown) for pre-storing information about a code rate, a codeword length, and a parity check matrix of the LDPC code, and the LDPC encoder 710 may perform LDPC encoding using the information described above. The information about the parity check matrix may include information about an exponential value of a circular matrix in the case where the parity matrix proposed in the disclosure is used.

Figure 8:
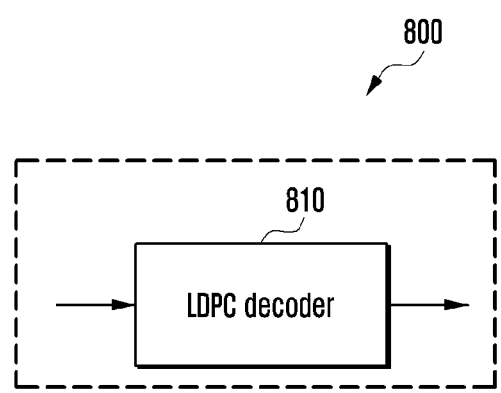
FIG. 8 illustrates, in block diagram format, an example of a configuration of a decoding device, according to some embodiments.

FIG. 8 illustrates, in block diagram format, an example of a configuration of a decoding device according to certain embodiments of this disclosure.

According to the non-limiting example of FIG. 8, a decoding device 800 may include an LDPC decoder 810.

The LDPC decoder 810 performs LDPC decoding of the LDPC codeword based on the parity check matrix, or an exponent matrix or sequence corresponding thereto.

For example, the LDPC decoder 810 may perform LDPC decoding by passing an LLR value corresponding to LDPC codeword bits through an iterative decoding algorithm, so as to generate information bits. Here, the LLR value is a channel value corresponding to the LDPC codeword bits, and may be represented in various ways.

In this case, a transmission side may generate an LDPC codeword using the LDPC encoder 710 as shown in the illustrative example of FIG. 7.

In this case, the LDPC decoder 810 may perform LDPC decoding using parity-check matrices defined differently according to code rates (i.e., code rates of LDPC codes).

Figure 9:
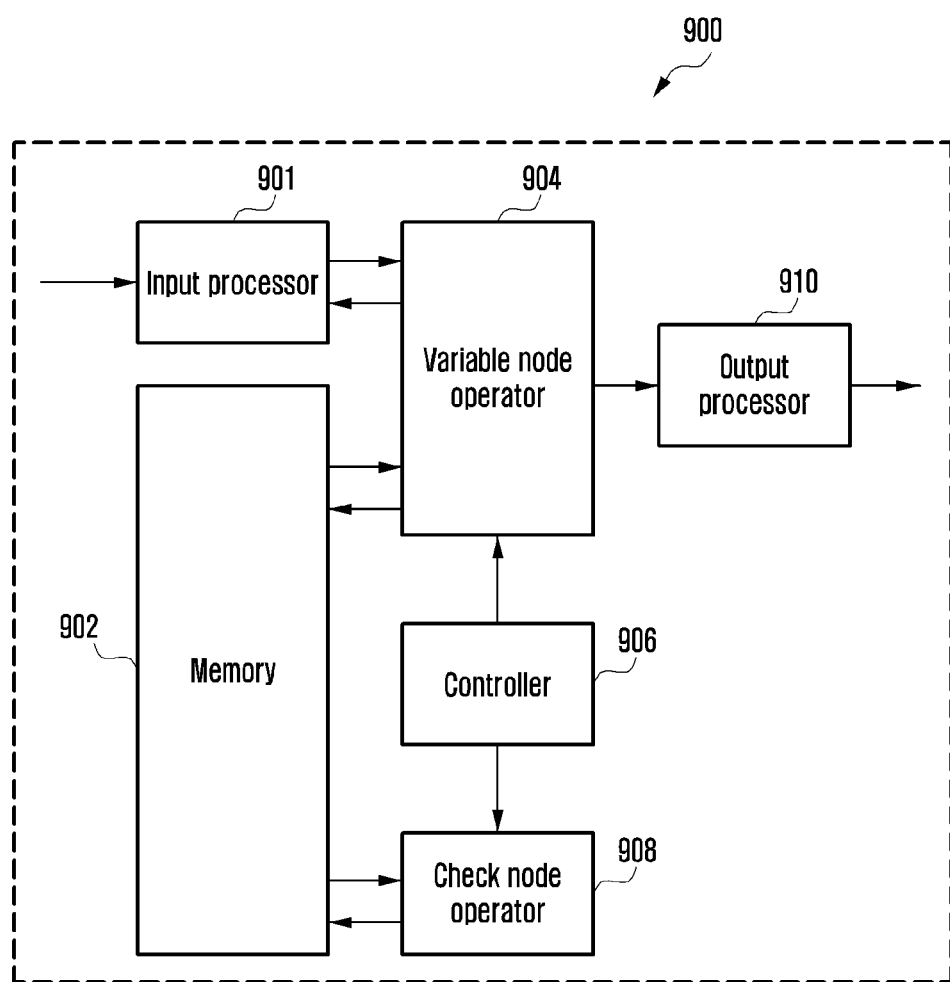
FIG. 9 illustrates an example of a structure of an LDPC decoder according to some embodiments.

FIG. 9 illustrates an example of a structure of an LDPC decoder according to certain embodiments of this disclosure.

Meanwhile, as described above, the LDPC decoder 810 may perform LDPC decoding using an iterative decoding algorithm, and here, the LDPC decoder 810 may be configured as the same structure as shown in FIG. 9. However, the detailed configuration shown in FIG. 9 is only an example of one possible configuration.

According to the illustrative example of FIG. 9, a decoding device 900 includes an input processor 901, a memory 902, a variable node operator 904, a controller 906, a check node operator 908, an output processor 910, and the like.

The input processor 901 stores input values. Specifically, the input processor 901 may store an LLR value of a received signal received through a radio channel.

The controller 904 determines the number of values input to the variable node operator 904, the address value in the memory 902, the number of values input to the check node operator 908, and the address value in the memory 902, based on the parity check matrix corresponding to the block size (i.e., the length of the codeword) and the code rate of a received signal received through the radio channel.

The memory 902 stores input data and output data of the variable node operator 904 and the check node operator 908.

The variable node operator 904 receives pieces of data from the memory 902 according to address information of input data and information on the number of pieces of input data, received from the controller 906, to perform a variable node operation. Thereafter, the variable node operator 904 stores, in the memory 902, the results obtained from the variable node operation, based on the address information of the output data and information on the number of pieces of output data received from the controller 906. In addition, the variable node operator 904 inputs the results obtained from the variable node operation to the output processor 910 based on the data received from the input processor 901 and the memory 902. Here, the variable node operation has been described above based on FIG. 6.

According to some embodiments, check node operator 908 receives data from the memory 902 based on the address information of the input data and the information on the number of pieces of input data, received from the controller 906, to perform a check node operation. Thereafter, the check node operator 908 stores, in the memory 902, the results obtained from the check node operation, based on the address information of the output data and the information on the number of pieces of output data, received from the controller 906. Here, the check node operation has been described above based on FIG. 6.

The output processor 910 makes a hard decision as to whether each of the information bits of the codeword of the transmission side is 0 or 1 based on the data received from the variable node operator 904, and then outputs the result of the hard decision. The output value of the output processor 910 becomes the finally decoded value. In this case, in FIG. 6, it is possible to make a hard decision based on the value obtained by adding up all message values (initial message value and all message values input from the check node) input to one variable node.

Meanwhile, the memory 902 of the decoding device 900 may pre-store information about the code rate, the codeword length, and the parity check matrix of LDPC codes, and the LDPC decoder 810 may perform LDPC decoding using the information. However, this is only an example, and the corresponding pieces of information may be provided from the transmission side.

Figure 10:
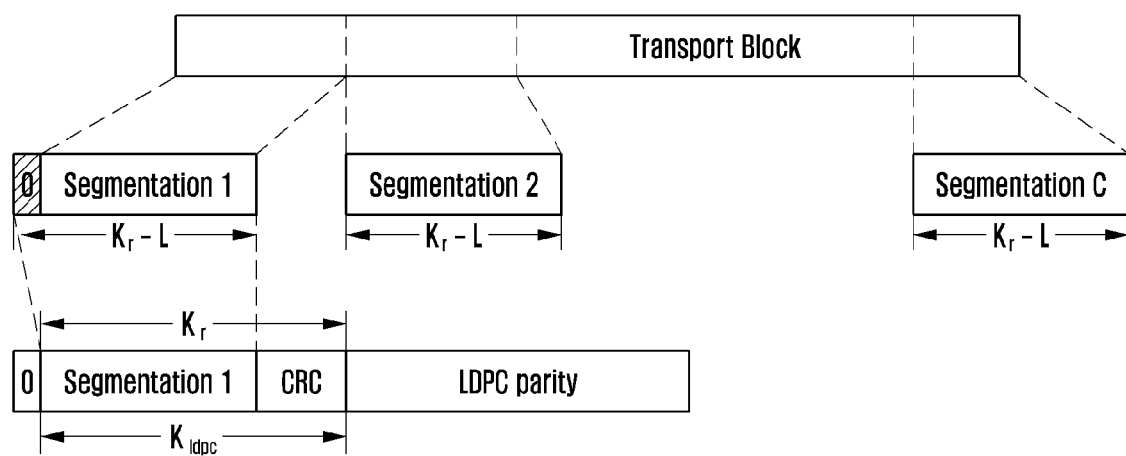
FIG. 10 illustrates an example of a structure of a transport block according to certain embodiments.

FIG. 10 illustrates an example of a structure of a transport block according to certain embodiments of this disclosure.

Referring to the non-limiting example of FIG. 10, <Null> bits may be added in order to make the segmented lengths to be equal. In addition, <Null> bits may be added in order to match information lengths of LDPC codes.

A method for applying various block sizes based on QC-LDPC codes in communication and broadcasting systems supporting LDPC codes of various lengths has been described. In general, the case where a sequence is appropriately converted (or transformed) and used for various block sizes L from one LDPC exponent matrix or sequence, such as the lifting method described in [Equation 9] and [Equation 10], includes many advantages because the system only has to be implemented in one or a small number of sequences. However, as the number of block sizes to be supported increases, it is very difficult to design an LDPC code having good performance for all block sizes.

In 5G NR, the transport block size (TBS) to be transmitted may be determined, and then one of two different base matrices of LDPC codes, used for LDPC encoding or decoding, may be determined based on a TBS size determined through the following [Base matrix determination method] and a code rate indicated by the modulation and coding scheme (for reference, in 5G NR standard, a base matrix may be expressed as a base graph).

[Base Matrix Determination Method]

The LDPC base matrix for LDPC encoding and decoding of a transport block having a transport block size of A (TBS=A) may be determined based on the TBS size and the code rate indicated by the MCS (modulation and coding scheme) as follows:

If A≤292 or A≤3824, and R≤0.67 or R≤0.25, LDPC encoding may be performed using LDPC base matrix 2.

Otherwise, LDPC encoding may be performed using LDPC base matrix 1.

In addition, the number of CRC bits ($L_{TB}$) to be added to the transport block may be determined according to the determined TBS, as follows.

[Method for Determining the Number of Transport Block CRC Bits]

The $L_{TB}$ value of CRC bit size for the transport block having a transport block size of A (TBS=A) may be differently configured according to the TBS value as follows.

$L_{TB}$=24 if A>3824, $L_{TB}$=16 otherwise.

LDPC encoding is performed for each code block by determining an appropriate code block from the transport block according to the total number of bits (B=A+L) in which CRC is added to the determined TBS size or the transport block. At this time, in the 5G NR standard, the process of determining the code block size (CBS) is as follows:

[CBS Decision Method]

The input bit sequence for code block segmentation may be expressed as $b_0, b_1, \ldots, b_{B-1}$ (here, B>0). If B is larger than the maximum code block size $K_{cb}$, segmentation of the input bit sequence is performed, and a CRC of L=24 bits is additionally added to each code block. The maximum code block size for LDPC base matrix 1 corresponds to $K_{cb}$=8448, and the maximum code block size for LDPC base matrix 2 corresponds to $K_{cb}$=3840.

Operation 1: The number C of code blocks may be determined.

If B≤$K_{cb}$, L=0 and C=1, B'=B.

Otherwise, L=24, C=⌈B/($K_{cb}$-L)⌉, B'=B+C×L.

Operation 2: Bits output through code block segmentation are cr0, cr1, . . . , cr (Kr−1), here, r may denote a code block number (here, 0≤r<C), and Kr (=K) may denote the number of bits of a code block for code block number r. Here, K, which is the number of bits included in each code block, may be calculated as follows:

K'=B'/C;

In a case of LDPC base matrix 1, $K_b$=22.

In a case of LDPC base matrix 2,

If B>640, $K_b$=10;

If 560<B≤640, $K_b$=9;

If 192<B≤560, $K_b$=8;

If B≤192, $K_b$=6.

Operation 3: Among Z values in [Table 1], a minimum value $Z_c$ satisfying $K_b \times Z \geq K'$ is determined. K=22$Z_c$ is configured for LDPC base matrix 1, and K=10$Z_c$ is configured for LDPC base matrix 2.

TABLE 1

| Set index ($i_{LS}$) | Set of lifting sizes (Z) |
| --- | --- |
| 0 | {2, 4, 8, 16, 32, 64, 128, 256} |
| 1 | {3, 6, 12, 24, 48, 96, 192, 384} |
| 2 | {5, 10, 20, 40, 80, 160, 320} |

TABLE 1-continued

| Set index ($i_{LS}$) | Set of lifting sizes (Z) |
| --- | --- |
| 3 | {7, 14, 28, 56, 112, 224} |
| 4 | {9, 18, 36, 72, 144, 288} |
| 5 | {11, 22, 44, 88, 176, 352} |
| 6 | {13, 26, 52, 104, 208} |
| 7 | {15, 30, 60, 120, 240} |

In operation 2 of the [CBS determination method], $K_b$ values are values corresponding to columns or column blocks corresponding to LDPC information bits, in a base matrix (or base graph) or a parity check matrix of the LDPC code, respectively, and may correspond to the maximum value (=$K_b Z_c$) of the LDPC information bits without performing shortening or zero-padding. For example, even if the number of columns (or column blocks) corresponding to information bits in LDPC base matrix 2 or a parity check matrix corresponding thereto is 10, in a case where $K_b$ is configured as 6, LDPC encoding/decoding is substantially performed on information bits of the maximum 6$Z_c$ bits, and information bits corresponding to the at least (10-$K_b$) $Z_c$=4$Z_c$ columns in the parity check matrix are shortened or zero padded. Here, the shortening or zero padding may denote that a transmitter and a receiver may allocate a promised bit value, such as 0, and may not use the corresponding part in the parity check matrix.

[Table 1] shows candidates for values of lifting size Z for LDPC encoding and decoding. Each of Z value is included in a predetermined specific set according to an index $i_{LS}$. If the Z value is determined in operation 3 of [CBS determination method], a set corresponding to the Z value or the index $i_{LS}$ value of the set may be determined, and a parity check matrix of LDPC code corresponding to each index or a sequence corresponding thereto may also be determined. Encoding and decoding of LDPC codes of various lengths are supported by converting (or transforming) the parity check matrix or sequence by applying modulo operation based on lifting size Z to the parity check matrix of the LDPC code determined as described above or the sequence corresponding thereto. Even in 5G NR, each number included in the parity check matrix or sequence of the LDPC code denotes a value corresponding to a circulant permutation matrix or circular permutation matrix.

In a case where a method for determining the value of the lifting size Z is predetermined, the Z value may, in some embodiments, be determined according to a base matrix and the range of and TBS values (or a value obtained by adding up the number of CRC bits and the TBS). For example, in the case of applying the TBS determination method defined in the 5G NR standard specification as well as the [Base matrix determination method], [Method for determining the number of transport block CRC bits], and [CBS determination method], a set of lifting sizes such as [Table 2] as follows may be defined and used.

TABLE 2

| Set index ($i_{LS}$) | Set of lifting sizes (Z) |
| --- | --- |
| 0 | {8, 16, 32, 64, 128, 256} |
| 1 | {12, 24, 48, 96, 192, 384} |
| 2 | {10, 20, 40, 80, 160, 320} |
| 3 | {7, 14, 28, 56, 112, 224} |
| 4 | {18, 36, 72, 144, 288} |
| 5 | {11, 22, 44, 88, 176, 352} |
| 6 | {26, 52, 104, 208} |
| 7 | {15, 30, 60, 120, 240} |

[Table 2] illustrates sets of lifting sizes, which are configured by excluding 2, 3, 4, 5, 6, 9, and 13 from [Equation 11] and [Table 1]. Therefore, since the minimum lifting size is 7 in the LDPC code-based communication system employing [Table 2] as the lifting size, it can be seen that each column block configuring the parity check matrix of LDPC codes used for LDPC encoding and decoding includes at least 7 columns.

Figure 11:
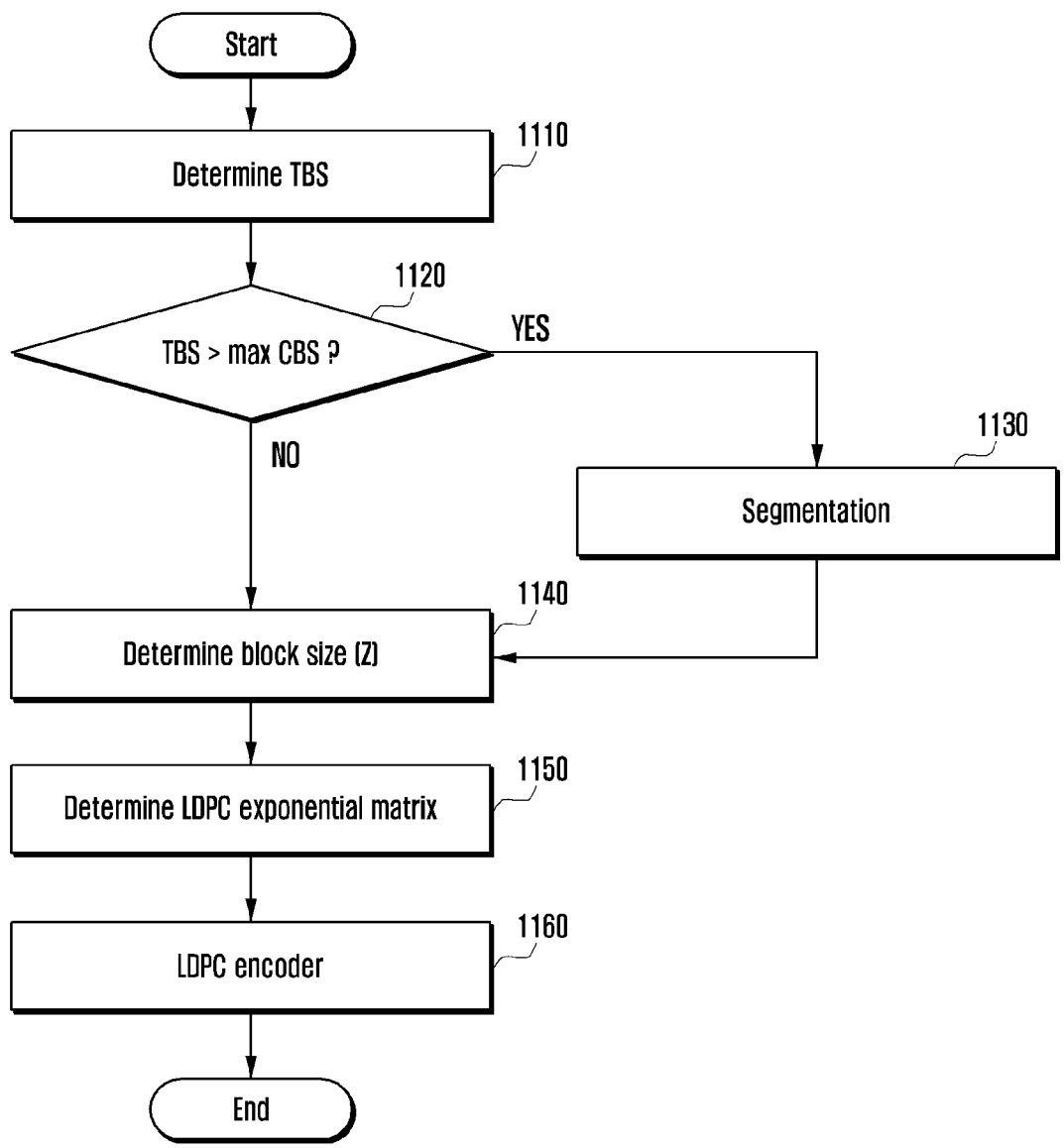
FIG. 11 illustrates an example of an LDPC encoding process according to certain embodiments of this disclosure.
Figure 12:
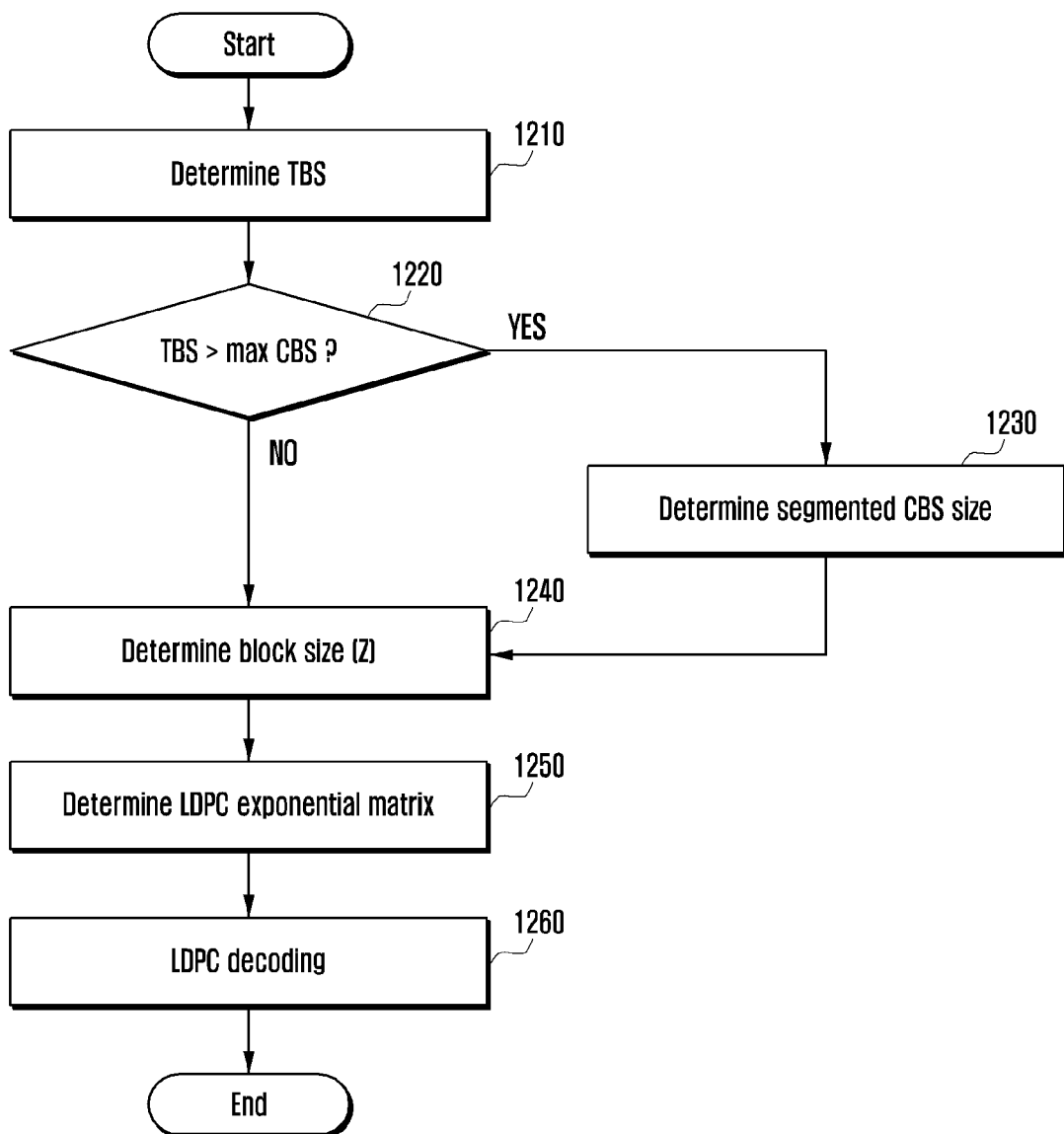
FIG. 12 illustrates an example of an LDPC decoding process according to certain embodiments of this disclosure.

FIGS. 11 and 12 illustrate examples of LDPC encoding and decoding processes based on the designed base matrix or exponent matrix, according to various embodiments of this disclosure.

FIG. 11 illustrates an example of an LDPC encoding process according to certain embodiments of this disclosure.

First, a transmitter determines a transport block size (TBS) to be transmitted, as in operation 1110 of FIG. 11. Then, in operation 1120, the transmitter determines whether the TBS is greater than the max CBS or equal to or smaller than the max CBS.

According to some embodiments, if the TBS is greater than the max CBS, in operation 1130, the transmitter performs segmentation of the transport block to newly determine a CBS, and if the TBS is smaller than or equal to the max CBS, the segmentation operation is omitted and the TBS is determined as the CBS.

In operation 1140, the transmitter determines a value of a block size (Z) to be applied to LDPC encoding, based on the CBS.

In operation 1150, the transmitter appropriately determines an LDPC exponent matrix or sequence according to the TBS, the CBS, or the value of the block size (Z).

Further, in operation 1160, the transmitter performs LDPC encoding based on the determined block size, exponent matrix, or sequence. For reference, operation 1150 may include a process of converting (or transforming) the determined LDPC exponent matrix or sequence based on the determined block size according to some cases. It is evident that the LDPC exponent matrix, the sequence, or the parity check matrix for LDPC encoding may be determined in various ways based on the TBS or the CBS depending on the system. For example, a base matrix may be first determined based on the TBS, and the LDPC exponent matrix, the LDPC sequence, or the parity check matrix may be determined based on the determined base matrix and CBS, or various other methods may also be applied.

The LDPC decoding process may be similarly illustrated as in FIG. 12.

FIG. 12 illustrates an example of an LDPC decoding process according to certain embodiments of this disclosure.

Referring to the non-limiting example of FIG. 12, if the TBS is determined in operation 1210, the receiver determines whether the TBS is greater than the max CBS or smaller than or equal to the max CBS in operation 1220.

If the TBS is greater than the max CBS, the receiver determines the size of the CBS to which segmentation is applied in operation 1230. If it is determined that TBS is smaller than or equal to the max CBS, the TBS is determined to be the same as the CBS.

In certain embodiments, at operation 1240, the receiver determines a value of a block size (z) to be applied to LDPC decoding.

Further, in operation 1250, the receiver appropriately determines an LDPC exponent matrix or sequence based on the TBS, the CBS, or the block size (Z) value. In addition, the receiver performs LDPC decoding based on the determined block size, exponent matrix, or sequence in operation 1260. For reference, operation 1250 may include a process of converting (or transforming) the determined LDPC exponent matrix or sequence based on the determined block size according to some cases. According to certain embodiments, the LDPC exponent matrix, the sequence, or the parity check matrix for LDPC decoding may be determined in various ways based on the TBS or the CBS depending on the system. For example, a base matrix may be first determined based on the TBS, and the LDPC exponent matrix, the sequence, or the parity check matrix may be determined based on the determined base matrix and CBS, or various other methods may also be applied.

According to the above-described example, the processes of determining the exponent matrix or sequence of LDPC codes in operations 1150 and 1250 of FIGS. 11 and 12, respectively, have been described based on one of the TBS, the CBS, and the block size (Z). However, various other methods may exist.

According to certain embodiments of the LDPC encoding and decoding processes based on the base matrix and exponent matrix (or LDPC sequence) of the LDPC codes of FIGS. 11 and 12, a part of information bits for the LDPC code is shortened appropriately and a part of codeword bits is punctured and repeated, and thus LDPC encoding and decoding of various code rates and various lengths may be supported. For example, in FIGS. 11 and 12, in a case where a part of the information bits is shortened in the base matrix or exponent matrix determined for LDPC encoding and decoding, and then information bits corresponding to the first two column blocks in the parity check matrix are punctured, some of the parities are punctured, or some of the LDPC codewords are repeated, various information lengths (or code block lengths) and various code rates may be supported.

In addition, in a case where a variable information length or a variable coding rate is supported using the shortening or zero-padding of the LDPC code, the code performance may be improved according to the sequence of shortening or shortening method. If the sequence of shortening is pre-configured, the coding performance may be improved by rearranging the sequence of all or a part of the given base matrix. In addition, the performance may be improved by appropriately determining, with respect to a specific information length (or code block length CB), a block size or the number of column blocks to which the shortening is to be applied.

According to some embodiments, the coding rate of the LDPC code may be adjusted by puncturing codeword bits according to coding rates. In the case of puncturing parity bits corresponding to a column having a degree of 1, the LDPC decoder may perform decoding without using all or part of the corresponding portion in the parity check matrix, and thus decoding complexity can be reduced. However, in the case of considering the coding performance, a method for improving the performance of the LDPC codes by adjusting the puncturing order for parity bits or the transmission sequence of the generated LDPC codeword is provided. For example, it is possible to support better performance in a case where parity bits and a part of information bits are appropriately punctured than in the case of supporting the variable code rate by simply puncturing the parity bits. In addition, LDPC coding performance may be improved by appropriately determining a repetition order in advance in a case where repetition of some of the LDPC codewords is performed in order to support a lower code rate. For reference, the case in which a part of the information bits is punctured may denote that the transmitter does not transmit a part of the information 102 of FIG. 1, and thus bits that are not transmitted may be processed, as erased, by the receiver.

According to various embodiments, in the LDPC encoding process, the transmitter may first determine the size of input bits (or code blocks) to which LDPC encoding is to be applied, determine the block size (Z) to which the LDPC encoding is applied according to the size of the code blocks, determine a suitable LDPC exponent matrix or sequence according to the determined block size, and then perform the LDPC encoding based on the block size (Z), the determined exponent matrix, or LDPC sequence. In this case, the LDPC exponent matrix or sequence may be applied to the LDPC encoding without conversion (or transformation) thereof, or LDPC encoding may be performed by appropriately converting (or transforming) the LDPC exponent matrix or sequence according to the block size (Z) according to some cases.

Similarly, in the LDPC decoding process, the receiver may determine the size of input bits (or code blocks) of the transmitted LDPC codewords, determine the block size (Z) to which the LDPC decoding is applied according to the size of input bits (or code blocks), determine an appropriate LDPC exponent matrix or sequence according to the determined block size, and then perform the LDPC decoding based on the block size (Z), and the determined exponent matrix or LDPC sequence. In this case, the LDPC exponent matrix or sequence may be applied to the LDPC decoding without conversion (or transformation) thereof, or LDPC decoding may be performed by appropriately converting (or transforming) the LDPC exponent matrix or sequence according to the block size (Z) according to some cases.

Certain embodiments according to this disclosure include a method for improving decoding performance in a communication system or broadcasting system including a layer structure, such as a multiple input multiple output (MIMO) system or superposition coded modulation (SCM) system to which LDPC encoding is applied. For reference, the SCM system includes a layered-division multiplexing (LDM) system, as a representative example.

Figure 13A:
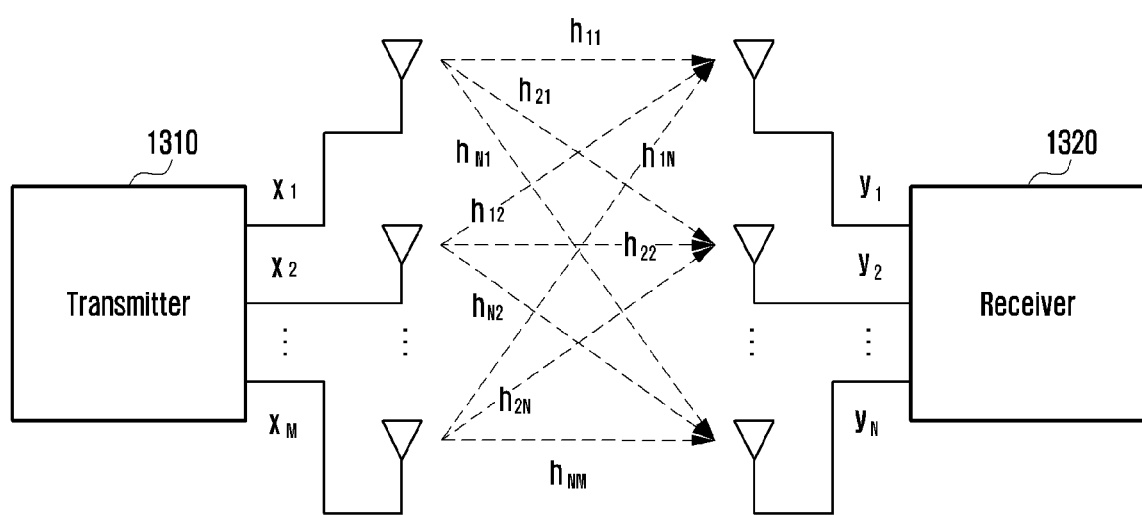
FIG. 13A illustrates an example of a MIMO system according to certain embodiments of this disclosure.
Figure 13B:
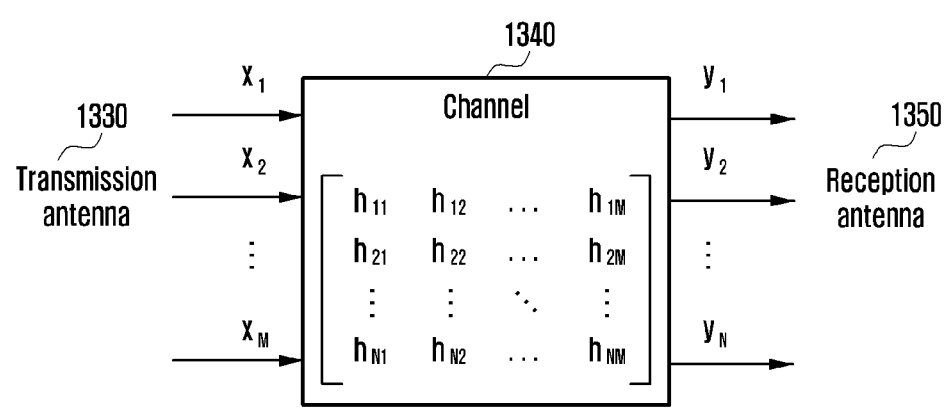
FIG. 13B illustrates an example of a MIMO system according to certain embodiments of this disclosure.

FIG. 13A illustrates an example of a MIMO system according to certain embodiments of this disclosure, and FIG. 13B illustrates an example of a MIMO system according to certain embodiments of this disclosure.

Referring first to the illustrative example of FIG. 13A, a transmitter 1310 transmits signals $x_1, x_2, \ldots,$ and $x_M$ to M transmission antennas, respectively. Each of the signals is transmitted, through a channel, as N reception antenna reception signals $y_1, y_2, \ldots,$ and $y_N$. In the case of modeling a channel between the i-th transmission antenna and the j-th reception antenna via $h_{ji}$, the MIMO system of FIG. 13A is simplified as shown in FIG. 13B. In addition, the MIMO system can be summarized simply as in [Equation 19] below.

$$\begin{bmatrix} y_1 \\ y_2 \\ \vdots \\ y_N \end{bmatrix} = \begin{bmatrix} h_{11} & h_{12} & \ldots & h_{1M} \\ h_{21} & h_{22} & \ldots & h_{2M} \\ \vdots & \vdots & \ddots & \vdots \\ h_{N1} & h_{N2} & \ldots & h_{NM} \end{bmatrix} \cdot \begin{bmatrix} x_1 \\ x_2 \\ \vdots \\ x_N \end{bmatrix} + \begin{bmatrix} n_1 \\ n_2 \\ \vdots \\ n_N \end{bmatrix}, \quad \text{[Equation 19]}$$

$(i = 1, 2, 3, \ldots, M, j = 1, 2, 3, \ldots, N)$

In [Equation 19], $h_{ji}$ denotes a channel coefficient for a channel 1340 between an i-th transmission antenna 1330 and a j-th reception antenna 1350, as shown in FIG. 13B, and $n_j$ is the additive noise of the j-th reception antenna. The additive noise includes additive white Gaussian noise (AWGN), as an example.

Figure 14:
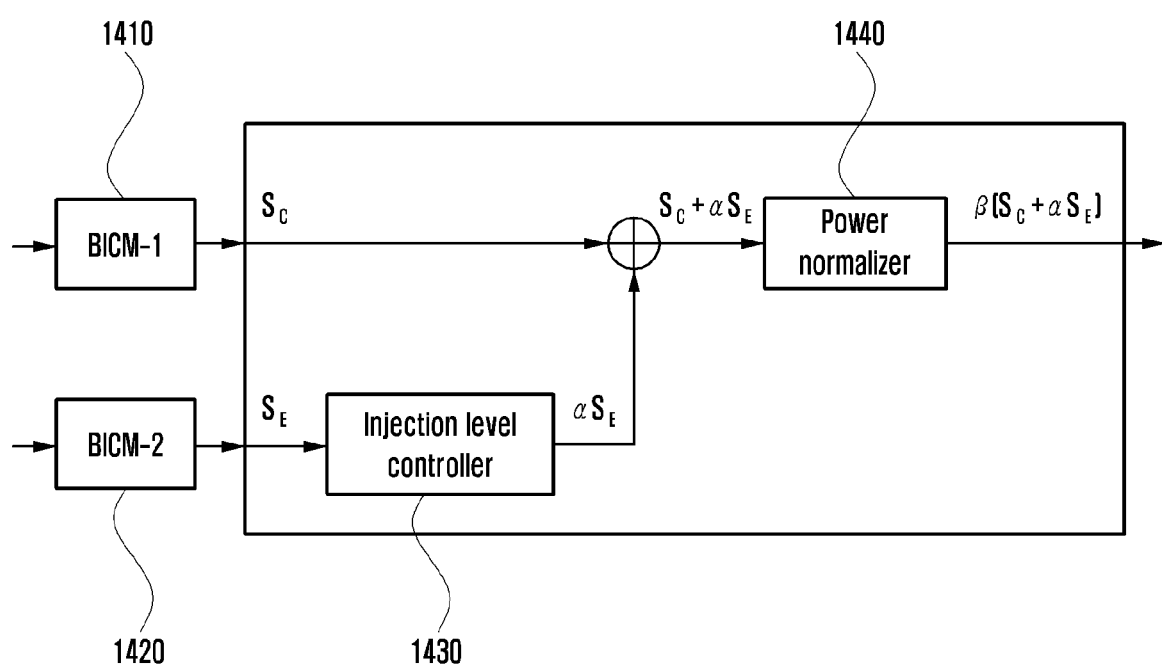
FIG. 14 illustrates an example of an SCM system according to certain embodiments of this disclosure.

FIG. 14 is an exemplary diagram of an SCM system according to certain embodiments of this disclosure.

Referring to the illustrative example of FIG. 14, appropriate channel coding, interleaving, and modulation on one data stream are applied through a BICM-1 block 1410. Appropriate channel coding, interleaving, and modulation on another data stream are applied through a BICM-2 block 1420. Here, BICM denotes bit-interleaved coded modulation. The two modulated signals having passed through the BICM block are assumed to be $S_C$ and $S_E$, respectively.

The signal strength of the $S_E$, which is one of the two modulated signals, may be adjusted through an injection level controller 1430. A signal, the strength of which is adjusted with respect to the $S_E$ signal, is assumed to be "$a*S_E$". The signals $S_C$ and $a*S_E$ are superimposed, such as "$S_C+a*S_E$", and transmitted (here, "a" is a real number greater than 0). According to cases, the strength of the superimposed signal may be normalized to a specific size, such as $b*(S_C+a*S_E)$ (here, b is a real number greater than 0), through a power normalizer 1440.

In the non-limiting case of FIG. 14, an example of controlling the injection level for the $S_E$ is illustrated, but the position of the injection level controller 1430 may be changed as long as the same effect can be achieved. In addition, the injection level controller 1430 may be omitted as long as the strength of the modulated signal that has passed through each BICM block is adjusted to an appropriate size in advance. Further, in a case where the injection level is appropriately applied to each modulated signal having passed through each BICM block, the power normalization block 1440 may be omitted. In addition, although only two data streams are illustrated in FIG. 14, it can be extended to two or more data streams.

The MIMO system illustrated with reference to the examples of FIGS. 13A and 13B and the SCM system illustrated in FIG. 14 are representative examples of a system having a hierarchical structure. A system having such a hierarchical structure can be represented by an encoding method having a generalized hierarchical structure as shown in FIG. 15 below.

Figure 15:
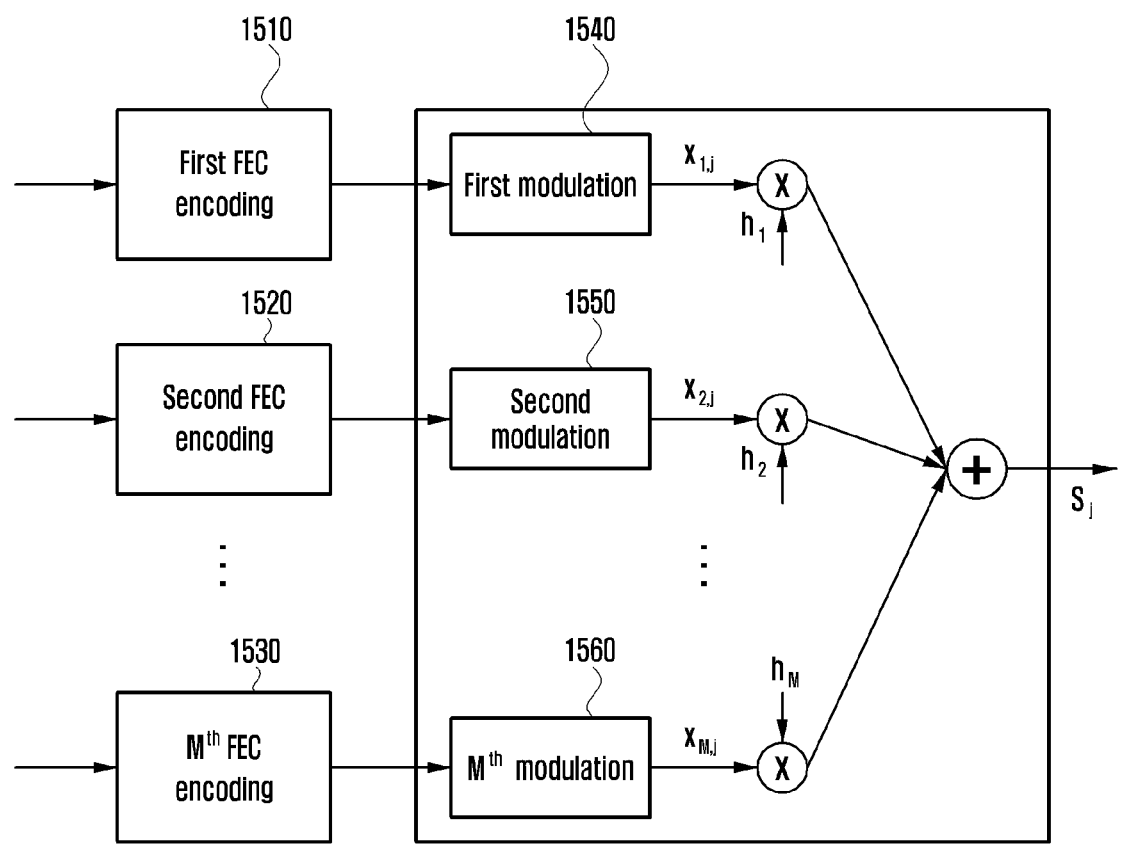
FIG. 15 illustrates an example of operations of a transmitter in a communication system having a hierarchical structure, according to certain embodiments of this disclosure.

FIG. 15 illustrates an example of operations of a transmitter in a communication system having a hierarchical structure, according to certain embodiments of this disclosure.

Referring to the non-limiting example of FIG. 15, a transmitter of a predetermined communication system or broadcast system according to certain embodiments of this disclosure is assumed to have M independent information layers. Information bits included in the k-th layer are subject to k-th encoding through a FEC encoder and then generated as k-th layer modulation symbol $x_{k,j}$ (j=1, 2, . . . ) through a modulator. Each modulation symbol $x_{k,j}$ may be transmitted directly to the receiver through a channel, or may be transmitted to the receiver through a channel after the size of the modulation symbol is adjusted for an arbitrary reason (for example, a part of the size of each modulation symbol may be adjusted for power normalization). Therefore, in FIG. 15, each $h_i$ may be a channel coefficient, may be a parameter for adjusting the signal size, or may be a value obtained by considering both of the same (that is, $h_i$ may be represented in the form of a product or sum of more detailed parameters). Similarly, $S_j$ may be an input to a channel or an output therefrom.

In the non-limiting example of FIG. 15, first FEC encoding 1510, second FEC encoding 1520, . . . , and M-th FEC encoding 1530 are represented by M FEC encoding blocks for convenience, but in actual implementation, encoding may be performed using one FEC encoder or may be performed using two or more FEC encoders. It is noted that FIG. 15 illustrates a conceptual structure of the hierarchical system. In addition, each FEC encoding may be subdivided into a form of concatenated codes, as in outer coding (not shown) and inner coding (not shown). Outer codes applied to outer coding (not shown) generally use algebraic codes, by which relatively simple error detection or correction is possible, such as a cyclic redundancy check (CRC) code, a Bose-Chaudhuri-Hocquenghem (BCH) code, or Reed-Solomon (RS) encoding, but the outer codes are not necessarily limited thereto, and the codes described above are applicable in a duplicated manner. Inner codes applied to inner coding (not shown) generally use a coding scheme having a relatively complex but excellent error correction capability, such as an LDPC code, a Turbo code, and a Polar code, but it is not necessarily limited thereto (for example, a tail-biting convolutional code or other algebraic codes may be used, and multiple codes are applicable in a duplicated manner).

In the non-limiting example of FIG. 15, first modulation 1540, second modulation 1550, . . . , M-th modulation 1560 are represented by M modulation blocks for convenience, but in actual implementation, modulation is performed using one modulator or may be performed using two or more modulators. It is noted that FIG. 15 shows the conceptual structure of the hierarchical system. Therefore, FEC encoding and modulation can be implemented in various ways in actual implementation.

Figure 16:
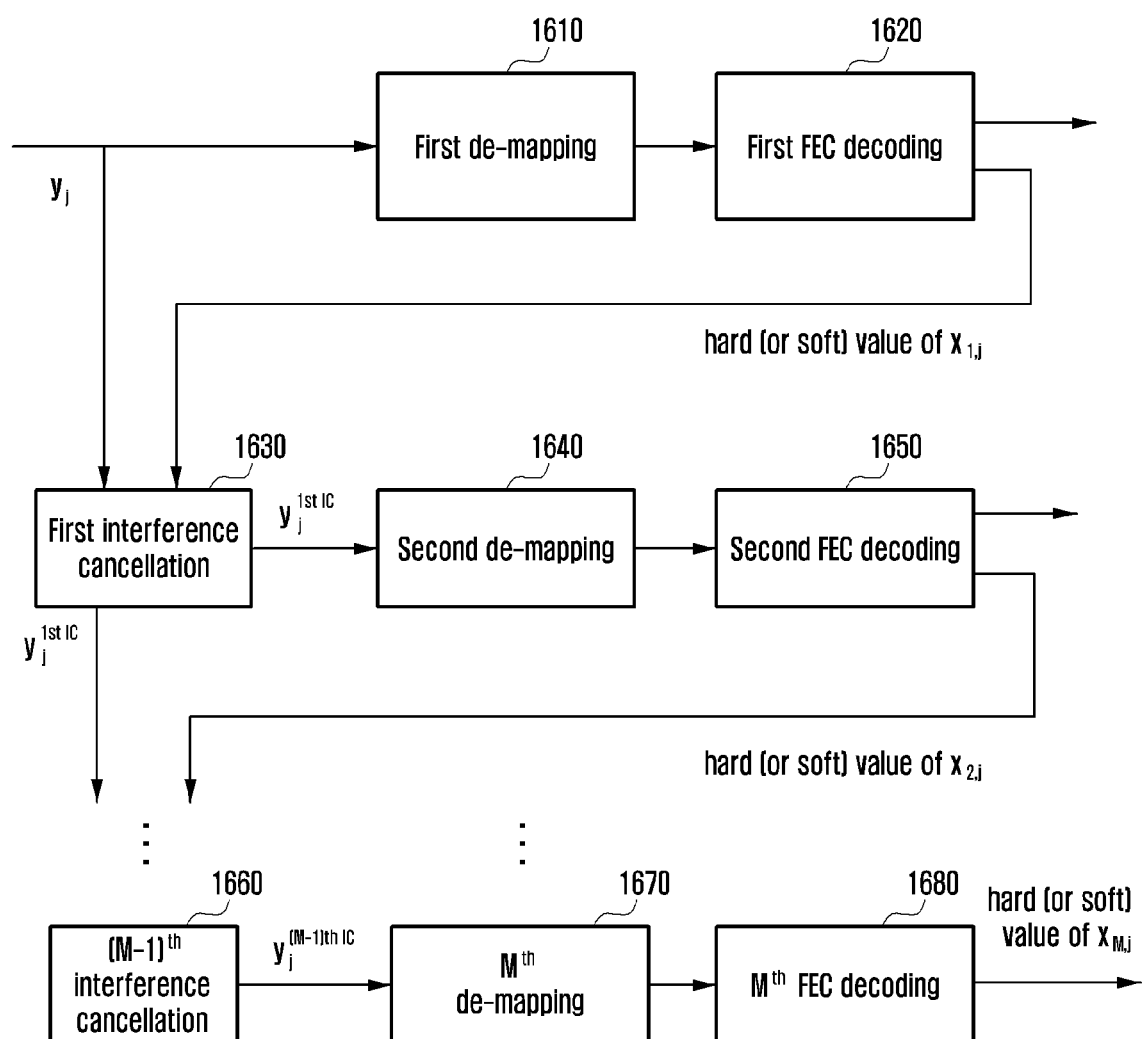
FIG. 16 illustrates an example of operations of a receiver in a communication system having a hierarchical structure, according to various embodiments of this disclosure.

FIG. 16 illustrates an example of a decoding scheme of a hierarchical structure corresponding to a communication system or a broadcasting system that can be expressed by an encoding method having a hierarchical structure as shown in FIG. 15.

Further FIG. 16 illustrates an example of an operation of a receiver in a communication system having a hierarchical structure, according to various embodiments of this disclosure.

Referring to the non-limiting example of FIG. 16, first, with respect to a signal $y=(y_1, y_2, \ldots, y_j, \ldots)$, transmitted from a transmitter and received by a receiver, the receiver generates or determines values (for example, LLR or LR values) required in order to perform first FEC decoding (indicated by reference numeral 1620) through first de-mapping (indicated by reference numeral 1610) corresponding to a first layer, and then proceeds the first FEC decoding 1620 based on the generated or determined values. If the first FEC decoding 1620 is completed, the receiver appropriately removes the interference from the received signal y, based on the result or output of the first FEC decoding. In FIG. 16, a first interference cancellation (indicated by reference numeral 1630) for the received signal is performed based on at least a part or all of the result or output obtained from the first FEC decoding. At this time, the FEC decoding result or output used for the first interference cancellation 1630 includes a hard-decision value, a soft-decision value, or a combination of the hard-decision value and the soft-decision value.

In FIG. 16, for convenience, the process of determining values (e.g., LLR, LR, etc.) required for FEC decoding is simply expressed as de-mapping, and, here, the de-mapping denotes a receiver operation corresponding to a process of performing mapping, by a transmission side, to signal constellation by performing modulation according to a modulation scheme (e.g., all of QPSK, a QAM scheme such as 16-, 64-, 256-, or 1024-QAM, or phase shift keying (PSK) or amplitude and PSK (APSK) schemes are possible). The de-mapping operation described above may be subdivided into several processes depending on the cases. For example, the de-mapping operation may be subdivided, after performing channel estimation, into a process of determining values (e.g., LLR, LR, etc.) required for FEC decoding, corresponding to codeword bits transmitted from a signal or symbol, demodulated based on the result of the channel estimation. In this case, each of the de-mapping blocks 1610, 1640, and 1670 may be subdivided into a channel measurement block, a symbol-to-LLR conversion block, and the like. Various subdivisions are possible depending on the structure of a system. In addition, in FIG. 16, for convenience, the de-mapped output values are used as inputs of the FEC decoding block, and appropriate interleaving/de-interleaving thereof may be applied according to a communication system. The interleaving/de-interleaving described above may be included in the FEC decoding block.

According to a conventional method for interference cancellation, an appropriate modulation symbol is regenerated based on the result of the FEC decoding of the i-th layer, and then a subtraction scheme is applied to a signal received from a channel or to a signal obtained by performing the (i−1)th interference cancellation, and thus expressions such as "subtract", "remove", and "cancel" may be used. According to certain embodiments according to this disclosure, eliminating the effects of a specific signal from a received signal is generally expressed as removing or as cancelling thereof, but may be expressed by subtracting thereof or may be replaced by other similar terms. In addition, in various embodiments according to this disclosure, in the case of proceeding decoding of a signal of a specific layer, an expression of interference cancellation or removal is used since signals of other layers except the specific layer signal appear to be interference with respect to the specific layer signal. However, in addition to interference cancellation, other terms having similar meanings thereto can be used with respect to operations of subtracting, removing, excluding, or canceling signal components of other layers except for the specific layer, such as injected signal cancellation or removal. In addition, for convenience, although one interference cancellation operation for removing interference according to a sequence of a specific layer is shown in FIG. 16, it is noted that interference can be removed according to each of a plurality of layers or according to sequences of different layers. For example, in a case where interference cancellation is performed on a signal of a second layer using a signal of a first layer, interference cancellation may be performed on the signal of the first layer using the signal of the second layer. In this case, there is an effect of reducing a delay time due to interference cancellation.

With respect to a corrected received signal (i.e., an output obtained after performing the first interference cancellation) $y^{1st\ IC}=(y_1^{1st\ IC}, \ldots, y_j^{1st\ IC}, \ldots)$ obtained through the first interference cancellation 1630, the receiver generates or determines values (for example, LLR or LR values, etc.) required for second FEC decoding (indicated by reference numeral 1650) after performing second de-mapping (indicated by reference numeral 1640), and then proceeds the second FEC decoding 1650 based on the generated or determined values. In a case where the second FEC decoding 1650 is completed, the result or output thereof is appropriately removed from the received signal y or the corrected received signal $y^{1stIC}$.

In FIG. 16, the receiver performs second interference cancellation (not shown) from the received signal or the corrected received signal based on at least a part or all of the result of the second FEC decoding. At this time, the result or output of the FEC decoding, used for the second interference cancellation, may use a hard-decision value, a soft-decision value, or a combination of the hard-decision value and the soft-decision value. If the interference cancellation process and the FEC decoding process are completed up to the last layer, all pieces of data decoded for each layer can be reconstructed. As described above, since the interference cancellation process is sequentially performed for each layer, the method described above is commonly referred to as successive interference cancellation or an SIC scheme. However, as described above, interference cancellation does not need to be sequentially performed according to layers. The interference cancellation may be simultaneously performed for different layers, or interference cancellation for other layers may be performed at least before interference cancellation for a specific layer is completed. In this case, interference cancellation may also be referred to as successive interference cancellation in a broad sense, but may generally be expressed simply as interference cancellation, partially parallel interference cancellation, or parallel (or simultaneous) interference cancellation.

In the non-limiting example of FIG. 16, for convenience, de-mapping, FEC decoding, and interference cancellation blocks are shown for each layer, but in a real system, multiple layers may share and use the de-mapping, the FEC decoding, and the interference cancellation blocks using a single de-mapper, a single FEC decoder, or a single interference canceller. It goes without saying that the de-mapping, FEC decoding, and interference cancellation blocks may be shared and used for each layer or by multiple layers, using two or more de-mappers, two or more FEC decoders, or two or more interference cancellers.

In certain embodiments, each FEC decoder may be subdivided into a form of concatenated codes, as in inner decoding (not shown) and outer decoding (not shown). In the case of an inner code applied to inner decoding (not shown), a coding method having a relatively complex but excellent error correction capability such as LDPC code, Turbo code, and Polar code is used, but is not necessarily limited thereto (for example, tail-biting convolutional code or other algebraic codes may be used). In the case of outer codes applied to outer decoding (not shown), cyclic redundancy check (CRC) code, Bose-Chaudhuri-Hocquenghem (BCH) code, and algebraic codes capable of relatively simple error detection or correction, such as Reed-Solomon (RS) encoding, are widely used, but are not limited thereto.

Methods of using a result obtained by performing hard-decision of a part of the output or the result obtained from the FEC decoder in order to remove interference according to various embodiments of this disclosure include a method for re-encoding (not shown) a part of the parity bits based on the decoded information bits and using the generated parity bit for interference cancellation. The re-encoding process may be performed together in the FEC decoder, or may be performed in a separate processor or module after the FEC decoder operation is terminated. There are various methods for generating at least a part or all of the parities through re-decoding based on the decoded information bits. In addition, in a case where an outer code is applied, there are various methods for generating parities based on an error detection result of the outer code or various methods using the generated parities. This will be explained in detail later.

According to certain embodiments of this disclosure, a method for processing an error detected because errors generated from a channel in the FEC decoding process in FIG. 16 are not completely corrected has been described.

First, if an error is detected during the FEC decoding process of a specific layer, there is a high possibility that the information bits or code blocks for performing the corresponding FEC decoding include errors, and thus the receiver may discard the corresponding information bits or code blocks without using the same. Here, in the case of performing MIMO detection and decoding through IC or SIC scheme as shown in FIG. 16, decoding of a layer, in which the error is detected, as well as subsequent layers is omitted, and code blocks or information corresponding to the corresponding layers can be discarded by the receiver.

According to certain embodiments of this disclosure, interference cancellation and FEC decoding may be successively performed based on the result obtained by decoding the layer in which the error is detected. Here, if an error is successively detected in the subsequent layers, further interference cancellation and decoding may not be performed, but there may be a method for successively performing interference cancellation and FEC decoding, even if an error is detected, and then reusing the result obtained therefrom in MIMO detection (the method is referred to as iterative detection).

According to certain embodiments of this disclosure, if an error is not detected up to the i-th layer but is detected in the (i+1)-th layer, a method for holding de-mapping and FEC decoding of the (i+1)-th layer, selecting one layer from the (i+2)-th layer to the M-th layer, and performing interference cancellation, de-mapping, and FEC decoding thereof, based on the result of the FEC decoding, by the i-th layer, is provided. The operation for the (i+1)-th layer in which interference cancellation, de-mapping, and FEC decoding are being held may be performed again at an appropriate time thereafter. As described above, in a case where an error is detected in a specific layer during the IC or SIC process, a sequence of layers to which the IC or SIC is applied may be changed and the IC or SIC process may be applied thereto again.

So far, non-limiting examples of operations of MIMO detection and the FEC encoding and decoding processes have been described. Next, as shown in the illustrative example of FIG. 16, a method for efficiently performing interference cancellation in decoding of a system having a hierarchical structure to which a specific channel coding technique is applied is proposed.

Figure 17A:
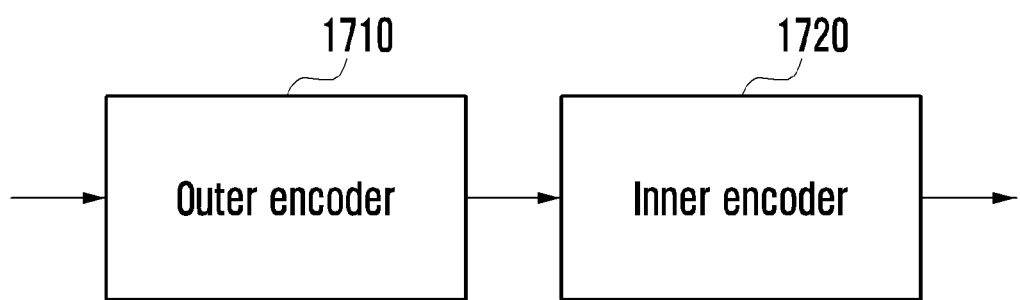
FIG. 17A illustrates an example of a case in which outer coding and inner coding are applied for FEC encoding and decoding, according to certain embodiments of this disclosure.
Figure 17B:
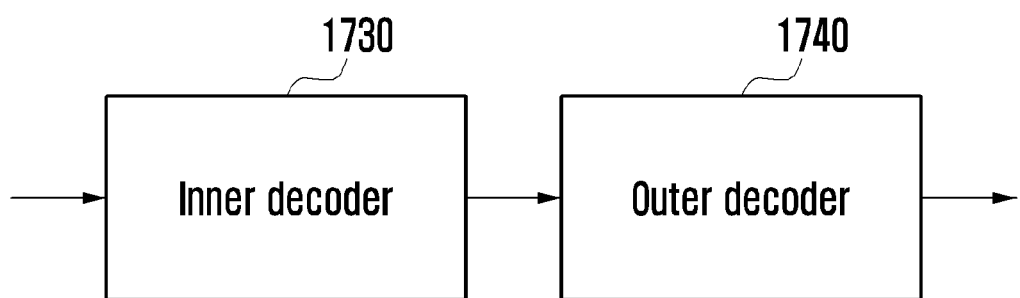
FIG. 17B illustrates an example of a case in which outer coding and inner coding are applied for FEC encoding and decoding, according to some embodiments of this disclosure.

According to certain embodiments, first, the FEC encoding method in a communication system or broadcasting system having a hierarchical structure similar to that of FIG. 15 is assumed to apply a coding scheme of concatenated codes, as in an outer encoder 1710 and an inner encoder 1720, as shown in the illustrative example of FIG. 17A. Various channel codes described above may be employed as the channel codes for each of the outer encoder and the inner encoder, but in the disclosure, for convenience, the inner code uses an LDPC code and the outer code uses a CRC code. However, the embodiments are not limited thereto. In the case of applying the encoding scheme as shown in FIG. 17A, the corresponding decoding scheme may be applied as shown in FIG. 17B. According to the definitions of the outer code and the inner code, the transmitter performs inner coding after performing outer coding, and the receiver performs inner decoding through the inner decoder 1730 and then performs outer decoding through the outer decoder 1740.

Figure 18:
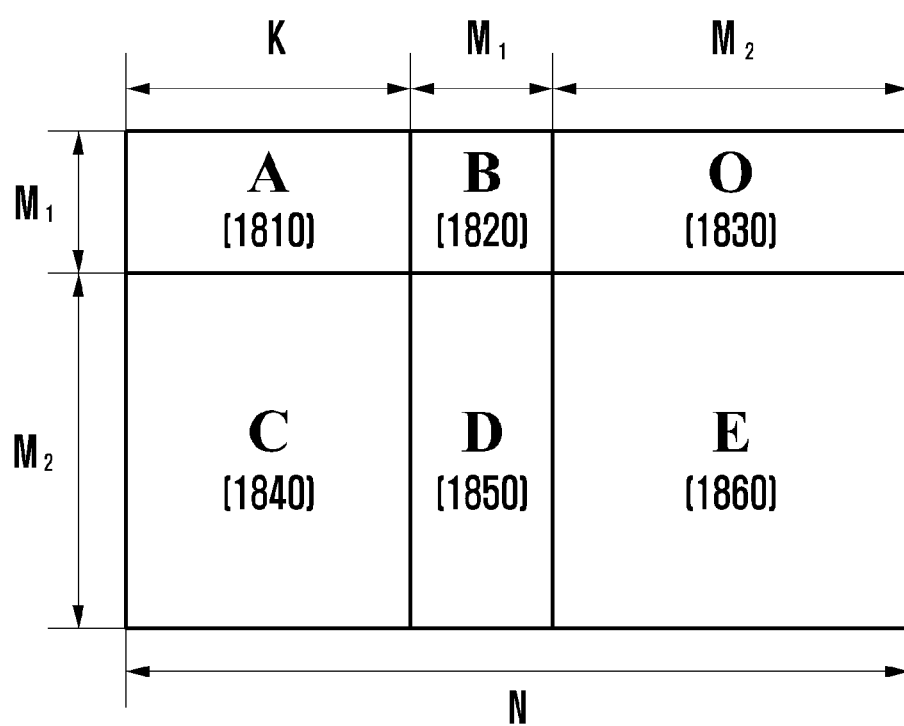
FIG. 18 illustrates an example of a structure of a parity check matrix of an LDPC code, according to certain embodiments of this disclosure.

FIG. 18 illustrates an example of a structure of a parity check matrix of an LDPC code, which is an inner code applied to the FEC encoder and FEC decoder to be described in the disclosure, according to certain embodiments.

In the parity check matrix shown in the example of FIG. 18, the number of columns is N and the number of rows is ($M_1+M_2$). In general, in a case where the parity check matrix includes a full rank, the number of columns corresponding to information bits in the parity check matrix is equal to the number obtained by subtracting the total number of rows from the total number of columns. That is, if the parity check matrix of FIG. 18 includes a full rank ($M_1+M_2$), the number K of information bits is obtained from equation of $N-(M_1+M_2)$. In the disclosure, for convenience, only the case where the parity check matrix of FIG. 18 includes a full rank is described, but is not limited thereto.

First, the parity check matrix of FIG. 18 is divided into a first part of a parity check matrix, including sub-matrices A 1810 and B 1820, and a second part of the parity check matrix, including sub-matrices C 1840, D 1850, and E 1860. A sub-matrix O 1830 denotes a zero matrix having a size of ($M_1 \times M_2$). Since the sub-matrix O 1830 is the zero matrix having the size of ($M_1 \times M_2$), even if the sub-matrix O is included in the first part of the parity check matrix, the operation of the matrix is not affected thereby. For this reason, in the disclosure, for convenience, the sub-matrix O 1830 defines, as the first part of the parity check matrix, a matrix, which is configured by the sub-matrices A 1810 and B 1820 excluding the zero matrix having the size of ($M_1 \times M_2$). However, if necessary, the sub-matrix O 1830 may include the zero matrix having the size of ($M_1 \times M_2$).

For convenience, the example of a parity check matrix of FIG. 18 is called H, information bits (or information bit vectors) corresponding to the sub-matrix A 1810 or the sub-matrix C 1840 are called i=($i_0$, $i_1$, . . . , $i_{K-1}$), the first parity bits (or first parity bit vector) corresponding to the sub-matrix B 1820 or the sub-matrix D 1850 are called $p_1=(p_{1,0}, p_{1,1}, \ldots, p_{1,M_1-1})$, and the second parity bits (or second parity bit vectors) corresponding to the sub-matrix E 1860 are called $p_2=(p_{2,0}, p_{2,1}, \ldots, p_{2,M_2-1})$, [Equation 20] can be obtained from [Equation 1], as follows.

$$H \cdot c^T = H \cdot \begin{bmatrix} i^T \\ p_1^T \\ p_2^T \end{bmatrix} = \begin{bmatrix} A & B & O \\ C & D & E \end{bmatrix} \cdot \begin{bmatrix} i^T \\ p_1^T \\ p_2^T \end{bmatrix} = \quad \text{[Equation 20]}$$

$$\begin{cases} A \cdot i^T + B \cdot p_1^T = 0 \\ C \cdot i^T + D \cdot p_1^T + E \cdot p_2^T = 0 \end{cases}$$

Referring to [Equation 20] above, it can be seen that the first parity vector $p_1$ can be obtained (or calculated or determined) based on the information bit vector i and the first part of the parity check matrix. In addition, it can be seen that the parity vector is obtained and then a parity vector $p_2$ can be obtained (or calculated or determined) based on the information bit vector i, the parity vector $p_1$, and the second part of the parity check matrix.

In the disclosure, the following structural features are limited to the parity check matrix corresponding to FIG. 18.

Feature 1-1: In a case where the parity check matrix of FIG. 18 is defined as a quasi-cyclic parity check matrix, all of the column weights (i.e., column degrees) of the sub-matrix B 1820 of FIG. 18 are 2 or more, not all column weights or all row weights are even numbers (that is, one or more column or row degrees in the base matrix or parity check matrix may be odd numbers).

Feature 1-2: In a case where the parity check matrix of FIG. 18 is not defined as a quasi-cyclic parity check matrix, the sub-matrix B 1820 of FIG. 18 has a lower triangular matrix structure, and all of the diagonal entries or elements of the sub-matrix B 1820 may have a value of 1. Accordingly, at least one column having column weight or degree of 1 may exist in the sub-matrix B 1820. In addition, not all column weights or all row weights are even numbers (that is, the weights or degrees of one or more columns or rows in the parity check matrix may be odd numbers).

Feature 2: In a case where the parity check matrix of FIG. 18 is defined as a quasi-cyclic parity check matrix, at least one column block in the sub-matrix B 1820 in feature 1-1 has a column weight or degree of 3 or more.

Feature 3: The sub-matrix E of FIG. 18 has the column weight and the row weight of 1. Accordingly, the sub-matrix E 1860 may be an identity matrix or may be converted (or transformed) into the identity matrix by applying an appropriate column permutation or row permutation thereto (that is, the sub-matrix E 1860 is an identity matrix or has a feature equivalent thereto). If the parity check matrix of FIG. 18 is defined as a quasi-cyclic parity check matrix, the sub-matrix E may be divided into multiple identity matrices.

Figure 19A:
FIG. 19A illustrates an example of a parity check matrix for an LDPC code according to certain embodiments of this disclosure.

FIGS. 19A and 19B illustrate examples of parity check matrices according to various embodiments of this disclosure, which satisfy the features 1-1, 2, and 3 described above. FIG. 19A illustrates a non-limiting example in the case where K=22*Z, $M_1$=4*Z, and $M_2$=2*Z in FIG. 18, and FIG. 19B illustrates a non-limiting example in the case where K=10*Z, $M_1$=4*Z, and $M_2$=7*Z in FIG. 18. Here, Z denotes the block size defined in [Equation 9] to [Equation 14], and corresponds to the size of the cyclic permutation matrices, since the parity check matrices of FIGS. 19A and 19B represent exponent matrices of the quasi-cyclic parity check matrix, in the case of being expressed as an exponent matrix such as [Equation 4] based on the cyclic permutation matrices of [Equation 2]. Referring to the non-limiting example of FIG. 18, a sub-matrix configured by M2 columns having a column degree of 1 and corresponding to the sub-matrix E 1860 can be regarded as a single parity-check code, and can be easily extended. That is, the parts corresponding to the sub-matrix C 1840, the sub-matrix D 1850, and the sub-matrix E 1860 of FIG. 18 are configurable as a form of extending the parity check matrix of a single parity check code, and since $N=K+M_1+M_2$, it is noted that as $M_2$ increases, the codeword length N also increases.

Since the code rate of the LDPC code corresponding to the parity check matrix of FIGS. 18, 19A, and 19B is K/N, it is noted that a lower code rate of codeword can be generated as $M_2$ becomes lower. In other words, LDPC encoding and decoding may be performed based on a parity check matrix capable of supporting a lower code rate by further extending columns having a degree of 1 while including FIGS. 19A and 19B.

If the values of [Equation 11] are used as a lifting size for LDPC encoding or decoding with respect to a parity check matrix of a quasi-cyclic LDPC code, at least two columns may configure one column block of the parity check matrix; if the values of [Equation 12] are used as the lifting size for LDPC encoding or decoding, at least eight columns may configure one column block of the parity check matrix; and if the values of [Table 2] are used as the lifting size for LDPC encoding or decoding, at least seven columns may configure one column block of the parity check matrix. Accordingly, in a communication system to which the lifting size of [Table 2] is substantially applied to the parity check matrix of the LDPC code having the structures as illustrated with reference to the examples of FIGS. 18, 19A, and 19B satisfying the features 1-1, 2, and 3, at least seven columns having a degree of 3 may exist.

Figure 20:
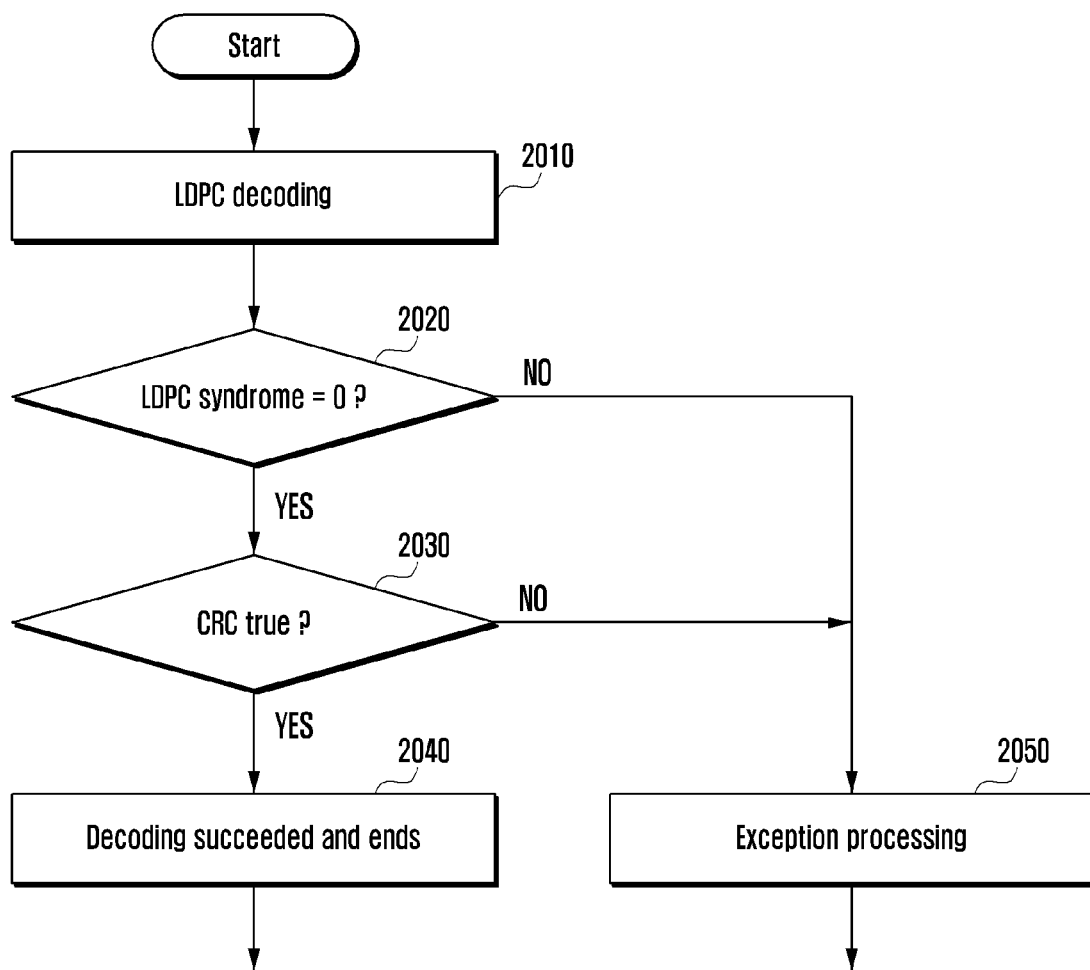
FIG. 20 illustrates an example of aa decoding process based on LDPC and CRC codes, according to various embodiments of this disclosure.

FIG. 20 illustrates an example of an FEC decoding operation in the case where a CRC code is applied as an outer code and an LDPC code is applied as an inner code, according to certain embodiments of this disclosure.

Specifically, FIG. 20 illustrates, in flowchart format, an example of a decoding process based on LDPC and CRC codes, according to some embodiments of this disclosure.

A receiver in general performs LDPC decoding in operation 2010 and then checks an LDPC syndrome and decides whether any error is detected in operation 2020. Where a codeword that can be obtained through hard decision after performing the LDPC decoding is given as ĉ and a parity check matrix used in the decoding is given as H, the LDPC syndrome has a value determined by [Equation 21].

$$s = H \cdot \hat{c}^T \qquad \text{[Equation 21]}$$

If a codeword transmitted by an actual transmitter is given as c, $H \cdot c^T = 0$ is established by [Equation 1]. In case that the decoding was successfully performed, the syndrome s of [Equation 21] should also have a value of zero (0) (In a case where the value of an LDPC syndrome is zero, it can be said that the LDPC syndrome value has been identified and has passed). However, in a case that the value of the LDPC syndrome is not zero (or if the value of the LDPC syndrome fails to pass), the case means c≠ĉ.

Where the value of LDPC syndrome s is not zero in operation 2020 of FIG. 20, the receiver may directly execute an exception processing (or handling) in operation 2050, to thereby determine whether or not to use LDPC-decoded information bits or code block at an upper layer of the system, or whether to discard the information bit or code block.

However, even where the value of LDPC syndrome s is not zero in operation 2020, the receiver may not directly execute the exception processing in operation 2050 and may execute CRC detection (or checking) for the information bits in operation 2030. This is because according to the result of the LDPC decoding in operation 2010, it is likely that after the LDPC decoding, an error remains only in the parity bits, and no error is present in the information bits, despite of failure in decoding of the codeword. Accordingly, in some embodiments, at operation 2030, CRC detection is executed so as to determine whether any error for the information bits was detected.

Where it is determined that the information bit vector was successfully decoded, through the CRC detection in operation 2030, the decoding process ends. As a result of the CRC detection in operation 2030, where it is determined that an error is included in the information bit vector, the receiver may execute an exception processing for decoded information bit vector or code block in operation 2050 so as to determine whether or not to use the concerned information vector or code block at an upper layer of the system or whether to discard the information vector or code block.

It should be noted that in the disclosure, "exception processing" encompasses operations performed where it is determined that the decoding fails or the decoding may be likely to fail, excepting the operations to be performed where the decoding is successfully progressed on all the processes.

In addition, the receiver may generate an instruction or flag, etc. about success or failure of the decoding and deliver the instruction or flag to the upper layer. In the upper layer, a method to process the information bit or code block whose decoding was completed may be determined, based on the instruction or flag, etc. (e.g., to determine a request for retransmission, etc.).

For reference, even though c≠ĉ in [Equation 21], the LDPC syndrome can be zero, in a case that the decoded codeword is another codeword different from the codeword c. As it is impossible to detect this error (undetected error) by means of the LDPC code, this undetected error may be detected by performing the CRC detection after the LDPC decoding.

In addition, the syndrome value s may be obtained (or computed or determined) through a computation process based on the parity check matrix and the decoded codeword as in [Equation 21], or it may be easily obtained according to an LDPC decoder in implementation thereof. For example, in [Equation 15], decoding may be executed according to a magnitude and a sign of a message used in a decoding process for the LDPC decoding. At this time, the syndrome value s may be obtained (or computed or determined) through operations of the plus (+) or minus (−) signs. For example, in implementation of an actual decoder, a syndrome value may be easily obtained based on a proper XOR operation by matching the plus (+) sign with zero and the minus (−) sign with one, as binary numerals. In particular, it is possible to easily identify whether the syndrome value is zero or not, from the features implemented in the LDPC iterative decoding process. For reference, the hard decision of the LDPC decoded codeword may also be easily determined based on the signs of the messages by each bit of which the LDPC decoding was performed.

According to certain embodiments of this disclosure, operations where decoding having a hierarchical structure, such as shown with reference to FIG. 16 is performed in the communication system based on a parity check matrix (e.g., FIGS. 19A and 19B) having the structure of FIG. 18 will be described below.

Generally, as an LDPC code is defined based on a parity check matrix, the LDPC code may be deemed as a kind of algebraic codes. However, as a probabilistic decoding method is generally applied, the error-probability for each bit of a codeword is somewhat influenced by the degree of the each bit. Where the probabilistic decoding method is applied, the parity bits whose degrees are usually low are likely to be vulnerable to errors, and thus, the parity bits whose degrees are relatively low may be usually vulnerable to decoding errors. In particular, the parity bits whose degrees are one are the most vulnerable and may become more vulnerable to errors in occurrence of failure in channel measurement.

In certain embodiments of a communication system, parity bits are usually discarded regardless of any errors, and as the information bits are only transmitted to and utilized by the upper layer, any error of the parity bits does not have a great influence upon the operation of the system. However, in case where decoding is performed by using the same hierarchical structure as shown in FIG. 16, the decoded parities may also influence the decoding performance of any other layer(s) due to inference cancellation. In this regard, re-encoding based on the decoded information bits for parities has been a general technique. In the disclosure, a method for efficient re-encoding and a method for performance improvement in applying LDPC encoding and decoding based on a parity check matrix having a structure of FIG. 18 are suggested.

As described above, an LDPC code has an error probability for each bit which varies depending upon the degree of each bit. In particular, the LDPC code features that where the degree of a bit is two or higher, a BER (bit error rate or bit error ratio) is rapidly reduced compared to a BER where the degree of a bit is one. Where the information bits are successfully decoded, nearly no errors also occur in the codeword bits whose degrees are two or higher (in particular, parity bits), but the codeword bits whose degrees are one may include a number of bit errors even where the information bits are successfully decoded. For this reason, in the communication system to which LDPC encoding and decoding based on the parity check matrix of FIG. 18 has been applied, a part of the syndrome values corresponding to a second part of a parity check matrix consisting of submatrices C(1840), D(1850), and E(1860) may not have the value of zero with very high probability, regardless of generation of any error in the information bits. That is, as in [Equation 22], where syndrome values determined in a first part (in which submatrix O(1830) may be included) of the parity check matrix of FIG. 19 consisting of submatrices A(1810) and B(1820) and those determined in the second part of the parity check matrix consisting of submatrices C(1840), D(1850), and E(1860) are referred to as the first part $s_1$ of LDPC syndrome and the second part $s_2$ of LDPC syndrome, $s_2$ is a non-zero vector with a very high probability, regardless of the decoding result. (In [Equation 22], $\hat{i}^T$, $\hat{p}_1^T$, and $\hat{p}_2^T$ mean resulting bit-vectors by the hard decision on the results of LDPC decoding of an information bit vector, a first parity vector, and a second parity vector, respectively).

$$s = \begin{bmatrix} s_1 \\ s_2 \end{bmatrix} = \begin{bmatrix} A & B & O \\ C & D & E \end{bmatrix} \cdot \hat{c}^T = \begin{cases} A \cdot \hat{i}^T + B \cdot \hat{p}_1^T \\ C \cdot \hat{i}^T + D \cdot \hat{p}_1^T + E \cdot \hat{p}_2^T \end{cases}$$ [Equation 22]

In order to determine success or failure of the LDPC decoding, the LDPC syndrome may be entirely used. However, like the first part $s_1$ of the LDPC syndrome, in the parity check matrix, success or failure of the decoding may also be determined based on the syndrome or at least part thereof based on a submatrix [A(1810) B(1820)] including columns whose degrees are two or higher and rows independent of the parity bits whose degree is one (Also in case where the first part of the parity check matrix includes 0-matrix, like the submatrix O(1830), actual syndrome values are determined based on submatrices A(1810) and B(1820) consisting of columns whose degrees are two or higher).

Figure 21:
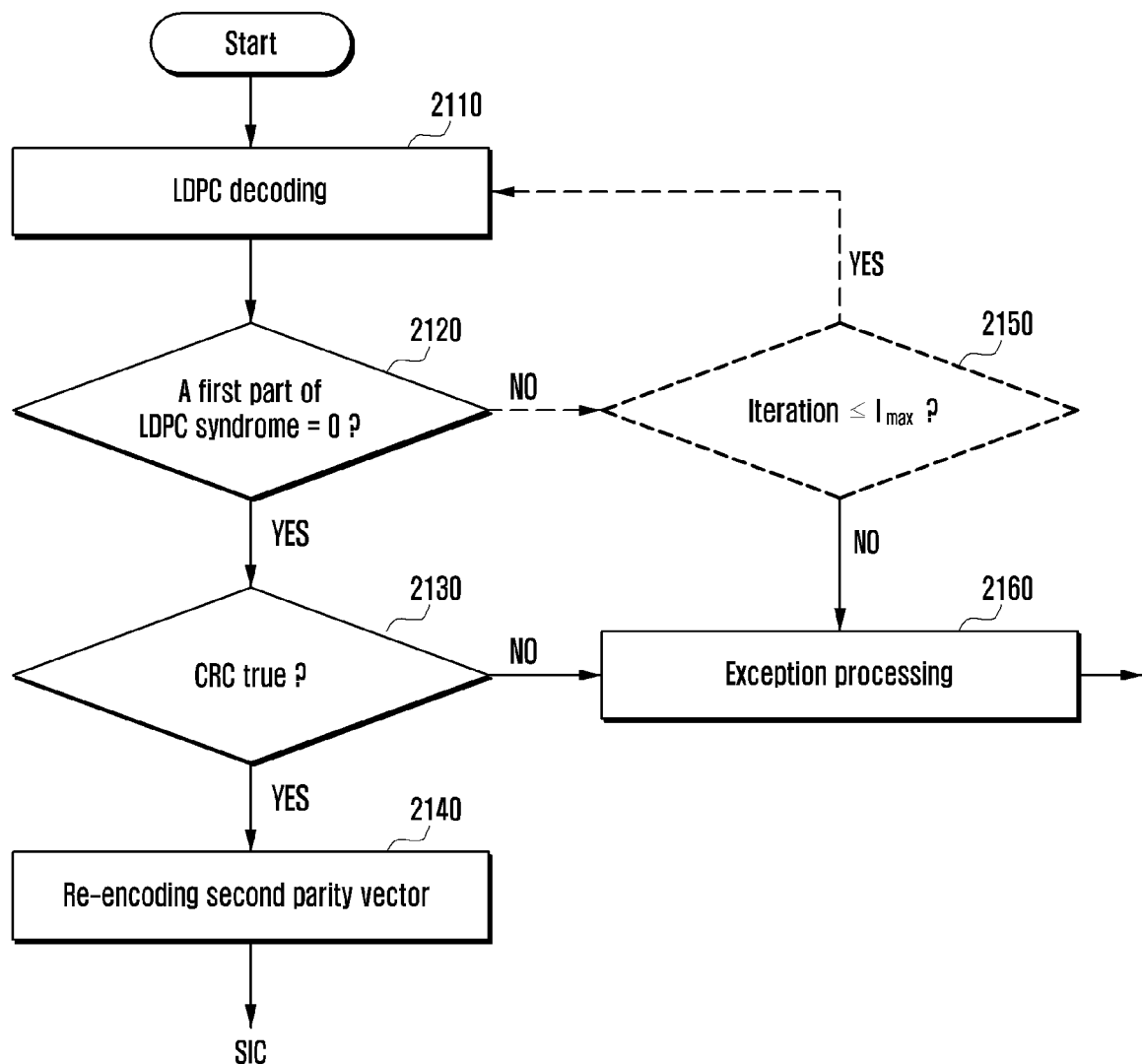
FIG. 21 illustrates an example of a process of encoding a part of parity in a decoding process based on LDPC and CRC codes, according to some embodiments of this disclosure.

An embodiment for a case to determine success or failure of the decoding based on the first part $s_1$ of the syndrome and a case to apply IC or SIC in the hierarchical structure system is illustrated in FIG. 21.

FIG. 21 illustrates an example of partially re-encoding a parity in the decoding process based on LDPC and CRC codes according to certain embodiments of this disclosure.

Referring to the non-limiting example of FIG. 21, a receiver first performs LDPC decoding in operation (2110) and determines whether the LDPC syndrome becomes zero in operation (2120). It should be noted that not the entire part of the LDPC syndrome but the first part $s_1$ thereof is only used. That is, the receiver may determine whether the first part of the syndrome is zero or not.

If it is determined that the value of the first part $s_1$ of the syndrome is zero (that is, the LDPC decoding is successful), based on the result, the receiver executes CRC detection (or checking) in operation 2130. If it is determined that no error occurred even in the CRC detection, it may be determined that the information bit or code block was finally successful in the decoding, and therefore, the receiver re-encodes the parity bits with degree one, or at least partly re-encodes the parity bits with degree one (that is, the second parity bit vector or at least part thereof) in operation 2140. As a consequence, after applying IC or SIC for the received signal based on the information bits and the first parity bits, obtained through the LDPC decoding, and the re-encoded second parity bits or at least part thereof, it is utilized in FEC decoding of the next layer.

According to some embodiments, where it is determined in operation 2120 of FIG. 21 that the value of the first part $s_1$ of the syndrome is not zero, the re-encoding may be implemented with various operations thereafter.

For example, if the first part $s_1$ of the syndrome does not have a value of zero, the receiver first determines in operation 2150 whether the LDPC decoding was performed as many as the threshold $I_{max}$ which is the iterative decoding number set in the system. Then, if the value of the first part $s_1$ of the syndrome is still not zero even though the LDPC decoding was performed as many as the maximum iterative decoding number, the receiver may assume failure of the decoding and perform an appropriate exception processing in operation 2160. In the communication system, it may be possible to identify or compute the LDPC syndrome values whenever the LDPC iterative decoding is executed, but it is also possible to identify or compute the LDPC syndrome values after having executed the LDPC iterative decoding as many as the maximum iterative decoding number. In this case, operation 2150 may be omitted in FIG. 21. Operation 2150 may be utilized as part of the LDPC decoding process in operation (2110).

In the non-limiting example of FIG. 21, it is illustrated that CRC detection (or checking) is executed in operation 2130 only where the first part $s_1$ of the syndrome has the value of zero. However, depending upon communication systems, as decoding of the information bits was successful but any error might occur in part of the first parity bits, the CRC detection may be executed even where the first part Si of the syndrome does not have a value of zero.

Figure 22:
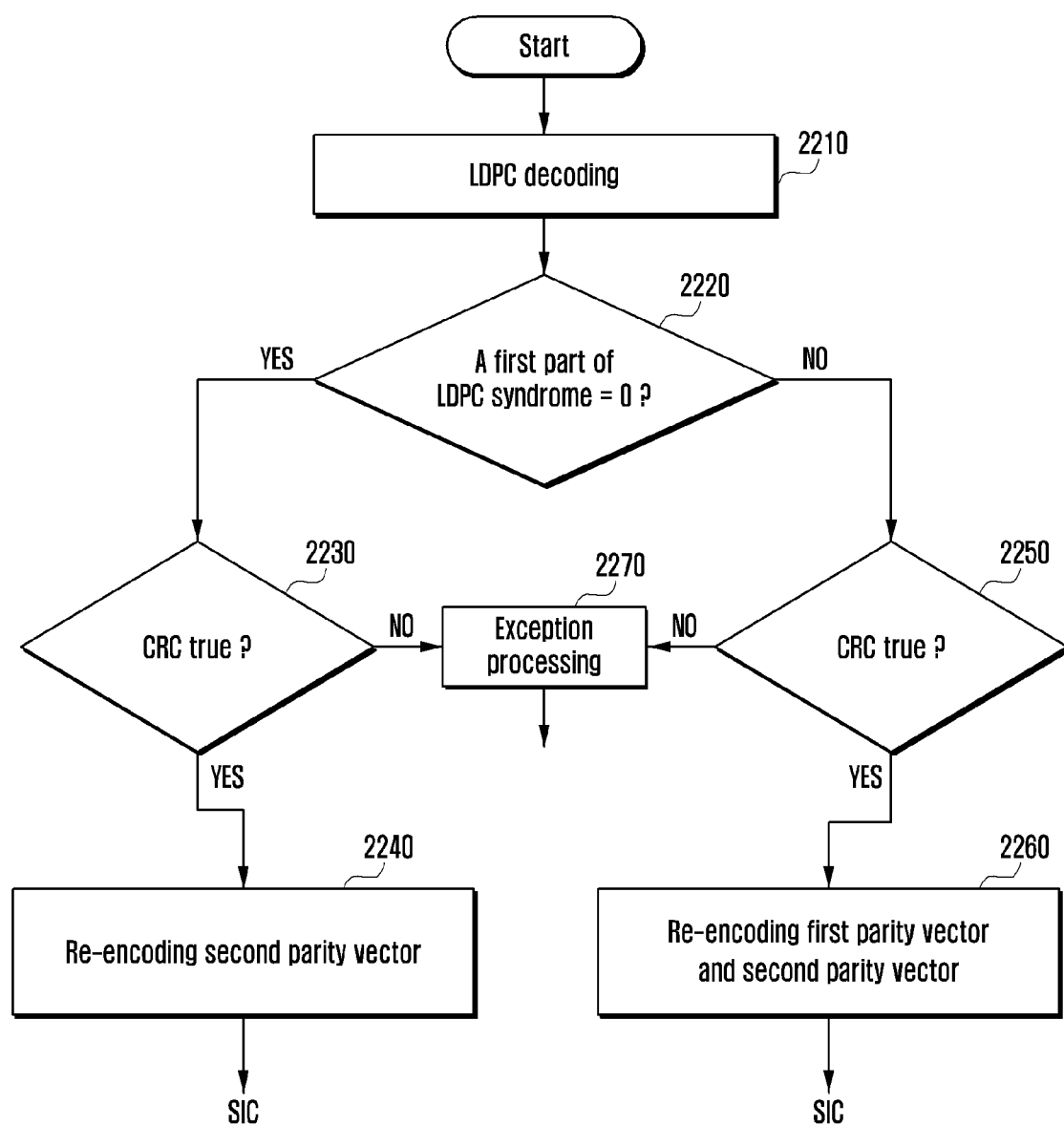
FIG. 22 illustrates an example of a process of encoding a part of parity in a decoding process based on LDPC and CRC codes, according to certain embodiments of this disclosure.

FIG. 22 illustrates an example of partially re-encoding the parity in the decoding process based on LDPC and CRC codes, according to certain embodiments of this disclosure.

Referring to the non-limiting example of FIG. 22, if it is determined in operation 2220 that the value of the first part $s_1$ of the syndrome is zero, the same operations as in FIG. 21 after this process may be performed.

In some embodiments, at operation 2220, where it is determined that the first part $s_1$ of the syndrome does not have a value of zero, the receiver may execute CRC detection in operation 2250. Where it is determined through the CRC detection that no error actually occurred in the information bits (that is, where no error occurred in the CRC detection), the receiver may re-encode the second parity bits or at least part thereof, and also the first parity bits or at least part thereof in operation 2260. An exception processing may be executed in operation 2270 where it is determined that the CRC detection fails in operation 2250.

In FIG. 18 and [Equation 20], the first parity vector and the second parity vector may be punctured by applying rate matching thereto according to the resources allocated for data transmission as shown in FIGS. 4 and 5. FIGS. 21 and 22 have been described above in connection with a case where the second parity bits or at least part thereof are transmitted from the transmitter. However, if the re-encoding is supported by the transmitter with a very high code rate, by means of the rate matching, the second parity bits may be entirely punctured or the first parity bits may also be partially punctured. Where the first parity bits are also be partially punctured, the second parity vector may not be re-encoded in operation 2140 of FIG. 21, and puncturing may be applied to a part of the first parity vector reconstructed through LDPC decoding (not shown) so as to allow the first parity vector to actually coincide with the length of the first parity vector transmitted from the transmitter. Similarly, where the first parity bits are also partially punctured, the second parity vector may not be re-encoded in operation 2240 of FIG. 22, and puncturing may be applied to a part of the first parity vector reconstructed through LDPC decoding (not shown) so as to allow the first parity vector to actually coincide with the length of the first parity vector transmitted from the transmitter. A case where it is determined in operation 2220 that the first part $s_1$ of the syndrome does not have all-zero value and has passed CRC detection in operation 2250 may mean that no error is present in the information bits but an error may be present in the LDPC parity bits. Accordingly, in operation 2260, the second parity vector may not be re-encoded and at least part of the first parity vector may be re-encoded (not shown) so as to allow the first parity vector to actually coincide with the length of the first parity vector transmitted from the transmitter. Puncturing (not shown) may be applied, so as to allow the first parity vector to actually coincide with the length of the first parity vector transmitted from the transmitter, after re-encoding the entire first parity vector in operation 2260.

As described above, the re-encoding methods may vary depending upon whether the second parity bits with degree one or part of the first parity bits with degree two or higher are punctured. A method to determine whether the first parity bits are partially punctured may be applied in various manners. For example, if a block size Z is determined in the LDPC decoding process as in FIG. 12, the maximum value of a first parity bit vector length may be determined based on the block size. If the entire length of the LDPC party bits is smaller than the maximum value of the first parity bit vector length, it may be determined that the first parity bit vector was partially punctured. For reference, in case of LDPC codes using the parity check matrices of FIGS. 19A and 19B, it can be easily known that the maximum length of the first parity bit vector is 4*Z.

Where the codeword bits generated through the LDPC encoding are partially punctured and the punctured codeword bits are not transmitted by the transmitter, it may be regarded in view of the receiver that the punctured codeword bits are erased from a channel. That is, although the punctured codeword bits have not actually passed the channel, the punctured codeword bits may be deemed to be in a state that it is not possible to identify whether the concerned codeword bit is zero or one, with passing the channel. The punctured bits are decoded after being converted into values indicating that the punctured bits cannot be identified as zero or one according to the LDPC decoders. For example, zero (0) may be used when an LLR value is used, and one (1) may be used when an LR value is used. These values may be set to be different values according to the decoders.

Generally, although codeword bits whose degrees are two or higher are punctured, they greatly influence the LDPC iterative decoding performance because message values (e.g., LLR) that can determine whether the concerned bit is zero or one are continuously updated in the LDPC iterative decoding process. Accordingly, the values of LLR=0 are inserted by the LDPC decoder into the punctured parity bits whose degrees are two and utilized in the decoding. It is highly likely that the punctured parity bits whose degrees are two are also reconstructed without error. Meanwhile, where the codeword bits whose degrees are one are punctured, they influence no performance improvement in the LDPC iterative decoding process. Accordingly, the punctured parity bits whose degrees are one are generally not used in the LDPC decoder. For example, where LDPC codes having a parity check matrix with a structure of FIG. 18 are used, decoding may be performed by using only a part of the submatrices C(1840), D(1850), and E(1860) in the LDPC decoding process, in a case that the parity bits whose degrees are one are partially punctured. It should be noted that the punctured parity bits whose degrees are one may be partially used for decoding by efficient parallel processing. All the punctured parity bits whose degrees are one may be used for simple implementation of a decoder, but this method has a defect that the operation complexity of the decoder increases without an effect of performance improvement. As described above, where decoding is performed using only a part of the submatrices C(1840), D(1850), and E(1860) in the LDPC decoding process, the second part of the syndrome may be only partially obtained according to the rate matching in [Equation 22].

In addition, in certain embodiments, the transmitter may puncture a part of information bits and transmit remaining information bits for performance improvement in some communication systems or broadcasting systems. Generally, good block error rate (BLER) performance may be provided when bits corresponding to the whole or a part of the columns having the highest column weight or column degree are punctured. In this case, before applying IC or SIC after performing decoding as in FIGS. 21 and 22 in a specific layer, the bits corresponding to the information bits punctured at the transmitter are removed or discarded and then converted into proper modulation symbols, to which IC or SIC is applied, and decoding at another layer is performed based on the signals obtained through IC or SIC. As a specific, and non-limiting example, an operation to remove or discard the information bit punctured by the transmitter (not shown) after operation 2140 of FIG. 21 or operation 2240 or 2260 of FIG. 22 may be added.

In some embodiments, when the receiver determines that the first part $s_1$ of the syndrome has the value of zero and no error occurs in the CRC detection (CRC pass or success) in FIG. 22, the first parity vector is generally not re-encoded. In this case, even where the transmission code rate is very high and the first parity bits (or vector) are partially punctured, the re-encoding is not performed. As described above, a process to puncture a part of the first parity bits determined through the LDPC decoding prior to application of IC or SIC is only added.

However, when it is determined that the first part $s_1$ of the syndrome does not have all-zero value and that no error occurs in CRC detection (CRC pass or success), that is, it is determined that no error is present in the information bits but it is likely that error might occur in part of the first parity bits, another operation may be performed. The operation will be specified in connection with reference to the illustrative example of FIG. 23.

Figure 23:
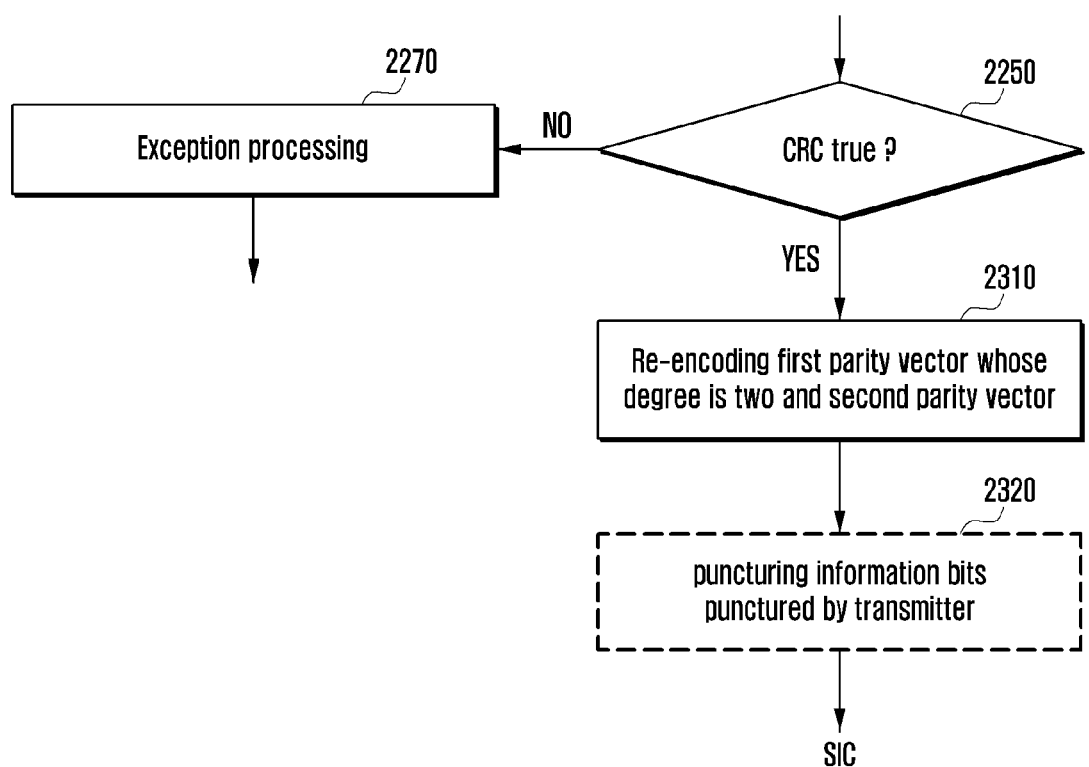
FIG. 23 illustrates an example of a process of encoding a part of parity in a decoding process based on LDPC and CRC codes, according to various embodiments of this disclosure.

FIG. 23 illustrates an example of partially re-encoding the parity in the decoding process based on LDPC and CRC codes, according to various embodiments of this disclosure.

According to some embodiments, operation 2260 of FIG. 22 includes a re-encoding process of the first parity vector. However, generally as the higher the degree of the first parity vector, the lower the probability of error, thus the receiver does not re-encode parity bits whose degrees are three in the first parity bit vector as in operation 2310 but uses the decoded results as they are. Based on these values, the receiver may perform the re-encoding for the first parity bits whose degrees are two or at least part thereof (Degree 3 and degree 2 for the first parity bit vector means the degrees determined in the submatrices [A(1810) B(1820)] corresponding to the first part $s_1$ of the syndrome defined in FIG. 18 and [Equation 22]). For reference, the submatrix [A (1810) B (1820)] includes rows irrelevant to the parity bits whose degrees are one in the overall parity check matrix). As described above, the receiver may partially puncture the first parity bits re-encoded or regenerated according to the rate matching, or partially re-encode or regenerate the second parity bits in operation 2310 (hereinafter represented as "re-encode" for the sake of convenience). In addition, there are information bits punctured by the transmitter according to the communication systems, the receiver should puncture the information bits at the same positions prior to IC or SIC as in operation 2320. Where no information bits are punctured in the transmitter, operation 2320 may be omitted.

As indicated in operation 2310 of FIG. 23, a method of re-encoding the first parity vector whose degree is two may be more subdivided and then performed. For example, where the first part $s_1$ of the syndrome does not have a value of zero in operation 2220, the re-encoding method may be applied in a different manner in operation 2310 according to the positions of the values that are not zero in the first part of the syndrome.

For example, in some embodiments, where the values which are not zero in the first part of the syndrome are relevant to a part of the parity bits whose degrees are three, the receiver modifies operation 2310 and performs the re-encoding for the entire first parity vector. Where the values which are not zero in the first part of the syndrome are not relevant to a part of the parity bits whose degrees are three, the receiver may perform the re-encoding for the first parity vector whose degree is two or at least part thereof as in operation 2310. For example, where LDPC decoding is performed based on the parity check matrix in the same form as FIG. 19A, parity bits corresponding to the first column blocks among the first parity bits (the $23^{rd}$ column block on the basis of the overall parity check matrix) are bits whose degrees are three. Where at least one or more positions which are not zero in the first part $s_1$ of the LDPC syndrome correspond to the first or second or fourth row blocks, the re-encoding is performed for the overall first parities. Where all the positions which are not zero in the first part $s_1$ of the LDPC syndrome correspond to the third row blocks, the re-encoding is performed only for the first parity vector whose degree is two as in operation 2310 of FIG. 23.

Similarly, where the LDPC encoding based on the parity check matrix in the same form as FIG. 19B is performed, the parity bits corresponding to the first column block among the first parity bits (the $11^{th}$ column block on the basis of the overall parity check matrix) are bits whose degrees are three. Where at least one or more positions which are not zero in the first part $s_1$ of the LDPC syndrome correspond to the first or third or fourth row blocks, the re-encoding is performed for all the first parities. Where the positions which are not zero in the first part $s_1$ of the LDPC syndrome all correspond to the second row blocks, the re-encoding may be performed only for the first parity vector whose degree is two as in operation 2310 of FIG. 23.

For reference, the meaning that a syndrome value is relevant to or corresponds to a specific bit implies that the specific parity bits influences upon determination of the syndrome value in [Equation 21] and [Equation 22].

It should be noted that in the disclosure, "exception processing" encompasses operations performed where it is determined that the decoding fails or the decoding may be likely to fail, excepting the operations to be performed where the decoding is successfully progressed on all the processes.

For example, basically in the exception processing in FIGS. 20 to 23, when the receiver determines failure in the LDPC decoding, the receiver may determine whether or not to use, or whether or not to discard the information vector or code block for which decoding was performed. Another example of the exception processing, wherein hierarchical decoding as in FIG. 16 is performed, the receiver may apply a method to utilize the information vector or code block determined to fail or to be likely to fail in the decoding for the interference cancellation, rather than to discard the same.

For example, when the interference cancellation is performed for FEC decoding of another layer, the receiver may use the hard decision result for the LDPC decoding result in operation 2010, and may use the soft value output from the LDPC decoder as it is. At least part of the parity bits as well as the information vector or code block determined to fail or to be likely to fail in LDPC decoding may be used so as to perform the interference cancellation. (However, the bits punctured by the transmitter should be excluded). Another exception processing ignoring decoding of the concerned code block, may be relevant to methods of determining the decoding scheduling like performing FEC decoding for the other layer.

The embodiments of the disclosure described as above have been described in connection with the process of re-encoding partially or entirely the parity bits of the LDPC codes, so as to apply interference cancellation efficient and available for performance improvement in the receiving operation of the communication system or broadcasting system that can perform the decoding based on hierarchical structure, like MIMO or SCM systems. In addition, these embodiments may be any combination of the re-encoding methods based on CRC and LDPC syndromes according to several situations as will be described below.

Case 1) <the first part of the LDPC syndrome=0 and CRC true (or CRC pass)>

Method 1-1: Re-encode all parities (However, re-encoding is performed, in consideration of the parity bits punctured by the transmitter)

Method 1-2: Use the decoding result (or output) for the parity bits whose degrees are three or higher, and re-encode at least part of the parities whose degrees are two or lower (However, re-encoding is performed, in consideration of the parity bits punctured by the transmitter)

Method 1-3: Use the decoding result (or output) for the parity bits whose degrees are two or higher, and re-encode at least part of the parities whose degrees are one (However, re-encoding is performed, in consideration of the parity bits punctured by the transmitter, but the parity bits whose degrees are one may be excluded from the re-encoding if not transmitted by the transmitter)

Case 2) <the first part of the LDPC syndrome≠0 and CRC true (or CRC pass)>

Method 2-1: Determine that FEC decoding of the concerned layer fails and perform an exception processing Method 2-2: Re-encode all parities (However, re-encoding is performed, in consideration of the parity bits punctured by the transmitter)

Method 2-3: Use the decoding result (or output) for the parity bits whose degrees are three or higher, and re-encode at least part of the parities whose degrees are two or lower (However, re-encoding is performed, in consideration of the parity bits punctured by the transmitter)

Method 2-4: Use the decoding result (or output) for the parity bits whose degrees are two, and re-encode at least part of the parities whose degrees are one (However, re-encoding is performed, in consideration of the parity bits punctured by the transmitter, but the parity bits whose degrees are one may be excluded from the re-encoding if not transmitted by the transmitter)

Case 3) <the first part of the LDPC syndrome=0 and CRC fail (or CRC error)>

Method 3-1: Determine that FEC decoding of the concerned layer fails and perform an exception processing Method 3-2: Use the decoding result (or output) for the parity bits whose degrees are two or higher, and re-encode at least part of the parities whose degrees are one (However, re-encoding is performed, in consideration of the parity bits punctured by the transmitter, but the parity bits whose degrees are one may be excluded from the re-encoding if not transmitted by the transmitter)

Case 4) <the first part of the LDPC syndrome≠0 and CRC fail (or CRC error)>

Method 4-1: Determine that FEC decoding of the concerned layer fails and perform an exception processing In Case 1), Case 2), Case 3), and Case 4), other parity bits, excluding the re-encoded parity bits, or information bits basically use the LDPC decoding results (or output) as they are. For example, proper modulation symbols are generated based on the LDPC decoding results with hard decision and re-encoded parity bits and then perform interference cancellation. In addition, the interference cancellation may be performed using a part of the soft value output from the LDPC decoding result.

According to certain embodiments, if the parity bits punctured but not transmitted by the transmitter are utilized even with the interference cancellation, the result may be distorted. Accordingly, as an operation to exclude the concerned punctured parity bits, perform the re-encoding, or to apply a proper puncturing after the re-encoding is necessary, the operation is omitted in Case 1), Case 2), Case 3), and Case 4). Likewise, even where the information bits are partially punctured by the transmitter, the punctured information bits are also punctured or excluded prior to performing interference cancellation. Also, since interleaving, etc. is applied by the transmitter to the LDPC encoded bits, it should be understood that the receiver requires a deinterleaving process corresponding thereto. In this regard, the detailed description thereof will be omitted.

The following non-limiting examples show that re-encoding methods of the parity bits may be combined in various manners in connection with Case 1), Case 2), Case 3), and Case 4).

[Re-Encoding Method 1]

Case 1) <the first part of the LDPC syndrome=0 and CRC true (or CRC pass)>

Method 1-3: Use the decoding result (or output) for the parity bits whose degrees are two or higher, and re-encode at least part of the parity bits whose degrees are one (However, re-encoding is performed, in consideration of the parity bits punctured by the transmitter, but the parity bits whose degrees are one may be excluded from the re-encoding if not transmitted by the transmitter)

Case 2) <the first part of the LDPC syndrome≠0 and CRC true (or CRC pass)>

Method 2-1: Determine that FEC decoding of the concerned layer fails and perform an exception processing Case 3) <the first part of the LDPC syndrome=0 and CRC fail (or CRC error)>

Method 3-1: Determine that FEC decoding of the concerned layer fails and perform an exception processing Case 4) <the first part of the LDPC syndrome≠0 and CRC fail (or CRC error)>

Method 4-1: Determine that FEC decoding of the concerned layer fails and perform an exception processing For reference, Case 2), Case 3), and Case 4) in the re-encoding method 1 may be used in a combined form as below Case 5) <the first part of the LDPC syndrome≠0 or CRC fail (or CRC error)>

Method 2-1: Determine that FEC decoding of the concerned layer fails and perform an exception processing

[Re-Encoding Method 2]

Case 1) <the first part of the LDPC syndrome=0 and CRC true (or CRC pass)>

Method 1-3: Use the decoding result (or output) as it is, for parity bits whose degrees are two or higher, and re-encode at least part of the parity bits whose degrees are one (However, re-encoding is performed in consideration of the parity bits punctured by the transmitter, and the parity bits whose degrees are one, if not transmitted by the transmitter, may be excluded from the re-encoding)

Case 2) <the first part of the LDPC syndrome≠0 and CRC true (or CRC pass)>

Method 2-2: Re-encode all parities (However, re-encoding is performed, in consideration of the parity bits punctured by the transmitter)

Case 3) <the first part of LDPC syndrome=0 and CRC fail (or CRC error)>

Method 3-1: Determine that FEC decoding fails in the concerned layer and perform an exception processing.

Case 4) <the first part of the LDPC syndrome≠0 and CRC fail (or CRC error)>

Method 4-1: Determine that FEC decoding fails in the concerned layer and perform an exception processing.

[Re-Encoding Method 3]

Case 1) <the first part of the LDPC syndrome=0 and CRC true (or CRC pass)>

Method 1-3: Use the decoding result (or output) as it is, for parity bits whose degrees are two or higher, and re-encode at least part of the parity bits whose degrees are one (However, re-encoding is performed in consideration of the parity bits punctured by the transmitter, and the parity bits whose degrees are one, if transmitted, may be excluded from the re-encoding)

Case 2) <the first part of the LDPC syndrome≠0 and CRC true (or CRC pass)>

Method 2-3: Use the decoding result (or output) as it is, for parity bits whose degrees are three or higher, and re-encode at least part of the parity bits whose degrees are two or lower (However, re-encoding is performed in consideration of the parity bits punctured by the transmitter)

Case 3) <the first part of the LDPC syndrome=0 and CRC fail (or CRC error)>

Method 3-1: Determine that FEC decoding fails in the concerned layer and perform an exception processing.

Case 4) <the first part of LDPC syndrome≠0 and CRC fail (or CRC error)>

Method 4-1: Determine that FEC decoding fails in the concerned layer and perform an exception processing.

For reference, in the re-encoding methods 2 and 3, Case 3) and Case 4) may be combined in the following form:

Case 6) <CRC fail (or CRC error)>

Method 3-1: Determine that FEC decoding fails in the concerned layer and perform an exception processing.

With respect to Case 1), Case 2), Case 3), and Case 4), in methods for re-encoding parity bits and various combined methods thereof, no method for performing re-encoding in consideration of the iterative decoding number of LDPC decoding has been described. However, the LDPC decoding generally performs iterative decoding within the predetermined maximum number of iterative decoding. It is possible to easily and continuously check the LDPC syndrome in the LDPC decoding process. Accordingly, where it is checked that the LDPC syndrome (or the first part of the LDPC syndrome) is zero before the iterative decoding number reaches to the maximum number of the iterative decoding as illustrated in FIG. 21, the LDPC decoding can stop. Having checked or inspected the CRC, re-encoding processes as in Case 1), Case 2), Case 3), and Case 4) may be performed based on the result thereof.

According to certain embodiments, re-encoding of the parity bits is performed by combining the methods suggested in Case 1), Case 2), Case 3), and Case 4), including the re-encoding methods 1 to 3 as described above, as appropriate, and based on the result, interference may then be removed from the signals received for hierarchical structure decoding. However, where it is difficult to determine the success in FEC decoding, it would be preferable to utilize the results of LDPC decoding as it is, rather than to perform the re-encoding. This is because determination that the FEC decoding fails implies occurrence of an error in part of the information bits, and re-encoding of the parity on this basis may exhibit that the actually transmitted parity is very greatly different from the re-encoded parity. Accordingly, where any error is detected through an outer code including CRC, the concerned information bits (or code block) are discarded. However, where interference is cancelled despite detection of any error, interference cancellation is performed by using the results (or output) of the LDPC decoding as it is, so as to support better performance.

Various re-encoding methods that may be obtained by combining the methods suggested in Case 1), Case 2), Case 3), and Case 4), including the re-encoding methods 1 to 3 as described above, as appropriate, may be variably applicable depending upon the configurations of the system. For example, the re-encoding methods may be variably applicable depending upon error detection capacity of an outer code.

A method for variable application of the re-encoding method of the parity depending upon the size of TBS and the error detection capacity of CRC according to various embodiments of this disclosure will be described below.

First, it may be assumed that, in certain embodiments, in the communication system, CRC uses 24 bits where TBS is greater than 3824, and CRC uses 16 bits where TBS is equal to or less than 3824. A reason to set different numbers of CRC bits according to TBS is to decrease any unnecessary overhead.

However, when the CRC bits are differently applied according to TBS, undetected error probability varies depending upon the number of CRC bits (it may be described as false alarm rate according to the system). The more the CRC bits the lower the undetected error probability, and the lower the CRC bits the higher the undetected error probability.

Where 24 bits are used as the number of CRC bits in the communication system, that is, TBS is greater than 3824, as the number of CRC bits is sufficiently great, the undetected error probability required in the system may be easily achieved. However, where 16 bits are used as the number of CRC bits in the communication system, that is, TBS is less than or equal to 3824, as the number of CRC bits are not sufficiently great, the undetected error probability required in the system may not be achieved. In this case, the undetected error probability required in the system may be achieved based on LDPC syndrome-based error detection as well as CRC-based error detection.

As a result, where 24 bits are used as the number of CRC bits in the communication system, that is, TBS is greater than 3824, error detection only by CRC is sufficient, and therefore, it may be determined that no error occurs in the decoded information bits (or code block) if no error is detected in CRC, regardless of the result of LDPC syndrome. In this case, it may be expected that all the parities may be reconstructed without error by means of re-encoding of the parities even though the first part of the LDPC syndrome does not have a value of zero, by applying the re-encoding method 2.

However, where 16 bits are used as the number of CRC bits in the communication system, that is, TBS is equal to or less than 3824, the number of CRC bits is not enough to achieve the undetected error probability required in the system. Accordingly, even though no error is detected based on CRC bits, it may be difficult to determine that the decoded information bits (or code block) are successfully decoded if the first part of the LDPC syndrome is not zero. In this case, by applying the re-encoding method 1, if the first part of the LDPC syndrome does not have all-zero value, it may be determined that EFC decoding fails and an exception processing may then be applied. Where the error detection capacity of CRC is not high compared the requirements of the system, at least part of the first part of the LDPC system is checked, and the error detection process of CRC may be omitted under the determination that any error occurred if the at least part of the first part of the LDPC system does not have all-zero value.

Certain embodiments according to this disclosure include a variable application method of the re-encoding method of the parity depending upon BLER required in the communication system, such as described below (The block may be a transport block or a code block as the case may be).

According to certain embodiments, the communication system or broadcasting system is operated with setting target BLER values. The target BLER values are BLER values that could be substantially achieved. That is, while the system is normally operated, an error close to the target BLER would be occurred. It will be assumed that the communication system supports services with different target BLERs. For example, among 5G services, the target BLER is generally about 0.1 in case of enhanced Mobile Broadband (eMBB) services, which is a value relatively high, the target BLER is about 0.0001 or 0.00001 in case of ultra-reliable and low latency communications (URLLC) services, which is a low value.

In general, it may be regarded that in case of a service with target BLER is 0.0001 or 0.00001, the service is operated in an environment that a signal-to-noise ratio (SNR) for a signal received from the communication system is somewhat high, compared to another service with target BLER having a high value of 0.1. Where the SNR is relatively high, the parity bits whose degrees are two or higher may have an error probability through LDPC decoding that is remarkably decreased in the LDPC coding. As described above, where the target BLER is very low, the probability that any error is still included in the first parity vector corresponding to the first part of the LDPC syndrome, despite CRC passing, is also low. Accordingly, regardless of the result of LDPC syndrome, a simplified re-encoding method may be applied as described below.

[Re-Encoding Method 4]

Case 6) <CRC fail (or CRC error)>

Method 3-1: Determine that FEC decoding fails in the concerned layer and perform an exception processing.

Case 7) <CRC true (or CRC pass)>

Method 1-3: Use the decoding result (or output) as it is, for parity bits whose degrees are two or higher, and re-encode at least part of the parity bits whose degrees are one (However, re-encoding is performed in consideration of the parity bits punctured by the transmitter, and the parity bits whose degrees are one, if not transmitted, may be excluded from re-encoding)

As a result, where such services whose target BLER has a relative high value of about 0.1, one of the re-encoding methods 1 to 3 is supported. Where such services whose target BLER has a relative low value of about 0.0001 or 0.00001, a simplified method such as the re-encoding method 4 may be applied.

In some embodiments, the target BLER may be directly indicated, but it may also be indirectly indicated by means of any different method. A target BLER indicating method may be used according to a channel quality indicator (CQI) table or a modulation and coding scheme (MCS) table actually applied for transmission and reception in the communication system. For example, it may be regarded that the target BLER indicates 0.1 where a first CQI table or a second CQI table is used, and the target BLER indicates 0.00001 where a third CQI table is used. In the disclosure, the above method of indicating BLER using a CQI or MCS table is merely an exemplary embodiment, and thus, the scope of the disclosure is not limited thereto. The following table is a specific example of using the method.

[Table 3] Example of Using a Method of Indicating the Target BLER as a CQI Table A single PDSCH transport block with a combination of modulation scheme, target code rate and transport block size corresponding to the CQI index, and occupying a group of downlink physical resource blocks termed the CSI reference resource, could be received with a transport block error probability not exceeding:
0.1, if the higher layer parameter cqi-Table in CSI-ReportConfig configures 'table1', or 'table2', or
0.00001, if the higher layer parameter cqi-Table in CSI-ReportConfig configures 'table3'.

According to the above example, if 'table1' or 'table2' as a CQI table is set from higher layer signaling in the communication system, it may be expected that the error probability set as a target in the communication system is a value approximate to 0.1 or a value equal to or less than 0.1. In other words, the communication system may be substantially operated with a target BLER of 0.1.

Meanwhile, if 'table3' as a CQI table is set from higher layer signaling in the communication system, it may be expected that the error probability set as a target in the communication system is a value approximate to 0.00001 or a value equal to or less than 0.00001. In other words, the communication system may substantially be operated with a target BLER of 0.00001.

A manner of varying the re-encoding method of a parity depending upon the target BLER (or BLER required by the system) may be replaced with a re-encoding method based on parameters, corresponding to a CQI table set in the higher layer signaling or other target BLER.

A variable application of the re-encoding method of the parity according to a channel encoding rate R in the communication system according to various embodiments of this disclosure is described below. As described above, where channel encoding is performed based on the LDPC codes having the structure of FIG. 18, puncturing is available in the parity bits whose degree is one and the parity bits whose degrees are two or higher in the first parity vector (In the first parity vector, the degree 2 means a degree determined in the submatrix [A(1810) B(1820)] consisting of columns whose degrees are two or higher and rows independent of parities whose degrees are one in the entire parity check matrix corresponding to the first part $s_1$ of the syndrome defined in FIG. 18 and [Equation 22]). Degrees of the punctured parity bits may be determined based on a TBS or CBS value, an LDPC encoding rate and a basic matrix or a parity check matrix for the LDPC encoding, and therefore, the re-encoding method may be variably applicable based on the channel encoding rate.

Certain embodiments according to this disclosure been described in connection with a case where CRC codes are used as an outer code. However, any outer code having the error detection capacity is similarly applicable to embodiments of the disclosure described up to in a similar manner. As both error correction capacity and error detection capacity are present in case of BCH codes, the error detection is performed after decoding of inner codes such as LDPC codes is completed and then an error correction process is additionally performed, and thus, BCH codes are applicable to the embodiments of the disclosure. For example, processes identifying or checking CRC in Case 1), Case 2), Case 3), Case 4), Case 5), Case 6), and Case 7) may be replaced with a process for "error detection through BCH" or a process for "error detection after error correction through BCH", for application.

As described above, an LDPC syndrome value s may be obtained by a computation process based on the parity check matrix and decoded codeword as in [Equation 21] and [Equation 22], but it may also be easily obtained according to features implemented by an LDPC decoder. For example, in [Equation 15], the value may be easily obtained through operation of + or − signs of the messages used in the decoding process for LDPC decoding. In implementation of the actual decoder, the + sign corresponds to zero (0) and the—sign corresponds to one (1), as binary numbers, and the syndrome value can be easily obtained by the XOR operation.

However, the syndrome values relevant to parity bits whose degrees are one would have non-zero value with a very high probability, regardless of whether any error occurs in information bit or code block. Accordingly, the syndrome value (the second part of the syndrome) $s_2$ determined based on the second part of the parity check matrix including submatrices C(1840), D(1850), and E(1960) in FIG. 18 and [Equation 22] is not appropriate for use in determining performance of the LDPC decoding. In other words, the process to compute or determine the second part $s_2$ of the syndrome may cause unnecessary overhead in the LDPC decoding process.

Accordingly, a method for the receiver to modify an operation to compute or determine the second part $s_2$ of the syndrome like [Equation 22] and utilize the second part $s_2$ of the syndrome in the re-encoding process. [Equation 23] exhibits a modified LDPC syndrome value that can be obtained based on the submatrices A(1810), B(1820), C(1840), and D(1850) in FIG. 18 and [Equation 22].

$$s' = \begin{bmatrix} s_1 \\ s'_2 \end{bmatrix} = \begin{bmatrix} A & B \\ C & D \end{bmatrix} \cdot \begin{bmatrix} \hat{i}^T \\ \hat{p}_1^T \end{bmatrix}$$ [Equation 23]

In [Equation 23], the first part $s_1$ of the syndrome is identical to that of [Equation 22], but the second part $s_2'$ of the modified syndrome is determined by the submatrices C(1840 and D(1850), different from the second part $s_2$ of the syndrome determined by submatrices C(1840), D(1850), and E(1860). The second part of the modified syndrome may be obtained (or computed or determined) through the almost same process as the process to obtain the second part of the existing syndrome, without increase in complexity in actual implementation when a terminal is implemented. Where the submatrix E(1860) in FIG. 18 is an identity matrix (or a matrix having the same algebraic feature as the identity matrix), the second part of the modified syndrome is in fact determined to be same as the re-encoded bits with respect to the parity bits whose degrees are one. In addition, as in [Equation 24], the second part $s_2'$ of the modified syndrome is the same as the result obtained (or computed or determined) by adding (XOR operation) the resulting values of the parity bits whose degrees are one, obtained through the LDPC decoding, to the second part of the existing syndrome defined in [Equation 22].

$$s' = \begin{bmatrix} s_1 \\ s'_2 \end{bmatrix} = \begin{bmatrix} s_1 \\ s_2 + E \cdot \hat{p}_2^T \end{bmatrix} = \begin{bmatrix} s_1 \\ s_2 + \hat{p}_2^T \end{bmatrix}$$ [Equation 24]

As a result, re-encoding of the parity bits whose degrees are one, among the LDPC encoded bits, does not consider submatrices corresponding to the parity bits whose degrees are one (1) in the entire parity check matrix. The re-encoding may be determined based on the LDPC syndrome or modified syndrome values for the submatrices associated with information bits or the parity bits whose degrees are two or higher as in [Equation 23], or based on the existing LDPC syndrome and the LDPC decoding result as in [Equation 24].

As the LDPC syndrome values may be easily determined in the iterative decoding process in which the LDPC decoding is performed as many as the maximum number of iterative decoding, the re-encoding may not be performed after identification of the LDPC syndrome and the CRC detection result.

In certain embodiments according to this disclosure, regardless of the LDPC syndrome or CRC detection, the re-encoding of the parity bits whose degrees are one may be performed in the LDPC iterative decoding process by utilizing the implementation features of the LDPC decoder. In this case, the re-encoding process performed sequentially according to the LDPC syndrome or CRC detection result as explained in FIGS. 21 to 23 and the above-described embodiments may be modified, thereby being capable of performing IC or SIC.

In some embodiments, the re-encoding result of the parity bits whose degrees are one is determined in the LDPC iterative decoding process by [Equation 23] or [Equation 24]. IC or SIC may be performed after determining whether to use the re-encoded result as parity bits for application of IC or SIC according to LDPC syndrome or CRC detection result after completion of the LDPC decoding, or whether to use the parity bits obtained by the LDPC decoding as the parity bits for IC or SIC application.

Figure 24:
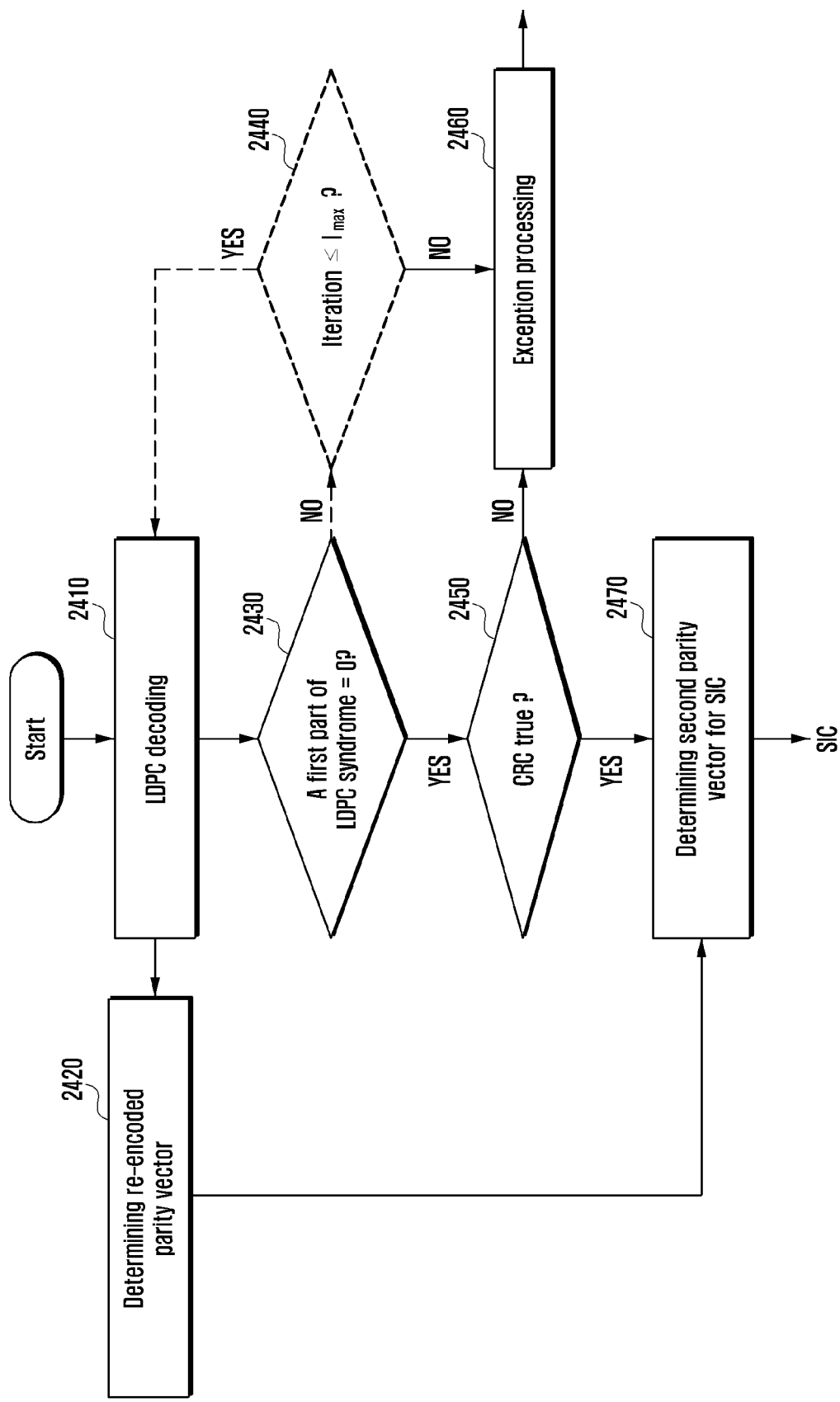
FIG. 24 illustrates an example of a process of encoding a part of parity in a decoding process based on LDPC and CRC coded, according to various embodiments of this disclosure.
Figure 25:
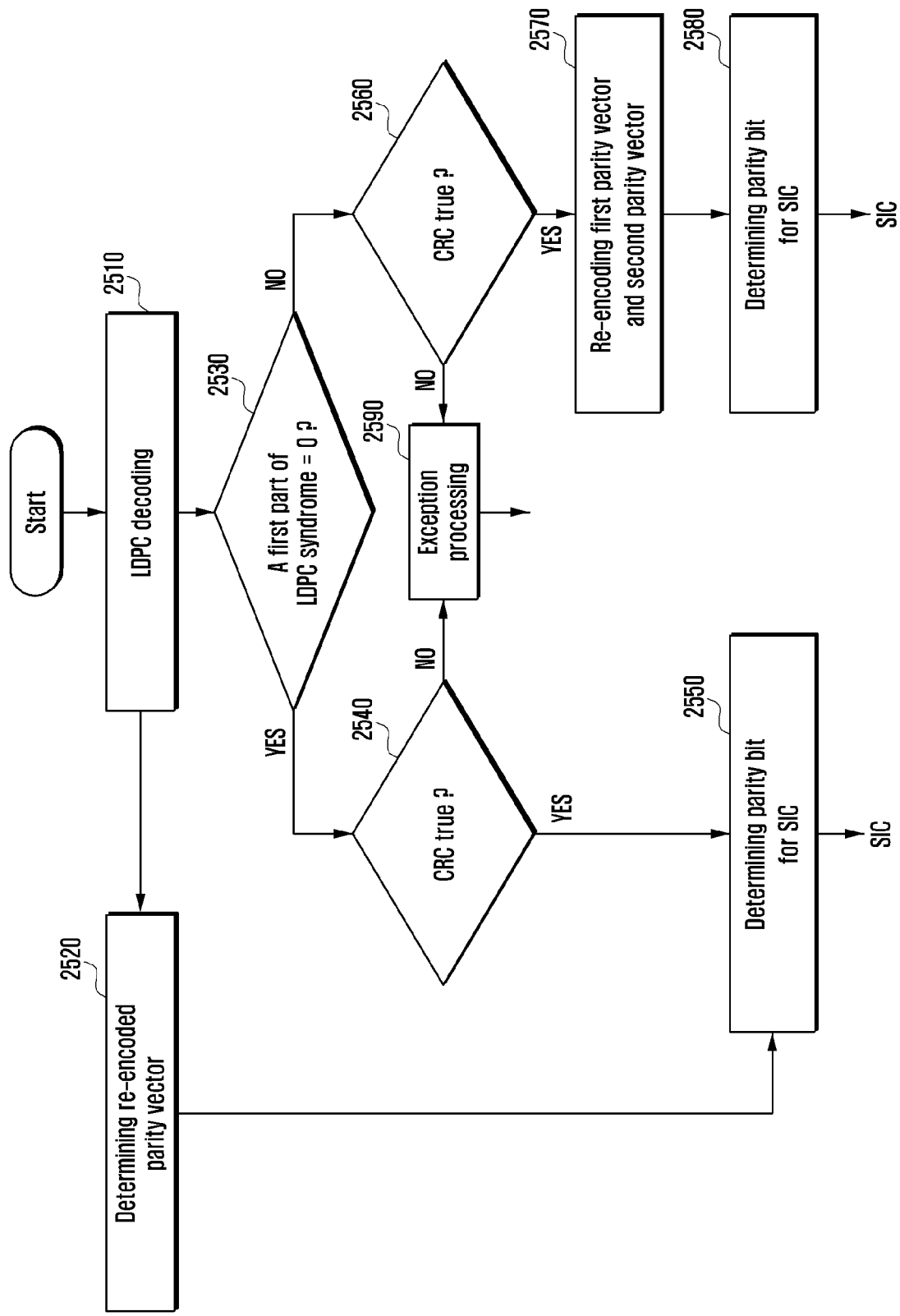
FIG. 25 illustrates an example of a process of encoding a part of parity in a decoding process based on LDPC and CRC codes, according to some embodiments of this disclosure.

Examples of operational flow charts for the above embodiments are illustrated in FIGS. 24 and 25.

FIG. 24 is illustrates an example of partially re-encoding the parity in the decoding process based on LDPC and CRC codes, according to certain embodiments of this disclosure.

In the non-limiting example of FIG. 24, the re-encoding operation for the second parity vector (that is, parity bits whose degrees are one) is performed through operation 2420 with the LDPC decoding in operation 2410, which may be easily implemented through the LDPC syndrome or modified LDPC syndrome as explained in [Equation 23] or [Equation 24].

According to certain embodiments, where the first part of the LDPC syndrome has all-zero in operation 2430, and it is determined that there is no error, as a result of CRC detection, in operation 2450, the re-encoded parity bits determined in operation 2420 are determined as a second parity vector for IC or SIC in operation 2470.

Where the first part of the syndrome does not have all-zero value even through iterative decoding is performed up to the maximum number of iterative decoding in operations 2430 and 2440, or it is determined that any error occurs as a result of CRC detection, an exception processing is performed in operation 2460.

However, the embodiments of the disclosure are not limited thereto, or to the examples described below.

In some embodiments, where the first part of the LDPC syndrome does not have all-zero, but it is determined that no error occurs as a result of CRC error detection, re-encoding for the first parity bit vector is performed and then the re-encoding for the second parity bit vector may be performed based on the reconstructed information bit (or code block) and the re-encoded first parity bit vector. This is because the re-encoded first parity vector determined in operation 2420 may not be reliable where the first part of the LDPC syndrome for the first parity bit vector obtained through the LDPC decoding does not have all-zero.

However, in the parity check matrix of FIG. 18, if the submatrix D(1850) is 0-matrix in which all elements are zero, the parity bits whose degrees are two or higher (that is, the first parity vector) and the parity bits whose degrees are one (that is, the second parity vector) can be generated independently of each other. Accordingly, the process of re-encoding the second parity bit vector based on the first parity vector may be omitted, and the second parity vector determined in operation 2420 may be used in operation 2470.

It has been described above that the parity vector is determined after the LDPC decoding. Referring to the non-limiting example of FIG. 24, it should be understood that operation 2420 of the disclosure can be performed in any operation after LDPC decoding, and may be performed together with LDPC decoding.

FIG. 25 is a flow chart illustrating partially re-encoding the parity in the decoding process based on LDPC and CRC codes FIG. 25 is similar to the embodiment of FIG. 22, but the re-encoding operation for the second parity vector (that is, parity bits whose degrees are one) is performed through operation 2520 together with the LDPC decoding in operation 2510. The re-encoding operation may be easily implemented through LDPC syndrome or modified LDPC syndrome explained in [Equation 23] or [Equation 24].

Where the first part of LDPC syndrome has all-zero in operation 2530, and it is determined that there is no error as a result of CRC detection in operation 2540, the receiver determines the re-encoded parity bits determined in operation 2520 as the second parity vector for IC or SIC in operation 2550.

In operation 2550, the receiver may determine the first parity vector obtained as a result of LDPC decoding as it is, as the first parity vector for IC or SIC. For the convenience of implementation, the re-encoding for the first parity vector is performed based on the information bits (or code block) obtained as a result of the LDPC decoding, and then may determine the re-encoded first parity vector as the first parity vector for IC or SIC (Description for the information bits punctured by the receiver and a puncturing operation for the parity bits will be omitted).

Where it is determined that the first part of the syndrome does not have a all-zero in operation 2530 and no error occurred as a result of CRC detection in operation 2560, it may be expected that any error is included in part of the parity bits whose degrees are two or higher Accordingly, the receiver performs re-encoding for the parity bits whose degrees are two or higher (that is, the first parity vector). In addition, the receiver may perform the re-encoding for the second parity vector if necessary, based on the information bit (or code block) obtained through the LDPC decoding or the re-encoded first parity vector (Description for the information bits punctured by the receiver and a puncturing operation for the parity bits will be omitted). This is because the re-encoded second parity vector determined in operation 2520 may not be reliable where the first part of the LDPC syndrome for the second parity bit vector obtained through the LDPC decoding has a does not have a value of zero.

However, if the submatrix D(1850) is 0-matrix in which all elements are zero, in the parity check matrix of FIG. 18, the parity bits whose degrees are two or higher (that is, the first parity vector) and the parity bits whose degree is one (that is, the second parity vector) may be generated independently of each other. Accordingly, the process of re-encoding the second parity bit vector based on first parity bit vector may also be omitted for the first parity vector in operation 2570. The first parity bit vector determined in operation 2520 may be used in operation 2550 or 2580.

It has been described above that the parity vectors are determined after the LDPC decoding. However, referring to FIG. 25, it should be understood that operation of 2520 of the disclosure may be performed in any step or operation after the LDPC decoding, or may be performed together with the LDPC decoding.

For the convenience of explanation, operations 2550 and 2580 are divided in the example of FIG. 25. However, it should be noted that operations 2550 and 2580 may, in some embodiments, be implemented in one process.

In the illustrative examples of FIGS. 24 and 25, an exception processing is executed where it is determined that any error occurs as a result of CRC error detection. The exception processing means an operation excluding standard hierarchical structure decoding operation, and a method for exception processing is to interrupt hierarchical structure decoding as described above or to apply the result of LDPC decoding to IC or SIC without re-encoding (or the re-encoding is only partially applied), or to perform the LDPC decoding for another layer and apply the same to IC or SIC, etc.

Similar to the second part of the modified LDPC syndrome defined in [Equation 23] and [Equation 24], the re-encoding of the parity bits whose degrees are two or higher could be easily implemented as in [Equation 25], based on the first part $S_i'$ of the modified syndrome determined by a submatrix A (1810) and the information vector in FIG. 18 and [Equation 22].

$$s_1' = A \cdot \hat{i}^T \qquad \text{[Equation 25]}$$

The re-encoded first parity vector $\tilde{p}_1^T$ from $A \cdot i^T + B \cdot p_1^T = 0$ of [Equation 20] can be obtained based on $B \cdot \tilde{p}_1^T = s_1'$. In other words, if no error has occurred in an LDPC decoded information bit vector (or no error has been detected by CRC detection), the re-encoding may be performed based on the LDPC decoded information bit (or code block) and the first part of the LDPC syndrome.

For reference, the parity bits punctured by the transmitter may not be considered with respect to the LDPC syndrome or re-encoded parity bits explained in [Equation 24], and FIGS. 24 and 25, and detailed description thereof is omitted herein for the sake of convenience. For example, it has been described above that the submatrix E(1860) of FIG. 18 is entirely used in determining the second part of the LDPC syndrome. However, generally a part of the submatrix E(1860) may only be used in consideration of the punctured parity bits.

It should also be noted that the parity bits punctured by the transmitter may also be excluded in determining the parity bits for IC or SIC application in FIGS. 24 and 25. In addition, it should be noted that where a part of the information bit (or code block) is punctured and transmitted by the transmitter, the concerned information bit (or code block) for IC or SIC application may also be punctured.

In certain embodiments according to this disclosure, a re-encoding method of the parity bits for IC or SIC application based on the parity check matrix having the structure of FIG. 18 has been suggested with various embodiments. The re-encoding method in a simpler form may be applied to these embodiments by further limiting the structure of FIG. 18.

For example, in the parity check matrix of FIG. 18, if a submatrix D(1850) is 0-matrix in which all elements are zero, the parity bits whose degrees are two or higher (that is, the first parity vector) and the parity bits whose degrees are one (that is, the second parity vector) may be generated independently of each other.

That is, re-encoding or not of the parity bits whose degrees are one may be determined based only on the error detection result of an outer code such as CRC detection, without considering the first part $s_1$ of the LDPC syndrome. In other words, where it is determined that there is no error as a result of the CRC detection, regardless of the first part of the LDPC syndrome, the second parity vector re-encoded may be determined based on the second part of the LDPC syndrome and the LDPC decoded second parity vector (or a part thereof), in [Equation 23] or [Equation 24], or the re-encoded second parity vector may be determined based on the second part of the modified LDPC syndrome.

Meanwhile, where the submatrix D(1850) is a matrix other than 0-matrix, at least part of the parity bits whose degrees are one may be necessarily encoded or re-encoded after the parity bits whose degrees are two or higher are determined. In other words, if the submatrix D(1850) is another matrix than the 0-matrix with respect to the embodiment of the disclosure, re-encoding (or correction by the syndrome) of the parity bits whose degrees are two or higher are generally performed, and if the parity bits are changed from the result of LDPC decoding, based on the result, re-encoding (or correction by the syndrome) of at least part of the parity bits whose degrees are one should be performed.

It should be understood that embodiments described in the examples of this disclosure may be combined so as to produce new specific embodiments. As a specific combination method, another embodiment of the IC or SIC decoding through the re-encoding is indicated below in the re-encoding method 5.

[Re-Encoding Method 5]
1) A receiver receives signals corresponding to a transport block and a code block generated from a transmitter having a hierarchical structure.
2) Sizes of the transport block and the code block are determined based on the received signals.
3) A parity check matrix is determined based on the determined sizes of the transport block or the code block.
4) LDPC decoding is performed based on the received signal and the determined parity check matrix, so as to decode the code block.
5) A first LDPC syndrome is determined based on the decoded code block and at least part of the first parity bits.
6) CRC for the decoded code block is determined.
7) IC or SIC is performed based on the determined the first LDPC syndrome value and the CRC.

An example of a method of performing IC or SIC may include at least one of the methods described below. However, the embodiments of the disclosure are not limited thereto.
 i) When the CRC is false (or fails), IC or SIC is not performed (or IC or SIC is skipped). As another example, where CRC fails, it may be possible to apply a method for applying IC or SIC based on the result of LDPC decoding without re-encoding.
 ii) When the first LDPC syndrome has all-zero, and the determined CRC is true (or passes), the second parity bits are re-encoded based on the decoded code block and the first parity bits (or at least part thereof). IC or SIC is performed based on the decoded first parity bits and at least part of the re-encoded second parity bits.
 iii) When the size of the transport block is greater than a predetermined value, the first LDPC syndrome does not have all-zero, and the determined CRC is true (or passes), the first parity bits are re-encoded based on the decoded code block, the second parity bits are re-encoded based on the decoded code block and the re-encoded first parity bits, and IC or SIC is performed based on the re-encoded first parity bits and at least part of the second parity bits.
 iv) When the size of the transport block is equal to or less than a predetermined value, and the first LDPC syndrome does not have all-zero, IC or SIC is not performed (or IC or SIC execution is skipped).
8) The first parity bits correspond to columns whose degrees are two or higher in the parity check matrix, and the second parity bits correspond to columns whose degrees are one in the parity check matrix.

For reference, in the re-encoding method 5, it should be noted that the second parity bits or the first parity bits may be re-encoded together based on the LDPC syndrome or modified LDPC syndrome in 4) or 5) process. In this case, at least the second parity bits may not be re-encoded in 7) process. In addition, the first LDPC syndrome generally indicates LDPC syndromes associated with the submatrices A(1810) and B(1820) of FIG. 18, LDPC information bits and the first parity bits. However, where the first parity is punctured and transmitted by the transmitter through rate matching, it may indicate LDPC syndromes associated only with the LDPC information bits and at least part of the received first parity bits.

Another example of a specific combination method for IC or SIC decoding through the re-encoding is described below in [Re-encoding method of SCM or LDM system] or [Re-encoding method of multiple-layered system]. The re-encoding method 6 indicates a re-encoding method based on [Equation 24] in which the structure of the parity check matrix of FIG. 18 satisfies Property 1-1 (or Property 1-2), Property 2, and Property 3. The above method is also applicable regardless of MIMO system or SCM system.

An example of implementation codes according to the above-described method is indicated below.

TABLE 4

Example of implementation codes else if (rDLY_CP_PHI_EN) begin
  if (rMUXED_ACC_RES_EN_DLY) begin
    o_EACH_PRTY_GEN  <=  #1  (rPRTY_GEN  ^ rMUXED_EDGE_DLY[EDGEIW-1]);
  end
end In the above table, "o_EACH_PRTY_GEN" refers to a re-encoded (or regenerated) parity whose degree is one, corresponding to E(1860) in FIG. 18. Various methods to re-encode the parity bits whose degrees are one may be present. The above method performs the re-encoding in such a manner as to remove the LDPC decoding results corresponding to the parity bits whose degrees are one, by operating XOR (A) with a value of "rPRTY_GEN" indicating the second part of the LDPC syndrome corresponding to the parity bits with degree-1, corresponding to the submatrix E(1860) in FIG. 18 after the LDPC decoding as in [Equation 24], and a hard decision value of "rMUXED_EDGE_DLY[EDGEIW-1]" of LDPC decoder output for the parity bits whose degrees are one. In other words, "rPRTY_GEN" includes XOR values of LDPC information bits (or code block) generated or determined through LDPC decoding, the parity bits whose degrees are two or higher, and the parity bits whose degrees are one. As the effect is cancelled by operation of XOR for "rMUXED_EDGE_DLY[EDGEIW-1]" of the LDPC decoded parity bits whose degrees are one, the re-encoded (or regenerated) parities whose degrees are one are as a result of determination by the LDPC decoded information bits and the parity bits whose degrees are two (For reference, "rDLY_CP_PHI_EN" and "rMUXED_EDGE_DLY[EDGEIW-1]" indicate control values to indicate regions where the above operation is effective).

Examples of certain embodiments according to the above-described process are provided below.

[Re-Encoding Method of SCM or LDM System]
1) A receiver receives superposition coded modulation (SCM) (or layered-division multiplexing (LDM)) signals generated from two or more layer signals.
2) The receiver decodes the LDM signals based on at least part of a parity check matrix, to determine or generate first LDPC information bits, first parity bits, and second parity bits corresponding to a first layer signal.
3) The receiver determines an LDPC syndrome corresponding to the decoded first LDPC information bits, first parity bits, and second parity bits.
4) The receiver determines (or generates) modified second parity bits based on the decoded second parity bits and the determined LDPC syndrome.

5) The receiver determines a second layer signal by removing signals corresponding to the decoded first LDPC information bits and first parity bits, and the modified second parity bits from the LDM signals.

6) The receiver decodes the second layer signal to determine second LDPC information bits corresponding to the second layer signal.

The second parity bits may correspond to columns with degree one in the parity check matrix.

Another example of a re-encoding method and apparatus in a SCM system according to certain embodiments is described below.

[Re-Encoding Method of Multiple Layered System]

1) First, a receiver receives superposition coded modulation (SCM) signals or layered-division multiplexing (LDM) signals generated from two or more layers. (The method can be applied to a receiver which is capable of receiving and processing MIMO signal for a MIMO system associated with two or more layers.)

2) A first LDPC decoder is configured to decode the LDM signals so as to determine or generate at least first LDPC information bits (or code block) and the first parity bits corresponding to a first layer signal in the SCM signals (or LDM signals) based on at least part of the parity check matrix.

3) An encoder (or a processor) encodes the first LDPC information bits and the first parity bits so as to generate the second parity bits based on the parity check matrix, or the encoder encodes the first LDPC information bits so as to generate the first parity bits or the second parity bits based on the parity check matrix. In the latter case, the first parity generated through the encoding may be different from the first parity bits decoded in the above 2) process.

4-1) in case that the transmitter punctures information bits of a specific length (e.g., multiples of a block length Z such as 2*Z) and transmits the remaining information bits, at least one processor may determine a part of the first LDPC information bits, excluding the punctured information bits corresponding to the specific length, from the decoded first LDPC information bits. In addition, where a part of the parity bits is punctured through the rate matching, an operation to determine a part of the parity bits, excluding the punctured parity bits, may be included. Further, in case that a part of the first LDPC information bits or a part of the parity is repeated through the rate matching, an operation to additionally determine the part of the first LDPC information bits or the part of the parity may be included (Such an operation may be referred to as de-matching, for the sake of convenience).

4-2) Where interleaving is applied in the transmitter, an operation to interleave the whole or at least a part of the codeword including the first LDPC information bits (or a part thereof), the first parity bits (or a part thereof), or the second parity bits (or a part thereof) in the same manner as the transmitter may be included. The codeword may include the repeated LDPC information bits or a part of the parity bits according to the rate matching. It should be noted that where decoding of the received signals is performed, deinterleaving corresponding to the interleaving performed in the transmitter is performed, and the same interleaving as in the transmitter is performed so as to perform interference cancellation.

4-3) According to some embodiments, in order to determine or generate an appropriately modulated symbol or signal, an operation to map the interleaved first LDPC information bits (or a part thereof), the first parity bits (or a part thereof), or the second parity bits (or a part thereof) into appropriate constellation points may be included (It should be noted that where decoding of the received signals is performed, the receiver performs constellation point mapping corresponding to the constellation point mapping performed in the transmitter, and the same constellation point mapping as in the transmitter is performed so as to perform the interference cancellation).

For rate de-matching or determining (or generating) modulation symbols or signs in the above 4-1) to 4-3), an operation to determine target code rate and modulation order, etc. based on MCS information or MCS index information transmitted from the transmitter may be additionally executed.

5) In order to determine or generate second LDPC information bits corresponding to a second layer signal determined or generated by subtracting, removing or excluding, or canceling a first layer signal corresponding to the first LDPC information bit (or at least part of the first LDPC information bits), the first parity bit (or at least part of the first parity bits), or the second parity bits (or at least part of the second parity bits) from the LDM signals, a second LDPC decoder is configured to decode the determined or generated second layer signal.

6) The parity check matrix may be configured as described below:

A first part of the parity check matrix includes a first submatrix A(1810) corresponding to the first LDPC information bits and a second submatrix B(1820) corresponding to the first parity bits and including degree-2 columns and one degree-1 column.

According to some embodiments, a second part of the parity check matrix includes a third submatrix C(1840) corresponding to the first LDPC information bits, a fourth submatrix D(1850) corresponding to the first parity bits, and a fifth submatrix E(1860) corresponding at least in part to the second parity bits, which is an identity matrix. For the sake of convenience, the parity check matrices to satisfy at least one of Property 1-2, Property 2, and Property 3 have only been described. However, it should be understood that the same application is also available to the parity check matrices to satisfy at least one of Property 1-1, Property 2, and Property 3.

Features of the decoding apparatus or the receiving apparatus according to the above-described method may be described below.

A receiver for receiving and processing layered division multiplexing (LDM) signals generated from a first layer signal and a second layer signal includes a first low-density parity-check (LDPC) decoder configured to decode the LDM signals so as to determine (or generate) first LDPC information bits and first parity bits corresponding to the first layer signal in the LDM signals based on a parity check matrix, a processor configured to encode the first LDPC information bits and the first parity bits so as to generate second parity bits based on the parity check matrix, or the first LDPC information bits so as to generate the first parity bits and the second parity bits based on the parity check matrix, a processor configured to determine a part of the first LDPC information bits in case where the information bits of a specific length (e.g., multiples of a block length Z such as 2*Z) are punctured and remaining information bits are transmitted by a transmitter in a system, excluding the punctured information bits corresponding to the specific length from the decoded first LDPC information bits, a processor configured to interleave the first LDPC information bits (or at least part of the first LDPC information bits), the first parity bits (or at least part of the first parity bits), and the second parity bits (or at least part of the second parity bits) in case where interleaving is required, and a processor to map the interleaved first LDPC information bits (or at least part of the first LDPC information bits), first parity bits (or at least part of the first parity bits), and second parity bits (or at least part of the second parity bits) into appropriate constellation points, so as to determine or generate appropriate modulation symbols or signals based on the first LDPC information bits (or at least part of the first LDPC information bits), the first parity bits (or at least part of the first parity bits), and the second parity bits (or at least part of the second parity bits).

The receiver may further include a second LDPC decoder, the second LDPC decoder being configured to decode the generated second layer signal so as to determine (or generate) second LDPC information bits corresponding to the generated second layer signal, by removing the first signal layer corresponding to the (interleaved) first LDPC information bits (or at least part of the first LDPC information bits), first parity bits (or at least part of the first parity bits), and second parity bits (or at least part the second parity bits, wherein the parity check matrix includes: a first part including a first submatrix corresponding to the first LDPC information bits and a second submatrix corresponding to the first parity bits and including degree-2 columns and one degree-1 column; and a second part including a third submatrix corresponding to the first LDPC information bits, a fourth submatrix corresponding to the first parity bits, and a fifth submatrix corresponding at least in part to the second parity bits, which is an identity matrix.

In the above-described specific embodiments, only the parity check matrices satisfying at least one of Property 1-2, Property 2, and Property 3 have been described for the sake of convenience. The same application is available to parity check matrices generally satisfying at least one of Property 1-1, Property 2, and Property 3 or parity check matrices having the same structure as in FIGS. 18, 19A and 19B. In addition, in the above embodiments, each operation and the processors may all included in the receiver, or only a part thereof may be included in the receiver. In addition, each operation may be implemented through a plurality of processors, or an integrated processor.

A case where the receiving apparatus described in connection with the embodiment for [the re-encoding method and apparatus] is applied to LDM or MIMO systems will be rearranged as described below.

A receiver for receiving and processing a layered division multiplexing (LDM) signal with at least two layers includes a first decoder configured to decode first low-density parity-check (LDPC) information bits and first parity bits corresponding to a first layer signal from the LDM signal based on at least part of a parity check matrix, a processor configured to encode the first LDPC information bits and the first parity bits to generate second parity bits, and a second decoder configured to decode second LDPC information bits corresponding to a second layer signal which is determined (or obtained or generated) by removing the first layer signal, corresponding to the first LDPC information bits, the first parity bits, and the second parity bits, from the LDM signal, wherein the parity check-matrix includes a first part of the parity check matrix including a first submatrix A(1810) corresponding to the LDPC first information bits and a second submatrix B(1820) which consists of degree-2 columns and only one degree-1 column and is a lower triangular matrix, corresponding to the first parity bits, and a second part of the parity check matrix including a third submatrix C(1840) corresponding to the first LDPC information bits and a fourth submatrix D(1850) corresponding to the first parity bits and a fifth submatrix E(1860) which is an identity matrix, corresponding to the second parity bits.

The case may be alternatively arranged as described below.

A receiver for receiving and processing a MIMO signal with at least two layers includes a first decoder configured to decode the MIMO signal to determine (or generate) first low-density parity-check (LDPC) information bits corresponding to a first layer signal of the MIMO signal based on at least part of a parity check matrix, a processor configured to encode the first LDPC information bits and first parity bits to determine (or generate) second parity bits, and a processor configured to determine (or identify) a part of the LDPC information bits, and a second decoder configured to decode a second layer signal of the MIMO signal to determine (or generate) second LDPC information bits corresponding to the second layer signal which is determined (or obtained or generated) by removing a signal corresponding to the part of the first LDPC information bits, the first parity bits, and the second parity bits, from the MIMO signal, wherein the parity check-matrix includes, a first part of the parity check matrix including a first submatrix A(1810) corresponding to the LDPC first information bits and a second submatrix B(1820) which consists of degree-2 columns and at least 7 degree-3 columns corresponding to the first parity bits, and a second part of the parity check matrix including a third submatrix C(1840) corresponding to the first LDPC information bits and a fourth submatrix D(1850) corresponding to the first parity bits and a fifth submatrix E(1860) which is an identity matrix, corresponding to the second parity bits.

A receiving method described in connection with the embodiment for [Re-encoding method of SCM or LDM system] or [Re-encoding method of multiple layered system] will be rearranged as described below.

A method for receiving and processing a layered division multiplexing (LDM) signal with at least two layers at receiver, includes decoding the LDM signal to determine (or generate) first low-density parity-check (LDPC) information bits and first parity bits corresponding to a first layer signal of the LDM signal based on at least part of a parity check matrix, encoding the first LDPC information bits and the first parity bits to determine (or generate) second parity bits, and decoding a second layer signal of the LDM signal to determine (or generate) second LDPC information bits corresponding to the second layer signal which is determined (or obtained or generated) by removing a signal corresponding to the first LDPC information bits, the first parity bits, and the second parity bits, from the LDM signal, wherein the parity check-matrix includes a first part of the parity check matrix including a first submatrix A(1810) corresponding to the LDPC first information bits and a second submatrix B(1820) which consists of degree-2 columns and only one degree-1 column and is a lower triangular matrix, corresponding to the first parity bits, and a second part of the parity check matrix including a third submatrix C(1840) corresponding to the first LDPC information bits and a fourth submatrix D(1850) corresponding to the first parity bits and a fifth submatrix E(1860) which is an identity matrix, corresponding to the second parity bits.

The method may be alternatively described below.

A method for receiving and processing a MIMO signal with at least two layers at the receiver includes decoding the MIMO signal to determine (or generate) first low-density parity-check (LDPC) information bits corresponding to a first layer signal of the MIMO signal based on at least part of a parity check matrix, encoding the first LDPC information bits and first parity bits to determine (or generate) second parity bits, and determining (or identifying) a part of the LDPC information bits, and decoding a second layer signal of the MIMO signal to determine (or generate) second LDPC information bits corresponding to the second layer signal which is determined (or obtained or generated) by removing a signal corresponding to the part of the first LDPC information bits, the first parity bits, and the second parity bits, from the MIMO signal wherein the parity check-matrix includes a first part of the parity check matrix including a first submatrix A(1810) corresponding to the LDPC first information bits and a second submatrix B(1820) which consists of degree-2 columns and at least 7 degree-3 columns corresponding to the first parity bits, and a second part of the parity check matrix including a third submatrix C(1840) corresponding to the first LDPC information bits and a fourth submatrix D(1850) corresponding to the first parity bits and a fifth submatrix E(1860) which is an identity matrix, corresponding to the second parity bits.

In certain embodiments, such as described above, a process to regenerate parity bits based on error detection based on an outer codes such as BCH or CRC codes was omitted, for the sake of convenience. However, a process to regenerate parities based on the error detection result of an outer codes as explained in [Re-encoding method 1] to [Re-encoding method 5] may be determined. Where CRC codes are used as an outer codes, only error detection can be executed. However, where BCH codes are used, error correction in addition to error detection may also be executed. For example, where it is determined that no error occurs, by performing BCH decoding and error detection for the information bits after LDPC decoding, the parities may entirely or partially be re-encoded or regenerated. However, where it is determined that any error occurs, an operation to regenerate the parities may not be performed. Regardless of error detection, the process for regeneration of the parities may be performed. In particular, after BCH decoding is performed, parity generation in lieu of omitting error detection may be executed.

In the [Re-encoding method of SCM or LDM system] or [Re-encoding method of multiple-layered system], the first parity to which encoding is applied so as to determine or generate the second parity may be the parity determined or generated by the first decoder or in the first decoding process, or may be the parity determined or generated by encoding based on the first LDPC information bits determined or generated by the first decoder or in the first decoding process. The first LDPC decoder and the second LDPC decoder may be implemented based on a single LDPC decoder (i.e., the first and second LDPC decoders are substantially same) or separate two decoders. When the parity check matrix of the LDPC codes used in the first LDPC decoder is given as a first parity check matrix, and the parity check matrix of the LDPC codes used in the second decoder is given as a second parity check matrix, the first parity check matrix and the second check matrix may generally use different parity check matrices. However, as the case may be, they may use the same parity check matrix. In addition, the encoder of item 3) in [Re-encoding method of SCM or LDM system] and [Re-encoding method of multiple-layered system] may be implemented as a separate encoder. However, the encoder may be implemented based on a processor to process the syndrome as described above. The re-encoding process of [Re-encoding method of SCM or LDM system] and [Re-encoding method of multiple-layered system] may be performed based on the implementation codes as described above. In addition, where in the two-layered LDM or SCM system, a layer to first perform decoding is given as a first layer and a layer to later perform the decoding after performing an operation for interference cancellation is given a second layer, the first layer may use a modulation and coding combination equal to or more robust in performance than the second layer. More robust in performance may mean that in the same SNR conditions, spectral efficiency or product of modulation order and code rate is larger can be supported, or lower BLER can be supported.

In addition, embodiments such as described above may be applicable to all the systems in which signals can be divided into two or higher layers, including SCM systems, LDM systems, MIMO systems, or NOMA systems. That is, after receiving modulation signals generated from two or higher layers (e.g.: SCM signal, LDM signal, MIMO signal, NOMA signal, etc.), the receiver may perform data decoding for the second layer by performing data decoding for the first layer from the received signals and then performing interference cancellation from the received signal as appropriate based on the decoded data, as in the above embodiments. This operation may be performed in a manner of successively removing interference. Or having decoded a first layer and a second layer respectively for the received signals, a process to determine a second layer signal by generating modulation signals for the first layer based on data of the decoded first layer and removing them from the received signals, and a process to determine a first layer signal by generating modulation signals for the second layer based on data of the decoded second layer and removing them from the received signals may be executed independently (or simultaneously or in parallel) (Here, the data may indicate LDPC information bits and/or parity bits, etc.) Each layer may be decoded again, based on the signals from which interference is removed independently (or simultaneously or in parallel).

In the drawings in which methods of the disclosure are described, the order of the description does not always correspond to the order in which steps of each method are performed, and the order relationship between the steps may be changed or the steps may be performed in parallel.

Alternatively, in the drawings in which methods of the disclosure are described, some elements may be omitted and only some elements may be included therein without departing from the essential spirit and scope of the disclosure.

Further, in methods according to this disclosure, some or all of the contents of each embodiment may be combined without departing from the essential spirit and scope of the disclosure.

Although the disclosure has been described above by way of exemplary embodiments, various modifications and changes may be presented to those skilled in the art. These modifications and changes are intended to fall within the appended claims. Further, in the operation flow diagrams of the disclosure, operations represented by different blocks have been described as being implemented by multiple processors for the sake of convenience, but it will be apparent that they may be integrally implemented by a single processor in the actual system.

Although the present disclosure has been described with various embodiments, various changes and modifications may be suggested to one skilled in the art. It is intended that the present disclosure encompass such changes and modifications as fall within the scope of the appended claims.

What is claimed is:

1. A method performed by a receiver for processing a multiple-in multiple-out (MIMO) signal associated with at least two layers in a communication system, the method comprising:
    decoding the MIMO signal, based on at least part of a parity check matrix to determine first low density parity check (LDPC) information bits corresponding to a first layer signal of the MIMO signal;
    determining second parity bits based on the first LDPC information bits and first parity bits;
    determining a part of the first LDPC information bits; and
    determining a second layer signal of the MIMO signal to determine second LDPC information bits corresponding to the second layer signal,
    wherein the second layer signal is determined by removing a signal corresponding to the part of the first LDPC information bits, the first parity bits, and the second parity bits from the MIMO signal, and
    wherein column weights of at least part of a submatrix corresponding to the first parity bits of the parity check matrix are equal to or larger than 2.

2. The method of claim 1, wherein the decoding of the MIMO signal comprises:
    identifying a number of input bits based on the MIMO signal;
    identifying a block size based on the number of input bits; and
    identifying the parity check matrix corresponding to the block size.

3. The method of claim 1, wherein the part of the first LDPC information bits is determined by puncturing of at least one of the first LDPC information bits.

4. The method of claim 1, wherein the determining of the second layer signal comprises interleaving at least part of the first LDPC information bits, the first parity bits, and the second parity bits.

5. The method of claim 4, wherein the determining of the second layer signal comprises performing modulation, based on the interleaved part of the first LDPC information bits, the interleaved first parity bits, and the interleaved second parity bits.

6. The method of claim 1, wherein at least one of the column weights is larger than or equal to 3.

7. The method of claim 1, wherein the decoding of the MIMO signal comprises:
    identifying a first LDPC syndrome value, based on at least part of the first LDPC information bits and the first parity bits; and
    in case that the first LDPC syndrome value is 0 and CRC detection for the first layer signal is successful, encoding the first LDPC information bits and the first parity bits.

8. A receiver for processing a multiple-in multiple-out (MIMO) signal associated with at least two layers in a communication system, the receiver comprising:
    a transceiver; and
    a controller coupled with the transceiver and configured to:
    decode the MIMO signal, based on at least part of a parity check matrix to determine first low density parity check (LDPC) information bits corresponding to a first layer signal of the MIMO signal,
    determine second parity bits based on the first LDPC information bits and first parity bits,
    determine a part of the first LDPC information bits, and
    determine a second layer signal of the MIMO signal to determine second LDPC information bits corresponding to the second layer signal,
    wherein the second layer signal is determined by removing a signal corresponding to the part of the first LDPC information bits, the first parity bits, and the second parity bits from the MIMO signal, and
    wherein column weights of at least part of a submatrix corresponding to the first parity bits of the parity check matrix are equal to or larger than 2.

9. The receiver of claim 8, wherein the controller is configured to:
    identify a number of input bits based on the MIMO signal,
    identify a block size based on the number of input bits, and
    identify the parity check matrix corresponding to the block size.

10. The receiver of claim 8, wherein the controller is configured to puncture at least one of the first LDPC information bits.

11. The receiver of claim 8, wherein the controller is configured to interleave at least part of the first LDPC information bits, the first parity bits, and the second parity bits.

12. The receiver of claim 11, wherein the controller is configured to perform modulation, based on the interleaved part of the first LDPC information bits, the interleaved first parity bits, and the interleaved second parity bits.

13. The receiver of claim 8, wherein at least one of the column weights is larger than or equal to 3.

14. The receiver of claim 8, wherein the controller is configured to:
    identify a first LDPC syndrome value, based on at least part of the first LDPC information bits and the first parity bits, and
    in case that the first LDPC syndrome value is 0 and CRC detection for the first layer signal is successful, encode the first LDPC information bits and the first parity bits.

15. A method of receiving and processing a layered-division multiplexing (LDM) signal generated from two or more layer signals, the method comprising:
    decoding the LDM signal, based on at least part of a parity check matrix to determine first low density parity check (LDPC) information bits, first parity bits, and second parity bits corresponding to a first layer signal;
    determining an LDPC syndrome corresponding to the determined first LDPC information bits, first parity bits, and second parity bits;
    determining modified second parity bits, based on the determined second parity bits and the determined LDPC syndrome;
    determining a second layer signal by removing a signal corresponding to the determined first LDPC information bits, the first parity bits, and the modified second parity bits from the LDM signal; and
    decoding the second layer signal to determine second LDPC information bits corresponding to the second layer signal,
    wherein the second parity bits correspond to at least part of degree-1 columns in the parity check matrix.

* * * * *